(12) United States Patent
Ogawa et al.

(10) Patent No.: US 12,503,643 B2
(45) Date of Patent: Dec. 23, 2025

(54) MATERIAL FOR ORGANIC ELECTROLUMINESCENCE ELEMENT, AND ORGANIC ELECTROLUMINESCENCE ELEMENT

(71) Applicant: NIPPON STEEL Chemical & Material Co., Ltd., Tokyo (JP)

(72) Inventors: Junya Ogawa, Tokyo (JP); Ayaka Terada, Tokyo (JP); Ikumi Kitahara, Tokyo (JP); Haruka Izumi, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 877 days.

(21) Appl. No.: 17/781,073

(22) PCT Filed: Dec. 11, 2020

(86) PCT No.: PCT/JP2020/046180
§ 371 (c)(1),
(2) Date: May 31, 2022

(87) PCT Pub. No.: WO2021/131769
PCT Pub. Date: Jul. 1, 2021

(65) Prior Publication Data
US 2023/0039495 A1    Feb. 9, 2023

(30) Foreign Application Priority Data
Dec. 27, 2019    (JP) .................................. 2019-238039

(51) Int. Cl.
*H01L 51/50*    (2006.01)
*C09K 11/06*    (2006.01)
(Continued)

(52) U.S. Cl.
CPC .............. *C09K 11/06* (2013.01); *H10K 50/12* (2023.02); *H10K 85/341* (2023.02);
(Continued)

(58) Field of Classification Search
None
See application file for complete search history.

(56) References Cited

U.S. PATENT DOCUMENTS

2012/0104941 A1    5/2012    Jung et al.
2015/0166886 A1    6/2015    Endo et al.
(Continued)

FOREIGN PATENT DOCUMENTS

| CN | 103193717 A | 7/2013 |
| CN | 108695440 A | 10/2018 |

(Continued)

*Primary Examiner* — Gregory D Clark
(74) *Attorney, Agent, or Firm* — Birch, Stewart, Kolasch & Birch, LLP

(57) ABSTRACT

An organic electroluminescent device having high efficiency and high driving stability, and a material suitable for the organic electroluminescent device are provided. The material for organic electroluminescent devices comprises an indolocarbazole compound represented by a general formula (1). In the formula, the ring a is represented by a formula (1a), X is NR, S, O or $CR_2$, and $Ar^1$ and $Ar^2$ are an aromatic heterocyclic group represented by a formula (1b). Y is N or CR, and at least one is N. $L^1$ is an aromatic hydrocarbon group. The material for the organic electroluminescent devices is suitable as material for the host of the light emitting layer or the hole blocking layer of organic EL devices.

(Continued)

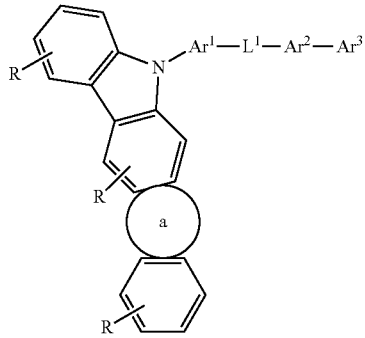

(1)

(1a)

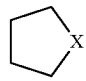

(1b)

15 Claims, 1 Drawing Sheet

(51) Int. Cl.
    *H10K 50/12*     (2023.01)
    *H10K 85/30*     (2023.01)
    *H10K 85/60*     (2023.01)
    *H10K 50/18*     (2023.01)
    *H10K 101/20*     (2023.01)

(52) U.S. Cl.
    CPC ......... *H10K 85/342* (2023.02); *H10K 85/344* (2023.02); *H10K 85/346* (2023.02); *H10K 85/348* (2023.02); *H10K 85/371* (2023.02); *H10K 85/654* (2023.02); *H10K 85/6572* (2023.02); *H10K 50/18* (2023.02); *H10K 2101/20* (2023.02)

(56) References Cited

U.S. PATENT DOCUMENTS

| | | |
|---|---|---|
| 2019/0259959 A1 | 8/2019 | Duan et al. |
| 2020/0083460 A1 | 3/2020 | Duan et al. |
| 2021/0355128 A1 | 11/2021 | Jung et al. |
| 2021/0363132 A1* | 11/2021 | Jung ............... H10K 85/622 |

FOREIGN PATENT DOCUMENTS

| | | | | |
|---|---|---|---|---|
| CN | 109994628 A | | 7/2019 | |
| KR | 10-2014-0094408 A | | 7/2014 | |
| KR | 10-2017-0060836 A | | 6/2017 | |
| KR | 10-2019-0089763 A | | 7/2019 | |
| KR | 2019089763 A | * | 7/2019 | ............ H01L 51/50 |
| KR | 10-2020-0063053 A | | 6/2020 | |
| WO | WO 2011/005060 A2 | | 1/2011 | |
| WO | WO 2011/070963 A1 | | 6/2011 | |

* cited by examiner

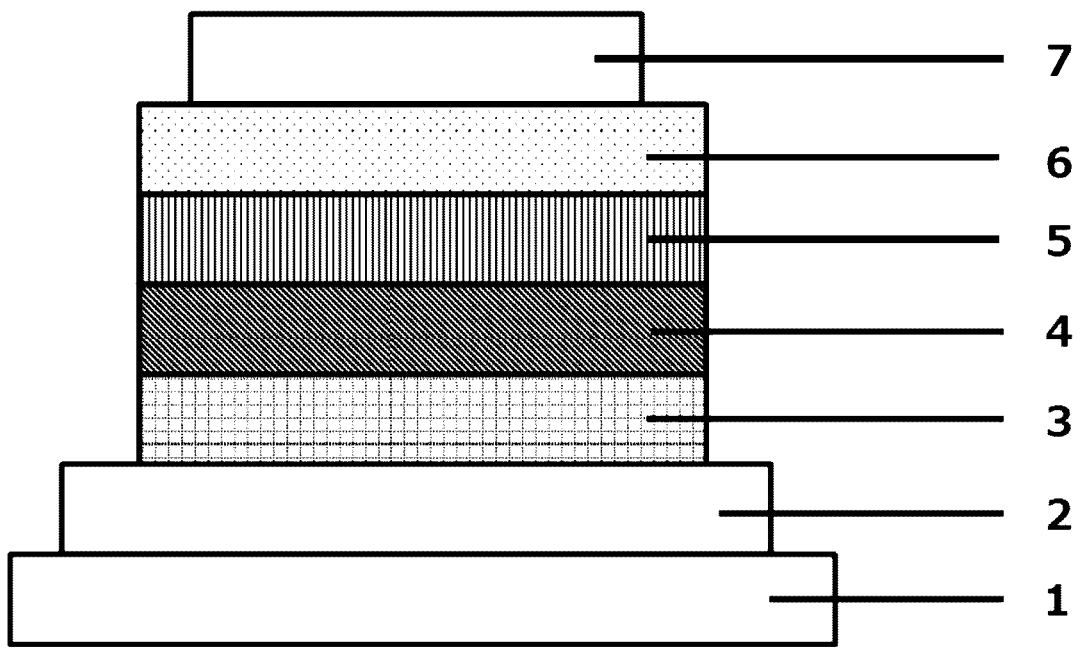

MATERIAL FOR ORGANIC ELECTROLUMINESCENCE ELEMENT, AND ORGANIC ELECTROLUMINESCENCE ELEMENT

TECHNICAL FIELD

The present invention relates to a material for organic electroluminescent devices, and an organic electroluminescent device made therefrom.

BACKGROUND ART

By applying a voltage to an organic electroluminescent device (referred to as an organic EL device), holes are injected from an anode and electrons are injected from a cathode into a light emitting layer, respectively. Then, in the light emitting layer, the injected holes and electrons are recombined to generate excitons. On this occasion, singlet excitons and triplet excitons are generated at a ratio of 1:3 according to the statistical law of electron spin. It is said that the internal quantum efficiency of a fluorescence emission type organic electroluminescent device that uses light emission by singlet excitons is limited to 25%. On the other hand, it is known that the phosphorescence emission type organic electroluminescent device that uses light emission by triplet excitons can increase the internal quantum efficiency to 100% when intersystem crossing is efficiently performed from the singlet excitons.

However, further efficiency improvement and low voltage characteristics of a phosphorescence emission type organic EL device have been a technical challenge.

Recently, high-efficiency organic electroluminescent devices using delayed fluorescence have been developed. For example, an organic electroluminescent device using a TTF (Triplet-Triplet Fusion) mechanism, which is one of the delayed fluorescence mechanisms, is known. The TTF mechanism utilizes a phenomenon that singlet excitons are generated by the collision of two triplet excitons, and it is theoretically conceivable that the internal quantum efficiency can be increased to 40%. However, since the efficiency is lower than that of a phosphorescence emission type organic electroluminescent device, further improvement in efficiency is required.

Patent Literature 1 discloses an organic electroluminescent device using a TADF (Thermally Activated Delayed Fluorescence) mechanism. The TADF mechanism utilizes a phenomenon of inverse intersystem crossing from triplet excitons to singlet excitons that occurs in materials with a small energy difference between singlet and triplet levels, and it is theoretically conceivable that the internal quantum efficiency can be increased to 100%. However, further efficiency improvement and low voltage characteristics are required as in the case of a phosphorescence emission type device.

CITATION LIST

Patent Literature

Patent Literature 1: WO2011/070963A
Patent Literature 2: KR2014094408A
Patent Literature 3: KR2017060836A
Patent Literature 4: CN103193717A
Patent Literature 5: WO2011/005060A Patent Literature 2 and 3 disclose a compound having two triazine rings.

Patent Literature 4 and 5 disclose a compound having two pyridine rings, which are linked with a phenylene group.

However, none of these imply the compound of the present invention and exhibit usability of an organic EL device made from the compound.

SUMMARY OF INVENTION

In order to apply an organic electroluminescent device to a display device such as a flat panel display, it is necessary to improve the luminous efficiency of the device and at the same time to sufficiently ensure the stability during driving. In view of the above situation, it is an object of the present invention to provide a practically useful organic EL device having high efficiency and low voltage characteristics and a compound suitable for the organic EL device.

As a result of diligent studies, the present inventors have found that a condensed aromatic heterocyclic compound represented by the following general formula (1) can be used for an organic EL device to exhibit excellent properties, and have completed the present invention.

The present invention is a material for organic electroluminescent devices, comprising a compound represented by the general formula (1).

[C1]

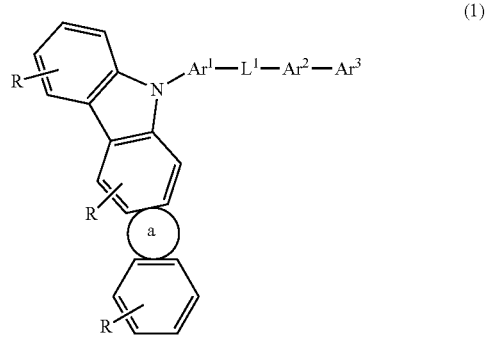

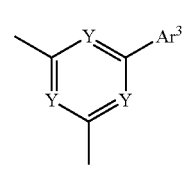

In the formula, the ring a represented by a formula (1a) is condensed with a neighboring ring at an optional position, X is $NR^{11}$, S, O or $CR^{12}R^{13}$, and $R^{11}$, $R^{12}$, and $R^{13}$ each independently represent an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group having 2 to 5 of these aromatic rings that are linked.

R independently represents hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms.

Ar$^1$ and Ar$^2$ are each independently an aromatic heterocyclic group represented by a formula (1b), and Ar$^3$ is independently a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group having 2 to 5 of these aromatic rings that are linked.

R$^{14}$ is independently hydrogen, deuterium, an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group having 2 to 5 of these aromatic rings that are linked.

Y independently represent N or CR$^{14}$, and at least one is N.

L$^1$ represents a substituted or unsubstituted aromatic hydrocarbon group having 6 to 30 carbon atoms.

Examples of L$^1$ include a phenylene group represented by the following formula (1c) or formula (1d):

[C2]

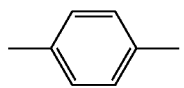

(1c)

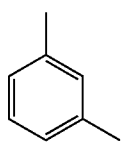

(1d)

wherein X may be NR$^{11}$. The R$^{11}$ is the same as R$^{11}$ in the general formula (1).

Examples of the compound represented by the general formula (1) include a compound represented by a general formula (2).

[C3]

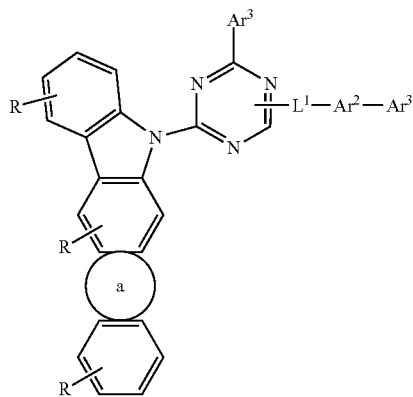

(2)

wherein the ring a, R, R$^{14}$, L$^1$, Ar$^2$ and Ar$^3$ are the same as those in the general formula (1).

More specific examples thereof include a compound represented by any one of general formulas (3) to (8):

[C4]

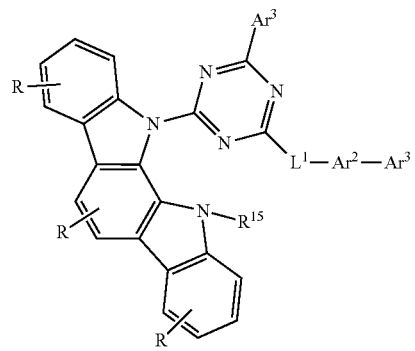

(3)

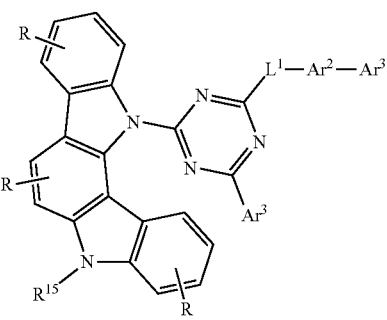

(4)

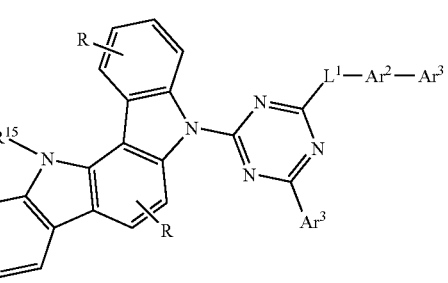

(5)

[C5]

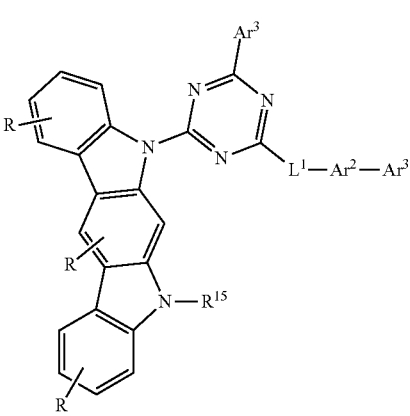

(6)

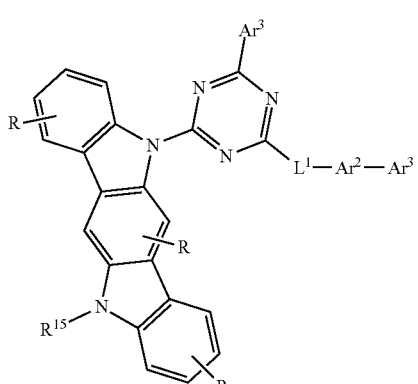

(7)

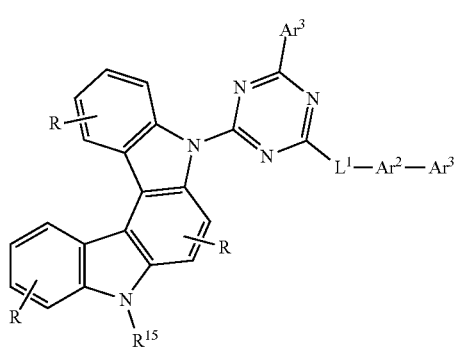

(8)

wherein R, $L^1$, $Ar^2$ and $Ar^3$ are the same as those in the general formula (1), and $R^{15}$ is the same as $R^{11}$ in the general formula (1).

Among these, preferred examples include a compound represented by any one of the general formulas (3) to (5).

It is desirable that the compound represented by the general formula (1) has an absolute value of electron affinity (EA) of more than 2.6 eV and an absolute value of ionization potential (IP) of less than 6.1 eV.

The present invention relates to an organic electroluminescent device comprising an anode, organic layers and a cathode laminated on a substrate, wherein at least one layer of this organic layers is an organic layer containing the material for organic electroluminescent devices.

The organic layer containing the material for organic electroluminescent devices may be at least one layer selected from the group consisting of a light emitting layer, an electron transporting layer, and a hole blocking layer.

The light emitting layer may contain a host and a light-emitting dopant material, and the light-emitting dopant material may be an organic metal complex containing at least one metal selected from the group consisting of ruthenium, rhodium, palladium, silver, rhenium, osmium, iridium, platinum and gold. Preferably, the light emitting layer contains a material for organic electroluminescent devices as host.

The light-emitting dopant material may be a thermally activated delayed fluorescence emitting dopant material.

Further, a hole blocking layer may be provided adjacent to the light emitting layer, and the hole blocking layer may contain the material for organic electroluminescent devices.

The material for organic EL devices of the present invention has a structure represented by the general formula (1). A compound having such a structural characteristics has a lowest unoccupied molecular orbital (LUMO) that affects electron injection and transportation, distributed around the nitrogen-containing 6-membered ring. The compound of the present invention has two or more nitrogen-containing 6-membered ring, so that the electron injection and transportation of the device can be controlled at a high level. For example, the electron injection and transportation can be enhanced through expansion of the LUMO orbital by changing the number and linking mode of the linking group present between each of the nitrogen-containing 6-membered rings.

On the other hand, the highest occupied molecular orbital (HOMO) that affects the hole injection and transportation is distributed on the condensed aromatic heteroring represented by indolocarbazole. The spread of the HOMO orbital in the distribution of the HOMO orbital can be controlled by changing the form of condensed ring, type and introduction site of a substituent, so that the hole injection and transportation of the material can be controlled at a high level.

Having such characteristics, the material of the present invention is a material having both charges (electron/hole) injection and transport characteristics suitable for structuring a device. By using the material for organic EL devices, reduction in the drive voltage and high luminous efficiency of the device can be achieved.

Further, the material for organic EL devices of the present invention exhibits good amorphous characteristics and high thermal stability, while being extremely stable in an excited state. Accordingly, an organic EL device made therefrom has a long drive life, with long-term durability for practical use.

BRIEF DESCRIPTION OF DRAWING

FIG. 1 is a cross-sectional structure view of an organic EL device.

DESCRIPTION OF EMBODIMENT

The material for organic electroluminescent devices of the present invention is represented by the general formula (1).

In the general formula (1), the ring a is a ring represented by a formula (1a), which is condensed with a neighboring ring at an optional position.

$Ar^1$ and $Ar^2$ are each independently an aromatic heterocyclic group represented by a formula (1b). In the formula, Y each independently represent N or $CR^{14}$, and at least one is N. Preferably at least two of Y in the formula (1b) are N, and more preferably all of Y are N.

$R^{14}$ independently represents hydrogen, deuterium, an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group having 2 to 5 of these aromatic rings that are linked. A substituted or unsubstituted aromatic hydrocarbon group having 6 to 30 carbon atoms, or a substituted or unsubstituted aromatic heterocyclic group having 3 to 16 carbon atoms is preferred. A substituted or unsubstituted aromatic hydrocarbon group having 6 to 10 carbon atoms is more preferred. A phenyl group is still more preferred.

In the present specification, the linked aromatic group refers to a group in which the aromatic rings of aromatic hydrocarbon groups or aromatic heterocyclic groups are linked through a single bond. The aromatic rings may be linked in a straight chain or a branched chain. The aromatic rings may be the same or different from each other.

$Ar^3$ is a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group having 2 to 5 of these aromatic rings that are linked. A substituted or unsubstituted aromatic hydrocarbon group having 6 to 10 carbon atoms, or a substituted or unsubstituted aromatic heterocyclic group having 3 to 12 carbon atoms is preferred. A substituted or unsubstituted aromatic hydrocarbon group having 6 to 10 carbon atoms is more preferred. It is preferable that the aromatic heterocyclic group contain N, O or S as exotic atom.

When $Ar^3$ is an unsubstituted aromatic hydrocarbon group or an unsubstituted aromatic heterocyclic group, specific examples thereof include a group formed from benzene, naphthalene, anthracene, fluoranthene, phenanthrene, triphenylene, pyridine, pyrimidine, triazine, thiophene, isothiazole, thiazole, pyridazine, pyrrole, pyrazole, imidazole, pyrazine, furan, isoxazole, oxazole, quinoline, isoquinoline, quinoxaline, quinazoline, benzotriazole, phthalazine, indole, benzofuran, benzothiophene, benzoxazole, benzothiazole, indazole, benzimidazole, benzoisothiazole, benzothiadiazole, dibenzofuran, dibenzothiophene, dibenzoselenophene, benzocarbazole, benzonaphthothiophene, benzonaphthofuran, phenanthroline or carbazole. Preferred examples include an aromatic group formed from benzene, naphthalene, pyridine, pyrimidine, triazine, thiophene, isothiazole, thiazole, pyridazine, pyrrole, pyrazole, imidazole, triazole, thiadiazole, pyrazine, furan, isoxazole, oxazole, quinoline, isoquinoline, quinoxaline, quinazoline, phthalazine, indole, benzofuran, benzothiophene, benzoxazole, benzothiazole, indazole, benzimidazole, benzoisothiazole, benzothiadiazole, dibenzofuran, dibenzothiophene, or carbazole. More preferred examples include a phenyl group which is an aromatic group formed from benzene.

$L^1$ is a substituted or unsubstituted aromatic hydrocarbon group having 6 to 30 carbon atoms, preferably a p-phenylene group or m-phenylene group, represented by the formula (1c) or formula (1d). Specific examples of the aromatic hydrocarbon group are the same as in the case where $Ar^3$ is an aromatic hydrocarbon group.

X is $NR^{11}$, S, O or $CR^{12}R^{13}$, and preferably $NR^{11}$.

$R^{11}$, $R^{12}$ and $R^{13}$ are each independently a substituted or unsubstituted aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16, or a linked aromatic group having 2 to 5 of these aromatic rings that are linked. A substituted or unsubstituted aromatic hydrocarbon group having 6 to 30 carbon atoms, or a substituted or unsubstituted aromatic heterocyclic group having 3 to 16 carbon atoms is preferred. A substituted or unsubstituted aromatic hydrocarbon group having 6 to 10 carbon atoms is more preferred. A linked aromatic group having 2 to 3 of the aromatic rings of the aromatic hydrocarbon group having 6 to 10 carbon atoms that are linked is also preferred.

R independently represents hydrogen, deuterium, an aliphatic hydrocarbon group having 1 to 10 carbon atoms, an aromatic hydrocarbon group having 6 to 30 carbon atoms, or an aromatic heterocyclic group having 3 to 16 carbon atoms. Hydrogen, deuterium, a phenyl group, or an aromatic heterocyclic group having 3 to 12 carbon atoms is preferred. Hydrogen, deuterium, a phenyl group, or a carbazolyl group is more preferred.

R, $R^{14}$ and $Ar^3$ are monovalent groups. When a plurality of these symbols are present in a formula, the symbols may refer to the same or different groups on each occasion.

When R, $R^{11}$, $R^{12}$, $R^{13}$ and $R^{14}$ are aliphatic hydrocarbon groups having 1 to 10 carbon atoms, the groups may be in a straight chain form, a branched chain form or a cyclic form. Specific examples thereof include methyl, ethyl, propyl, butyl, t-butyl, pentyl, hexyl, cyclohexyl, heptyl, octyl, nonyl and decyl. An alkyl group having 1 to 4 carbon atoms is preferred.

When R, $R^{11}$, $R^{12}$, $R^{13}$ and $R^{14}$ are aromatic hydrocarbon groups or aromatic heterocyclic groups, specific examples thereof include a group formed from benzene, naphthalene, anthracene, fluoranthene, phenanthrene, triphenylene, pyridine, pyrimidine, triazine, thiophene, isothiazole, thiazole, pyridazine, pyrrole, pyrazole, imidazole, pyrazine, furan, isoxazole, oxazole, quinoline, isoquinoline, quinoxaline, quinazoline, benzotriazole, phthalazine, indole, benzofuran, benzothiophene, benzoxazole, benzothiazole, indazole, benzimidazole, benzoisothiazole, benzothiadiazole, dibenzofuran, dibenzothiophene, dibenzoselenophene, benzocarbazole, benzonaphthothiophene, benzonaphthofuran, phenanthroline or carbazole. Preferred examples include an aromatic group formed from benzene, naphthalene, pyridine, pyrimidine, triazine, thiophene, isothiazole, thiazole, pyridazine, pyrrole, pyrazole, imidazole, triazole, thiadiazole, pyrazine, furan, isoxazole, oxazole, quinoline, isoquinoline, quinoxaline, quinazoline, phthalazine, indole, benzofuran, benzothiophene, benzoxazole, benzothiazole, indazole, benzimidazole, benzoisothiazole, benzothiadiazole, dibenzofuran, dibenzothiophene, or carbazole. More preferred examples include an aromatic group which is formed from benzene or carbazole.

In the present specification, the aromatic hydrocarbon group, the aromatic heterocyclic group and the group with linked aromatic rings may have a substituent. In the case of the aromatic hydrocarbon group, the aromatic heterocyclic group and the group with linked aromatic rings, preferred examples of the substituent include an alkyl group having 1 to 5 carbon atoms, an alkenyl group having 2 to 5 carbon atoms, an alkoxy group having 1 to 5 carbon atoms, deuterium, a halogen, an amino group and a cyano group.

Examples of the compound represented by the general formula (1) in a preferred aspect include a compound represented by the general formula (2) or any one of the general formulas (3) to (8), more preferably a compound represented by any one of the general formulas (3) to (5). In the general formulas (2) to (8), symbols in common with those in the general formula (1) refer to the same meaning.

It is also preferable that the compound represented by the general formula (1) have an absolute value of electron affinity (EA) of more than 2.6 eV and an absolute value of ionization potential (IP) of less than 6.1 eV. A thin film obtained by vapor deposition of material is subjected to measurement of the ionization potential (IP) value by photoelectron spectroscopy and measurement of absorption spectrum to obtain an energy gap value from the absorption edge, and the EA is calculated based on the energy gap value and the IP value.

Specific examples of the compound represented by the general formula (1) are shown as follows, though not limited thereto.

[C6]
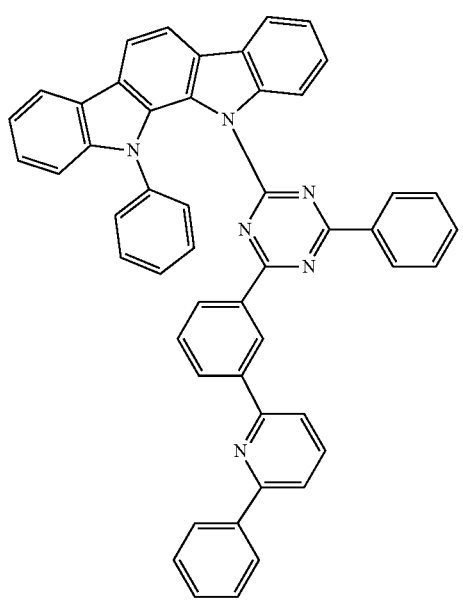
1-1
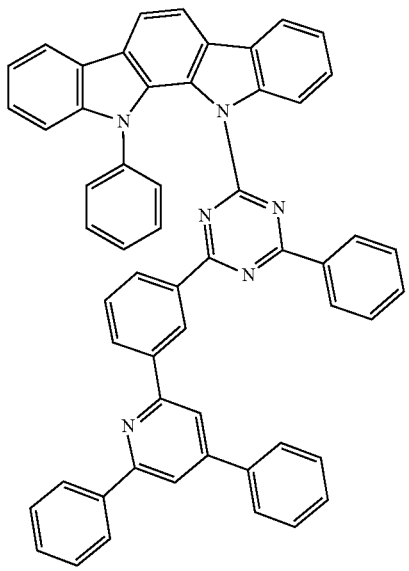
1-2
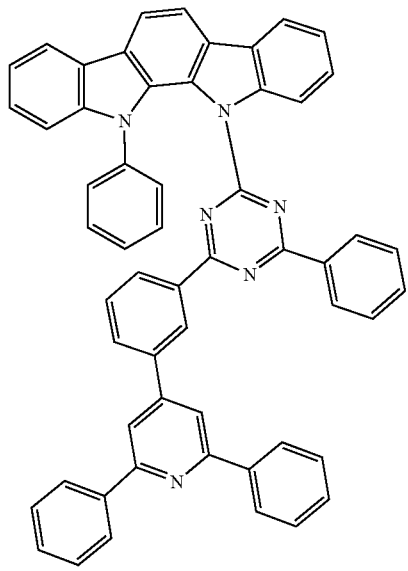
1-3
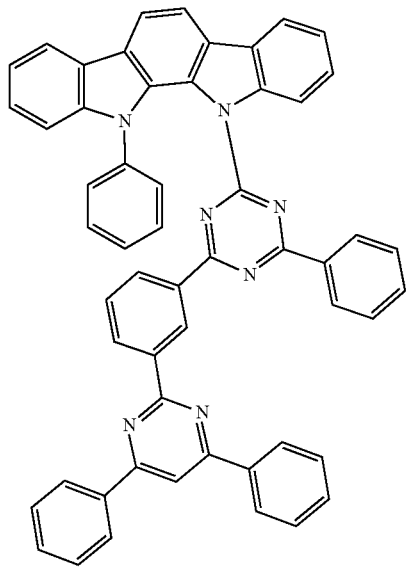
1-4

1-5
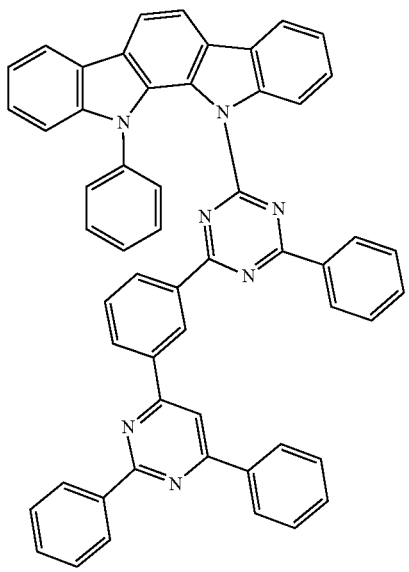
1-7
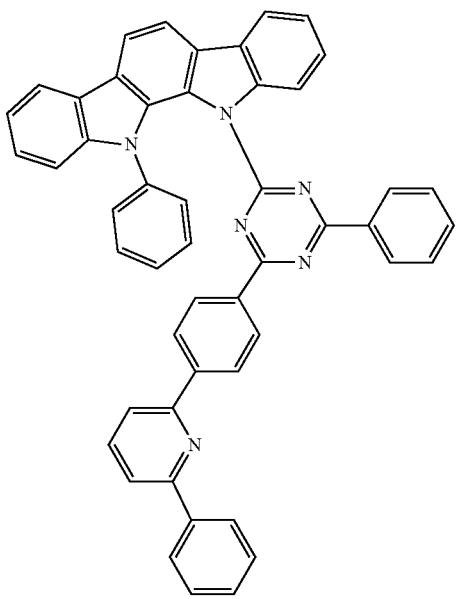
1-6
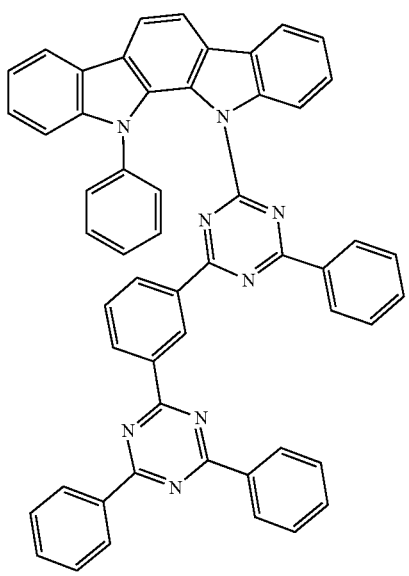
1-8
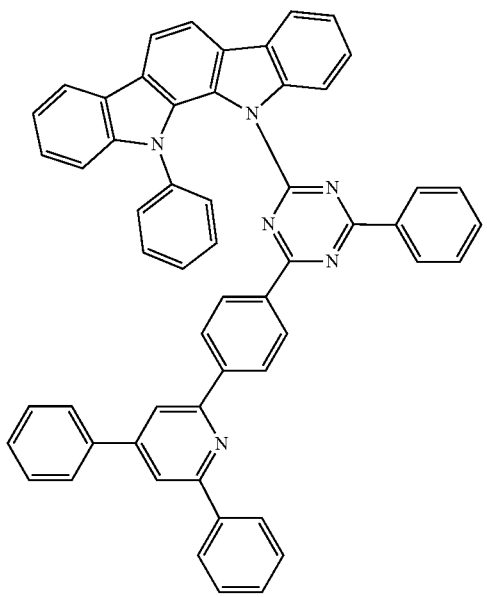

1-9
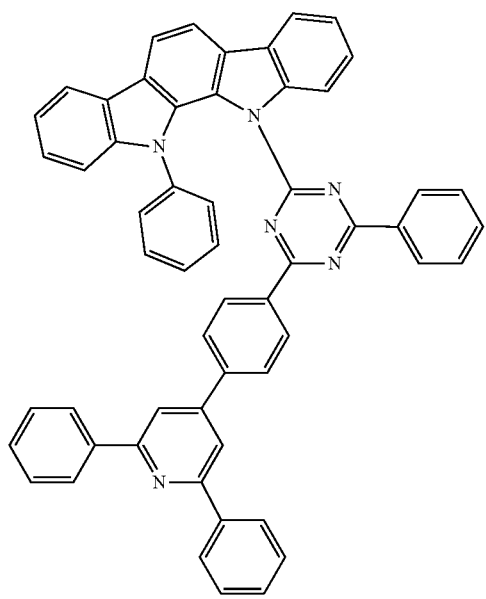
1-10
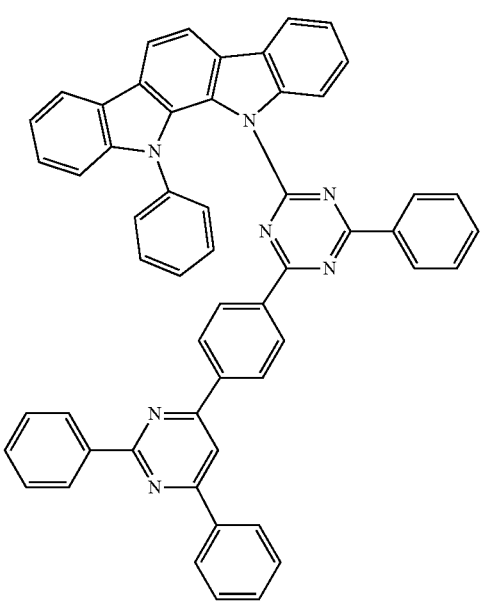
1-11
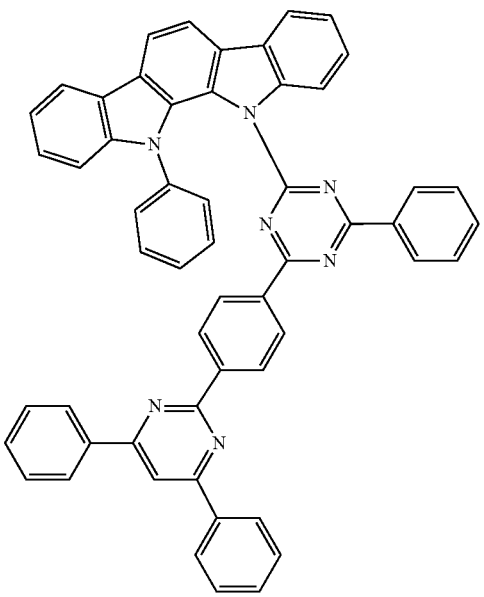
1-12
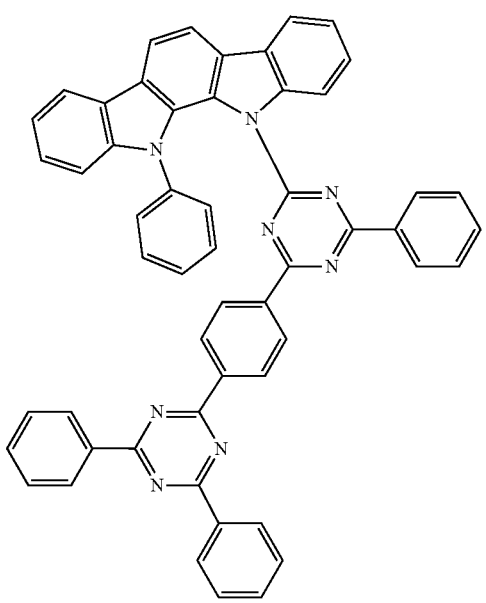

-continued
1-13
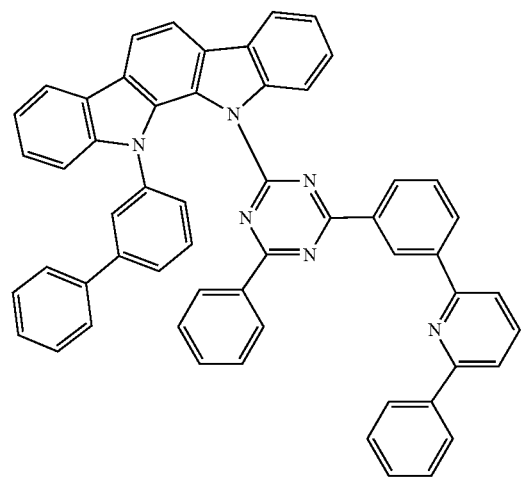
1-14
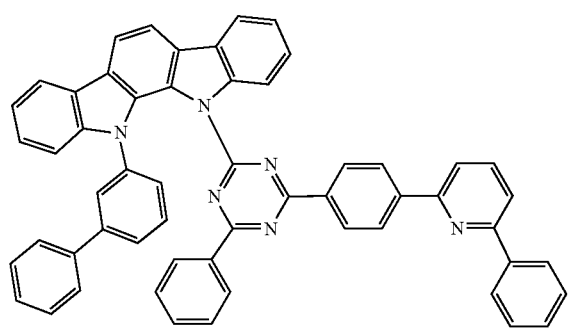
1-15
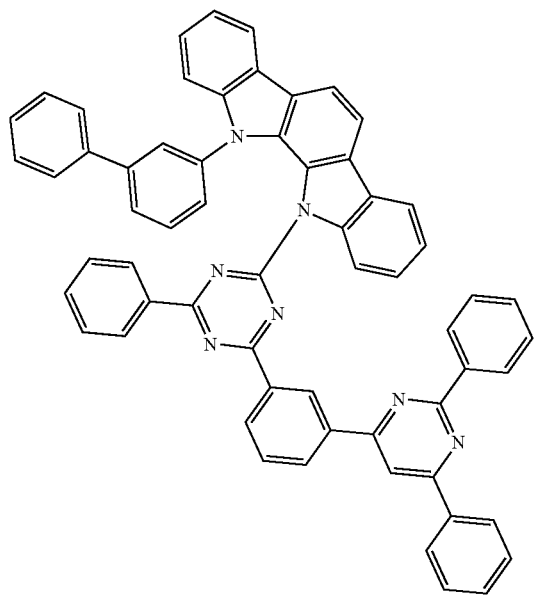
1-16
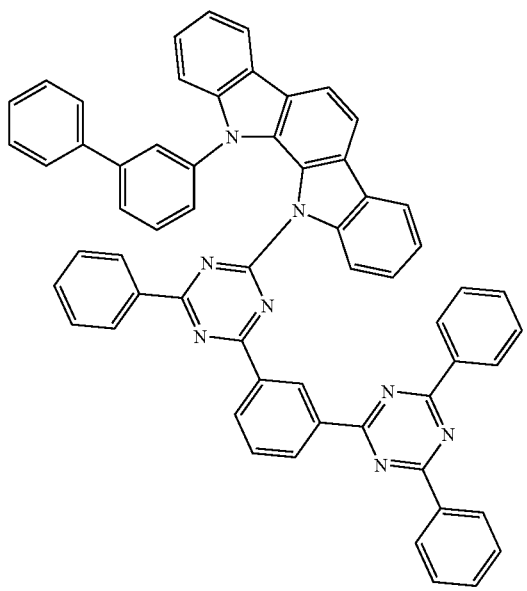
1-17
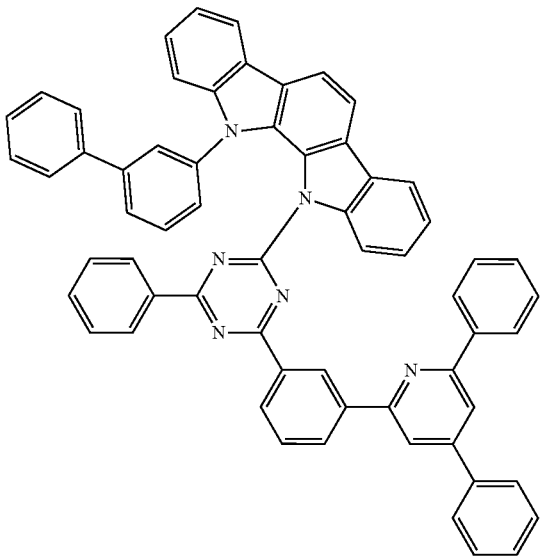

1-18
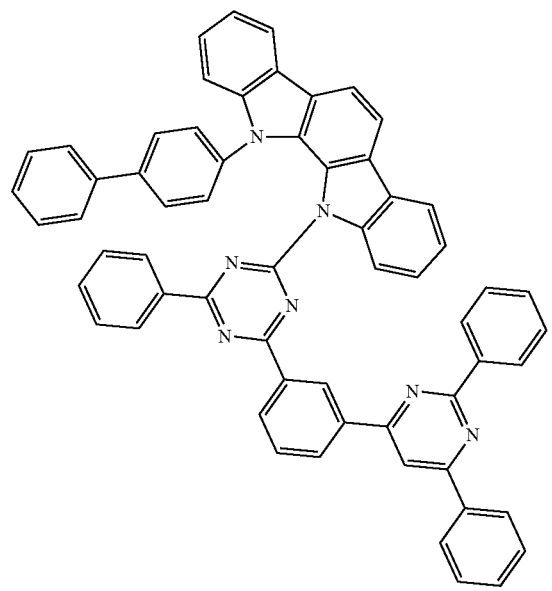
1-19
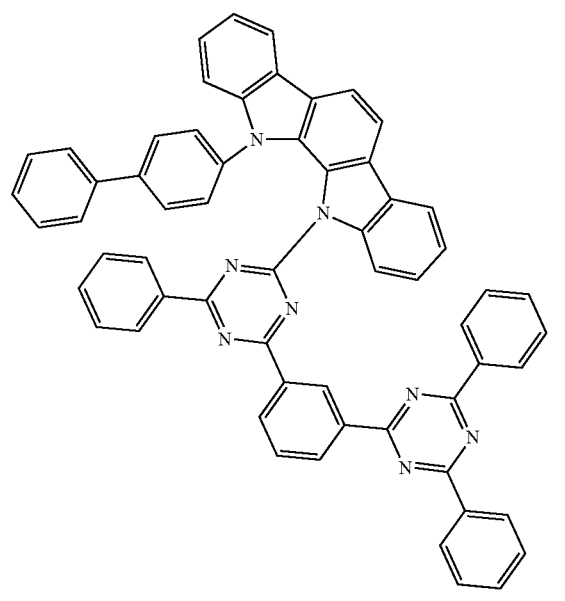
1-20
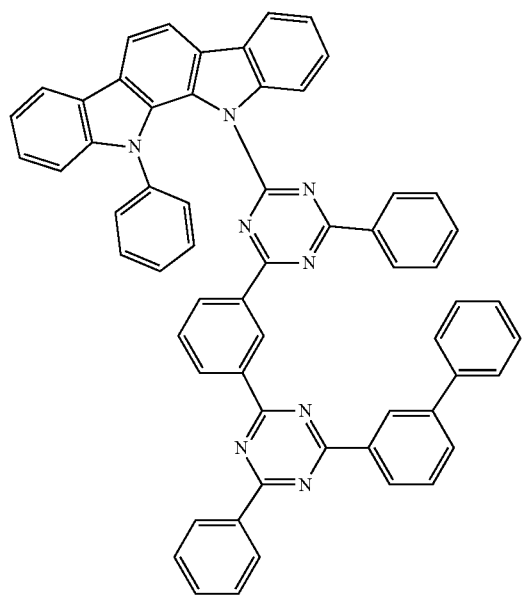
1-22
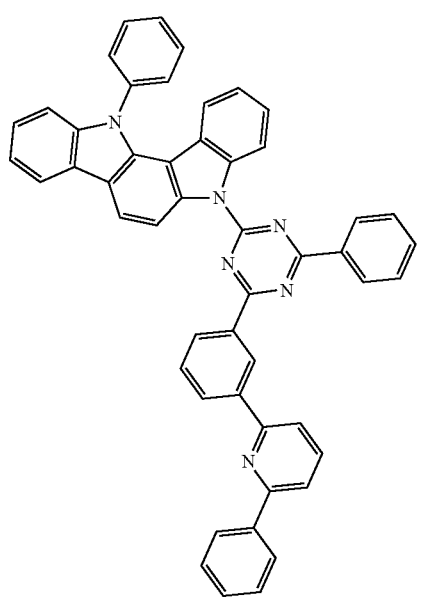

1-23
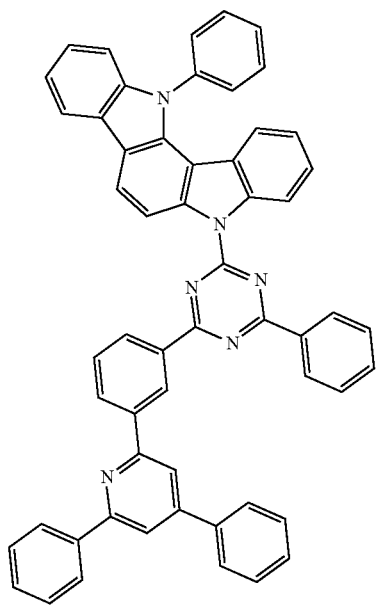
1-25
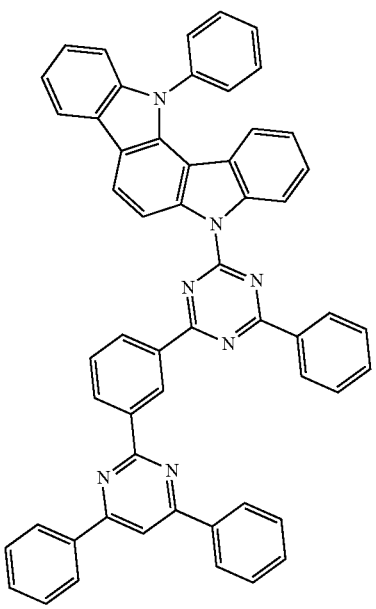
1-24
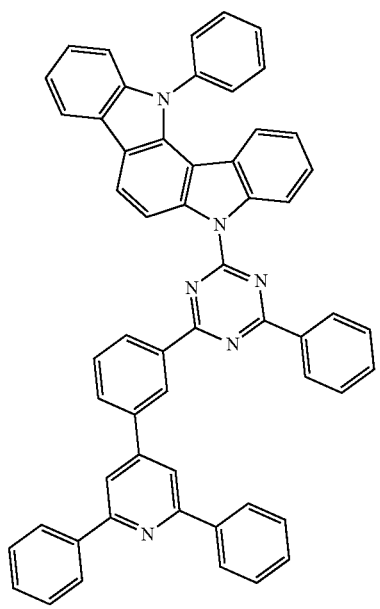
1-26
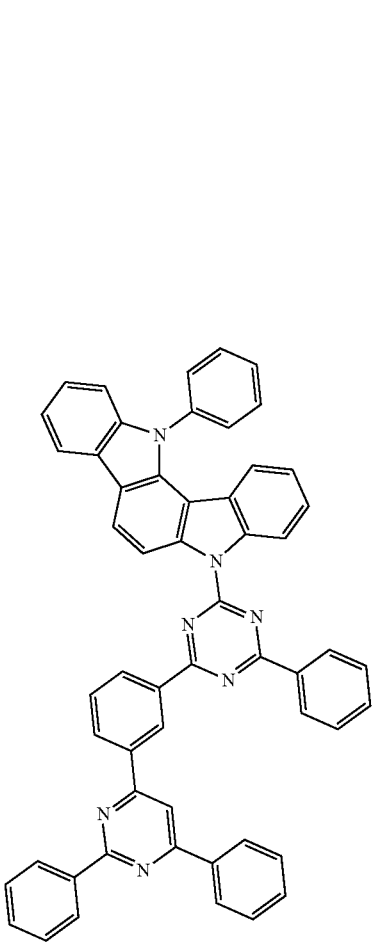

1-27
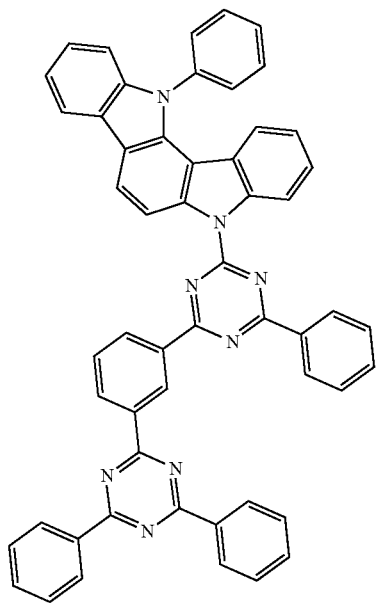
1-28
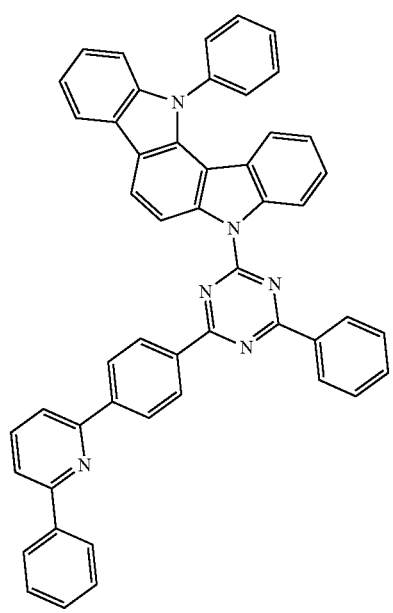
1-29
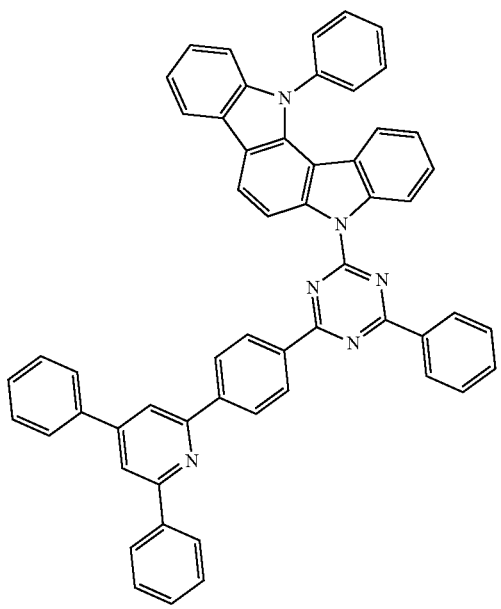
1-30
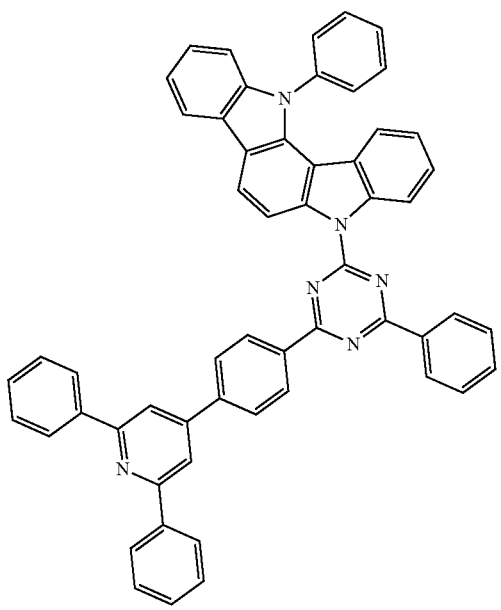

1-31
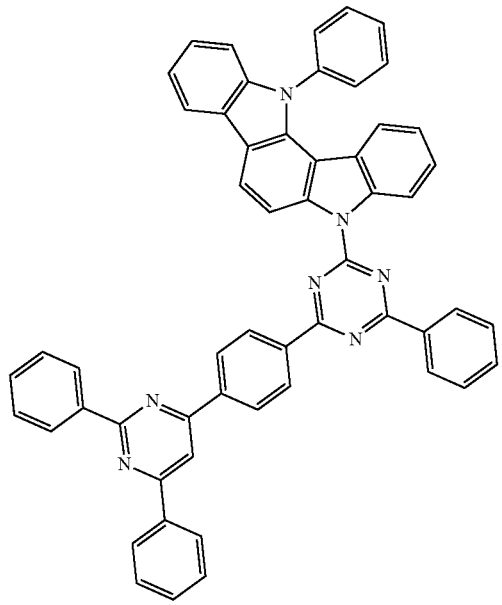
1-33
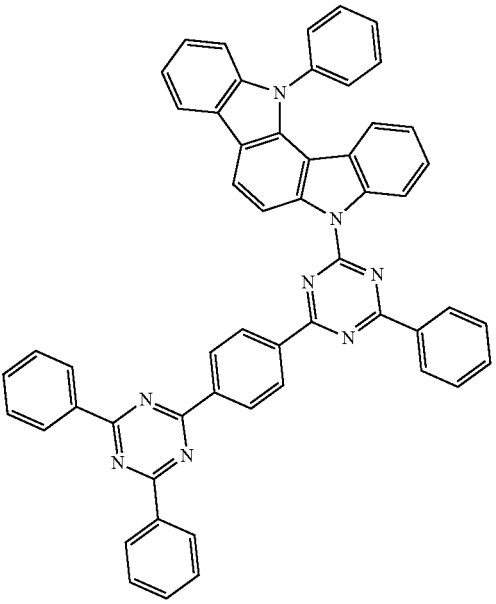
1-32
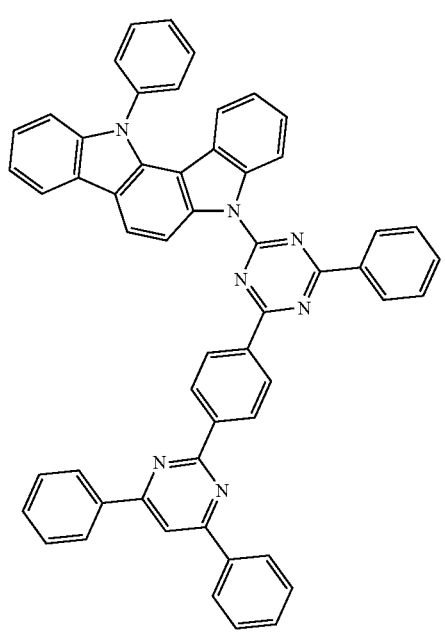
1-34
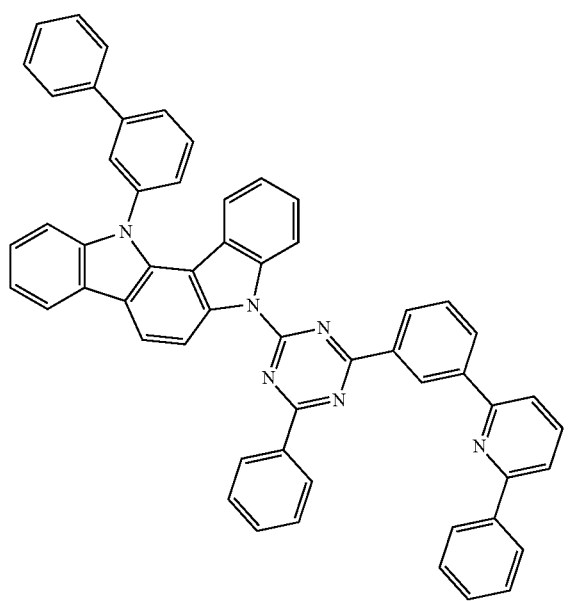

1-35
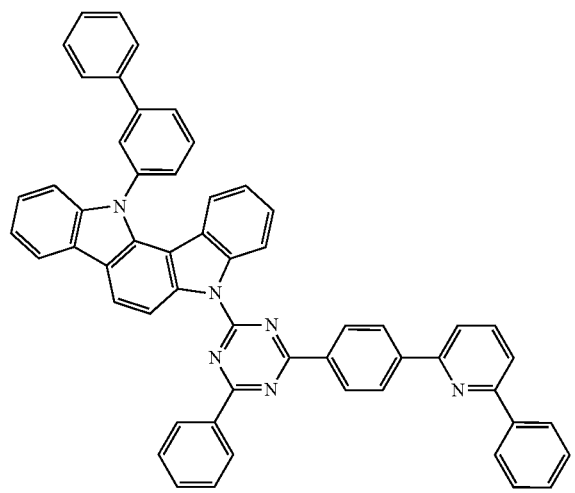
1-36
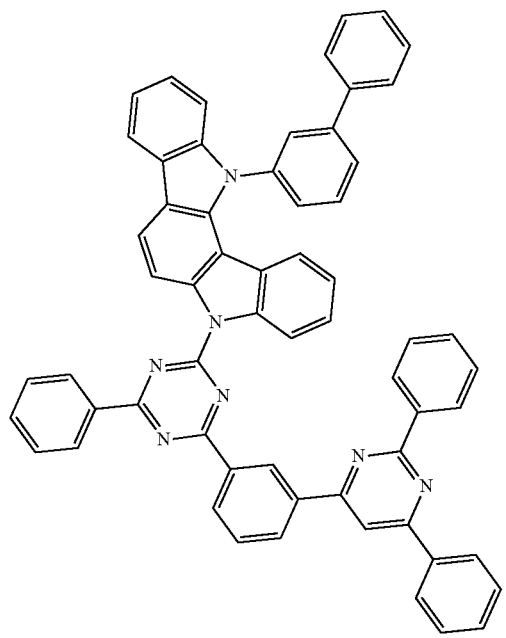
1-37
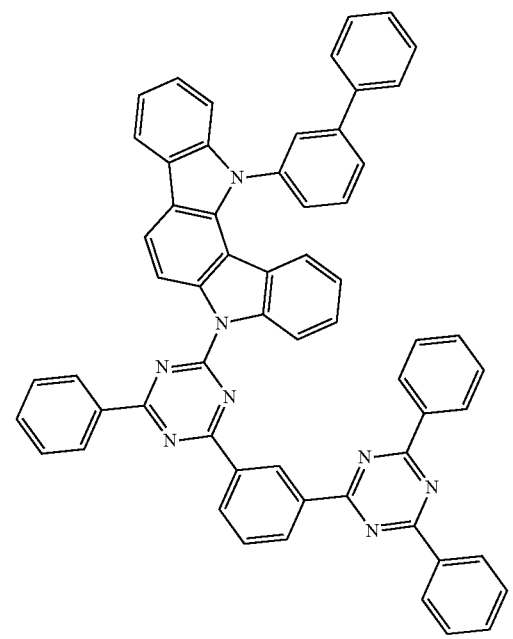
1-38
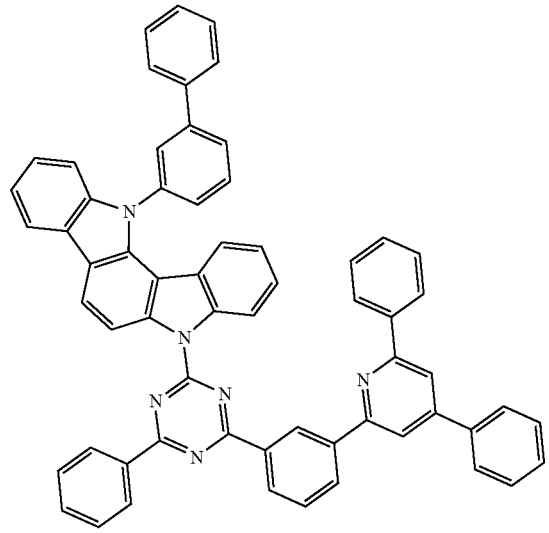

1-39
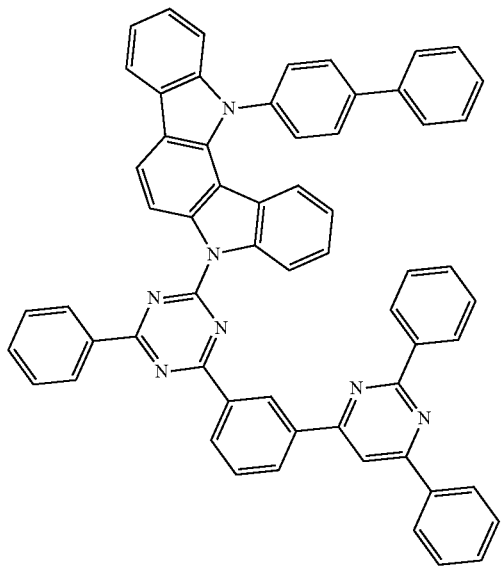
1-41
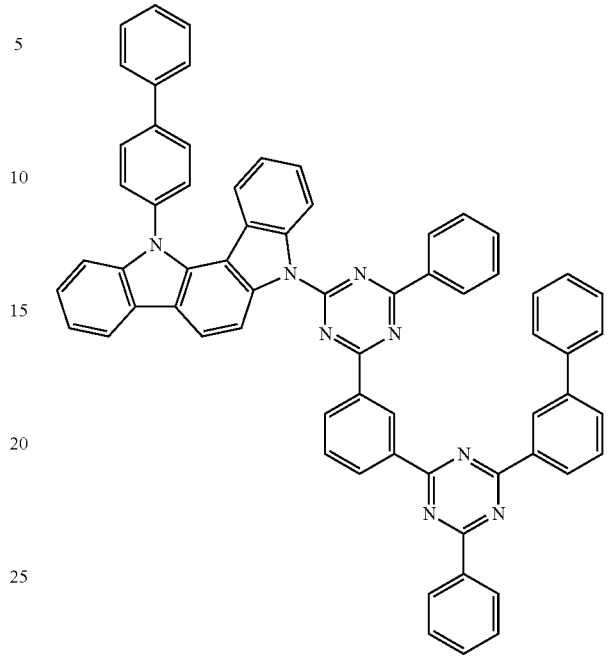
[C8]
1-40
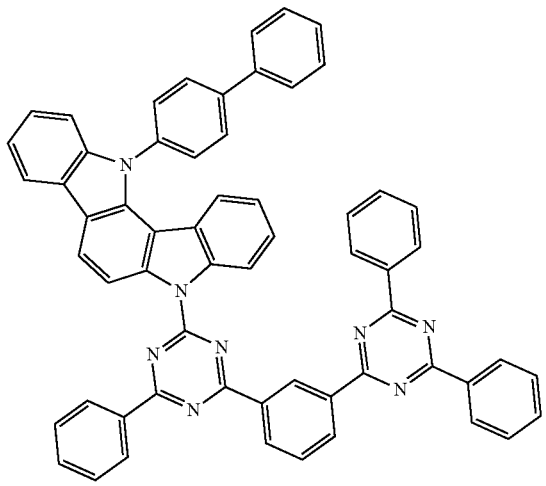
1-42
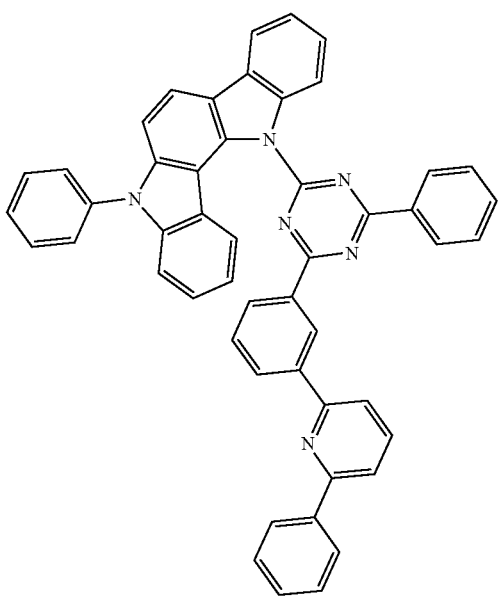

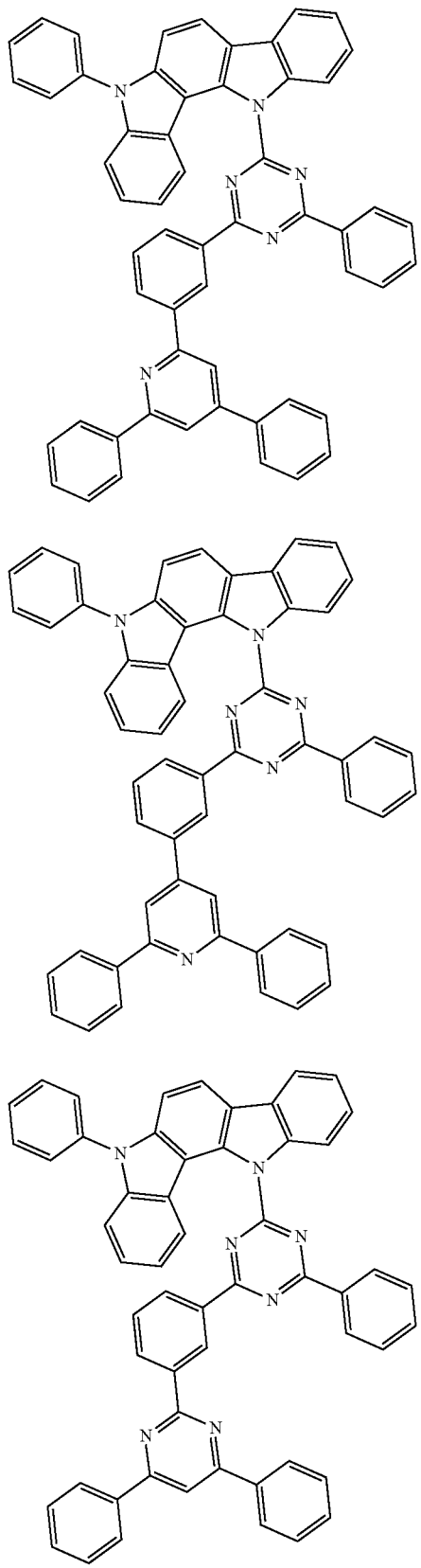
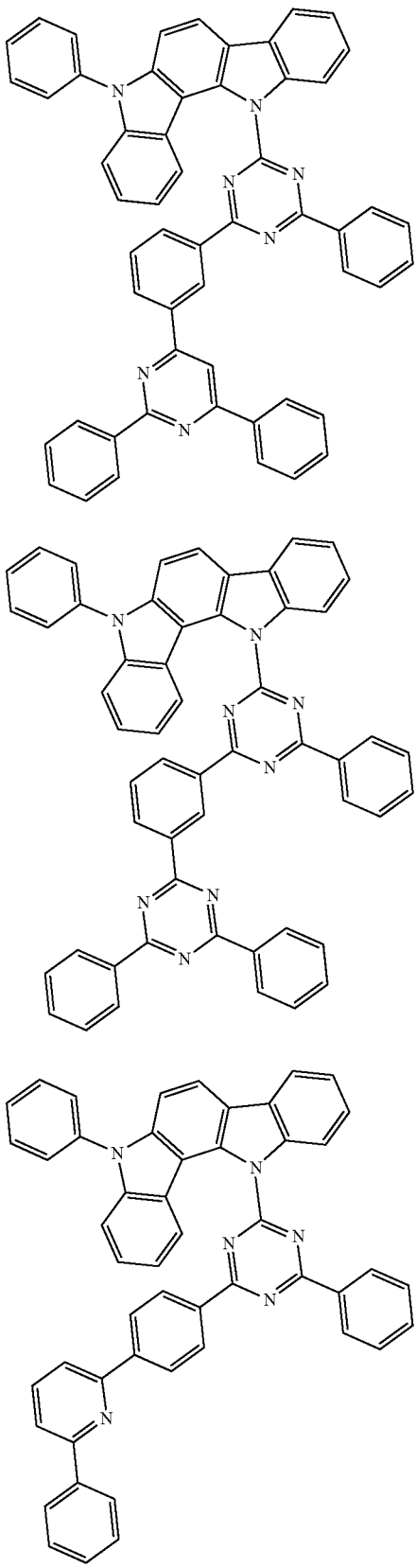

-continued
1-49
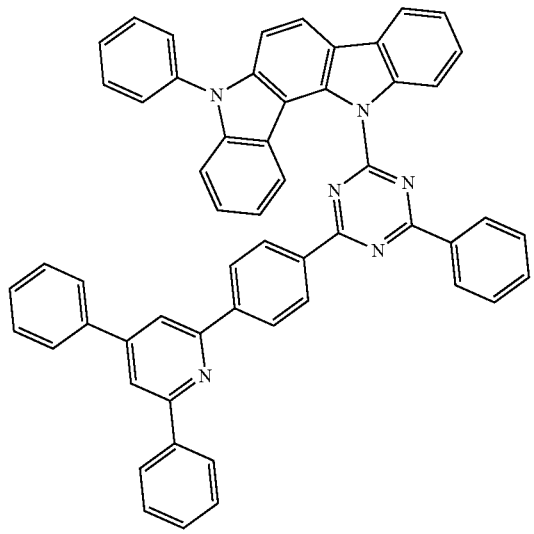
1-50
1-52
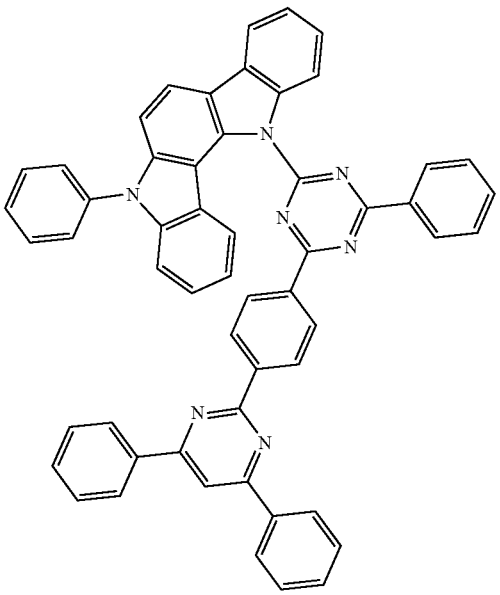
1-51
1-53
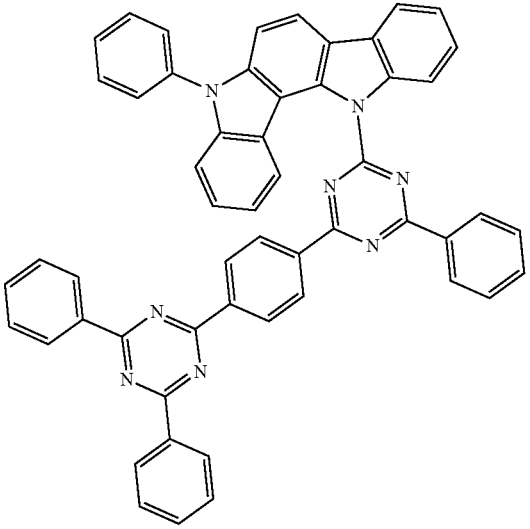

1-54
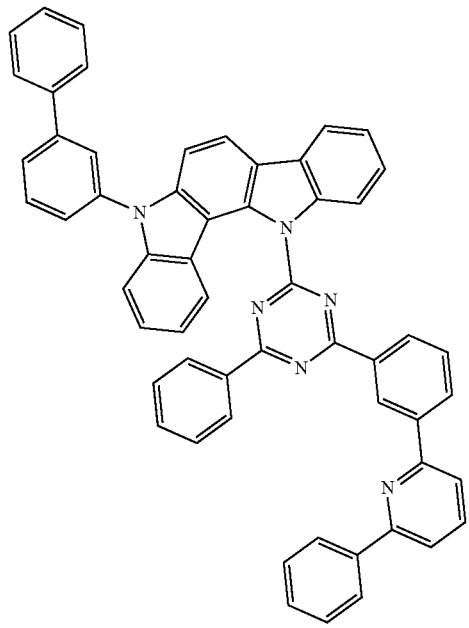
1-56
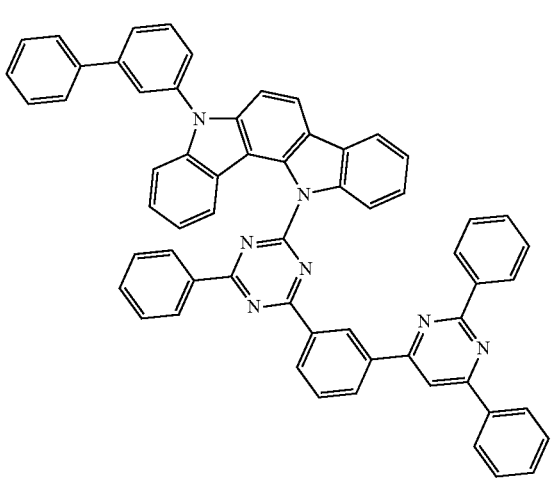
1-57
1-55
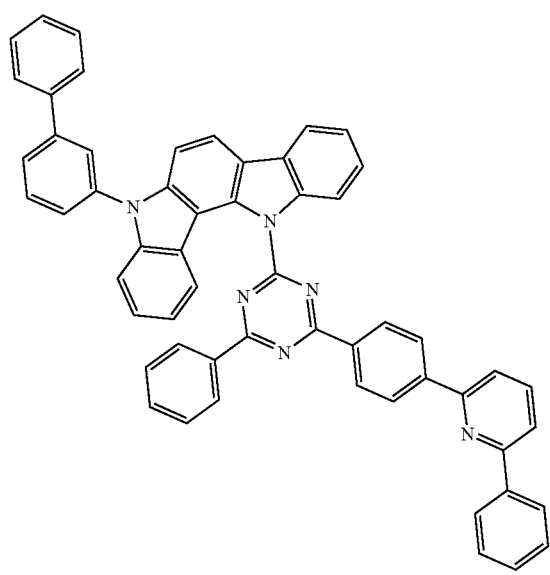
1-58
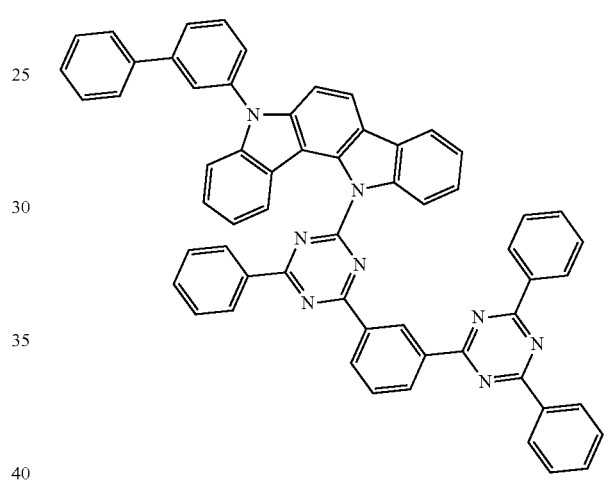

1-59
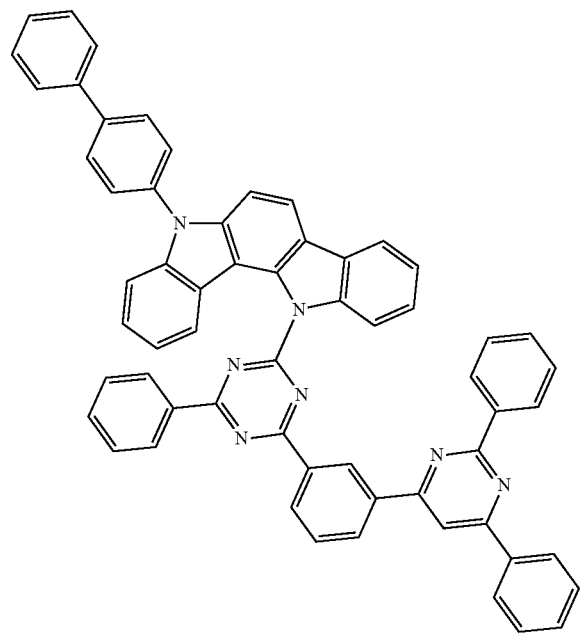
1-61
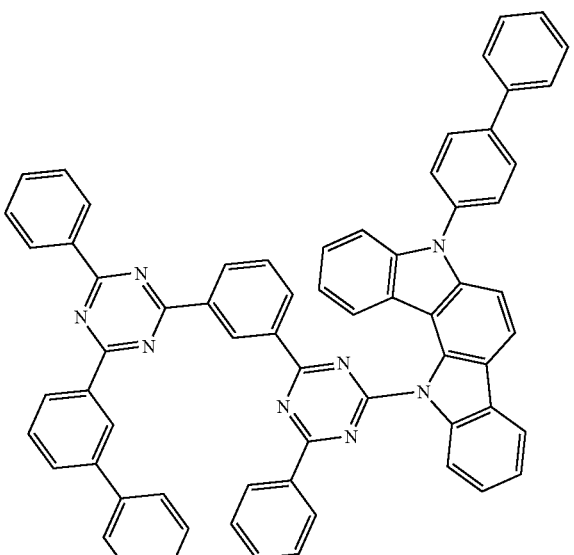
[C9]
1-60
1-62
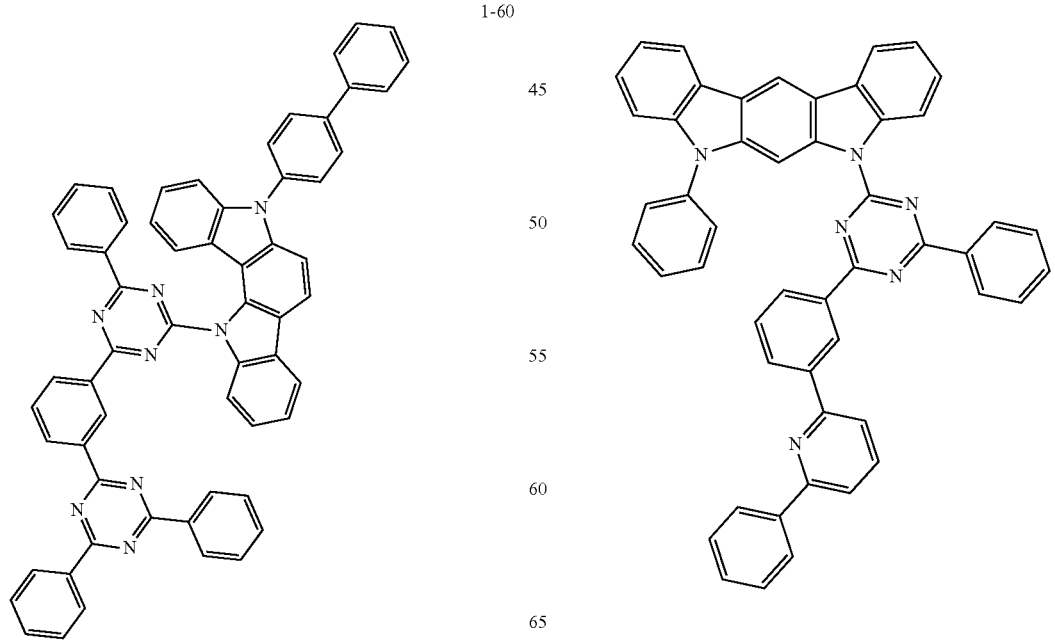

-continued
1-63
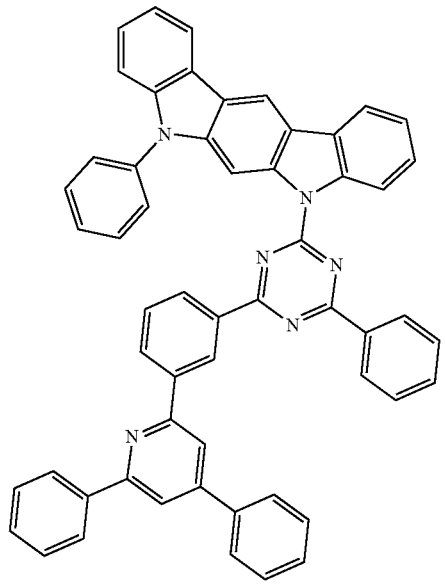
1-65
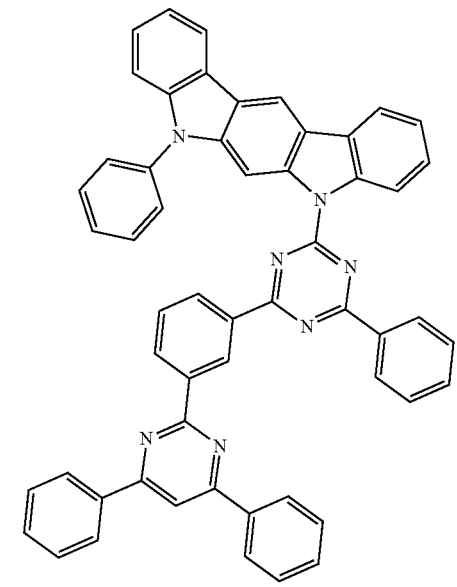
1-64
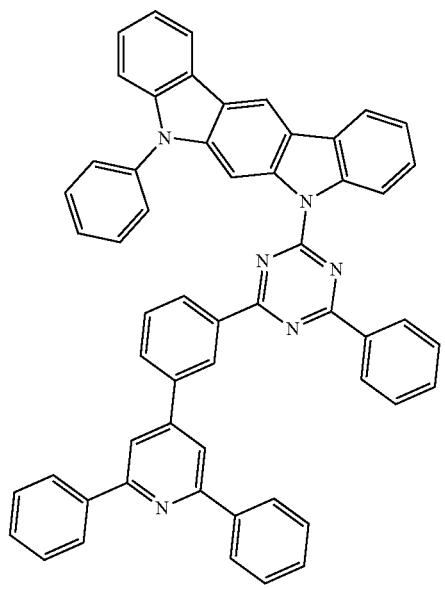
1-66
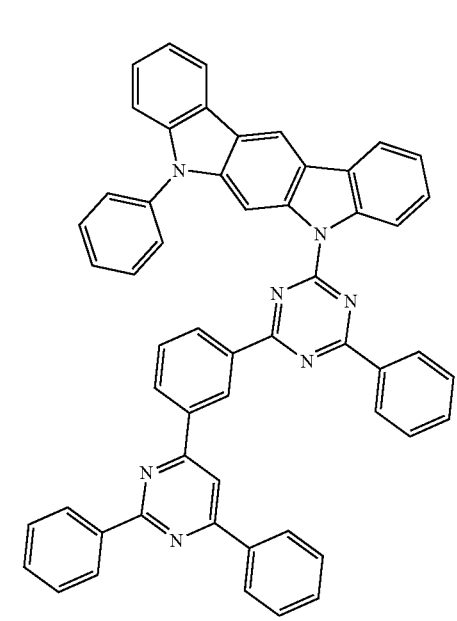

1-67
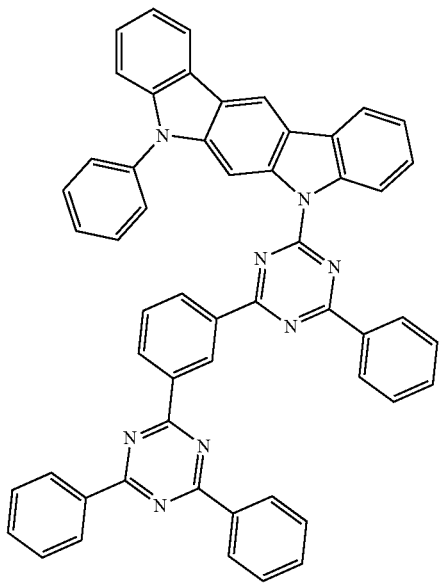
1-68
1-69
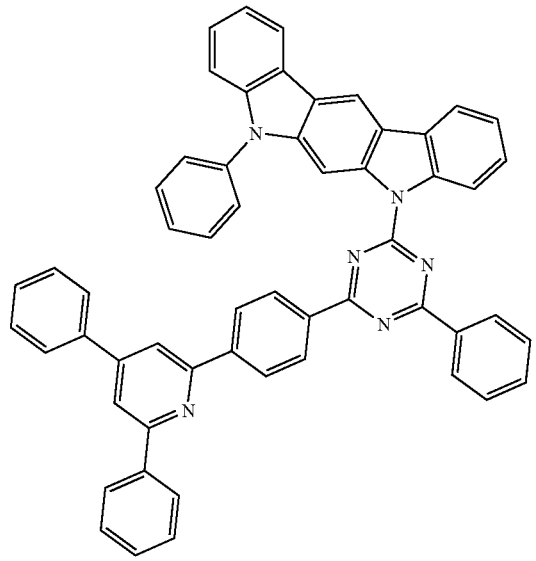
1-70

-continued
1-71
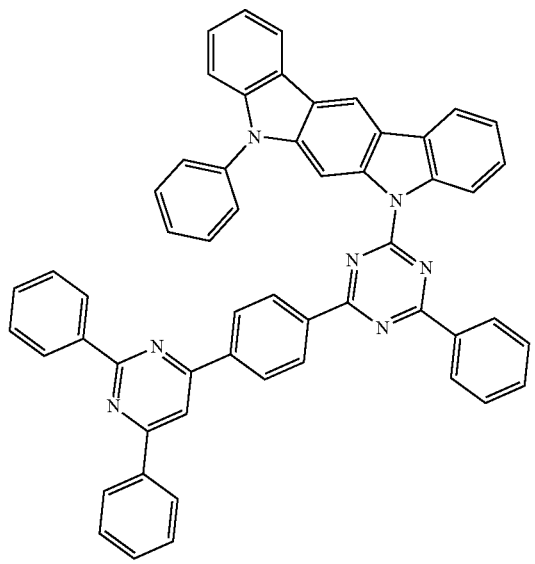
1-73
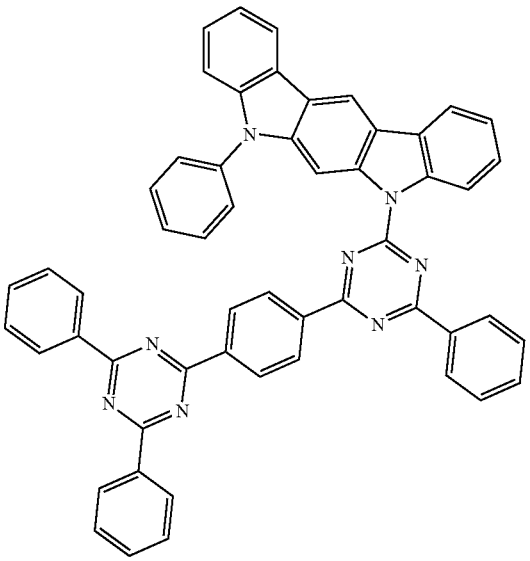
1-72
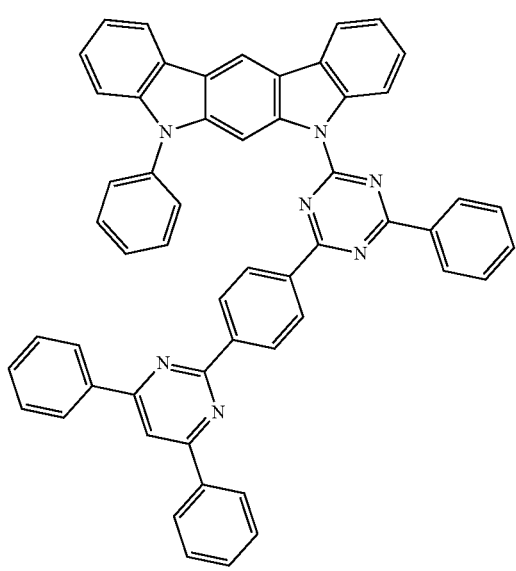
1-74
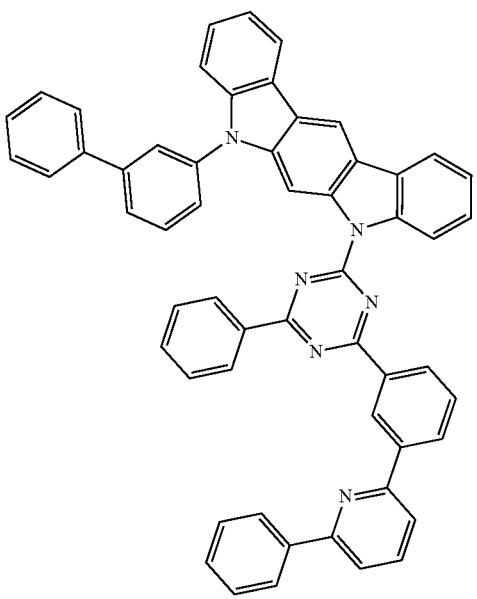

1-75
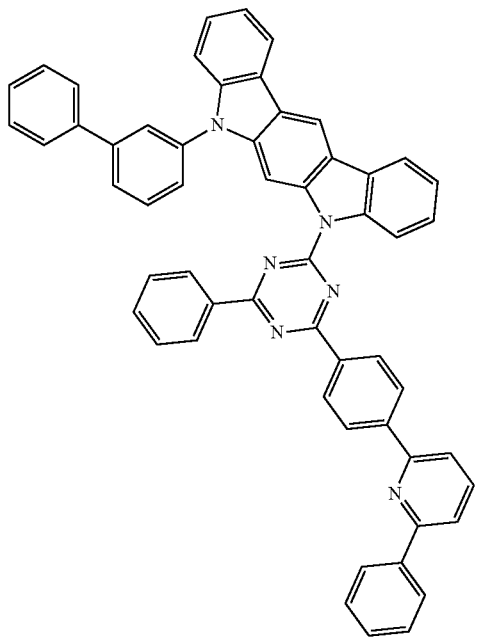
1-77
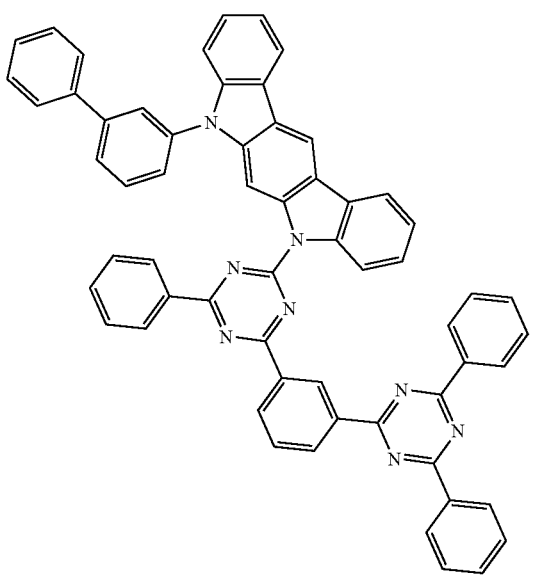
1-76
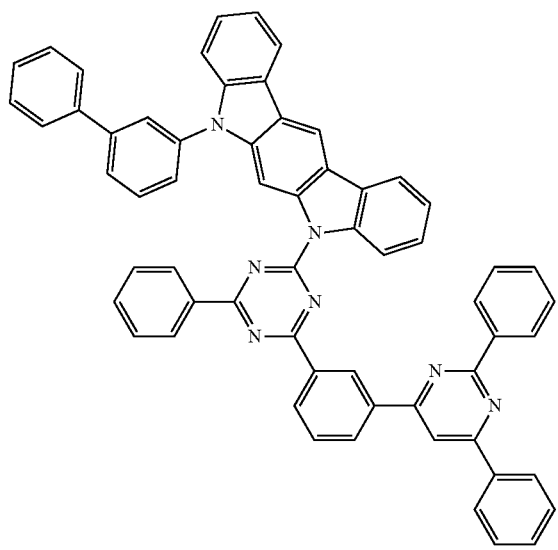
1-78
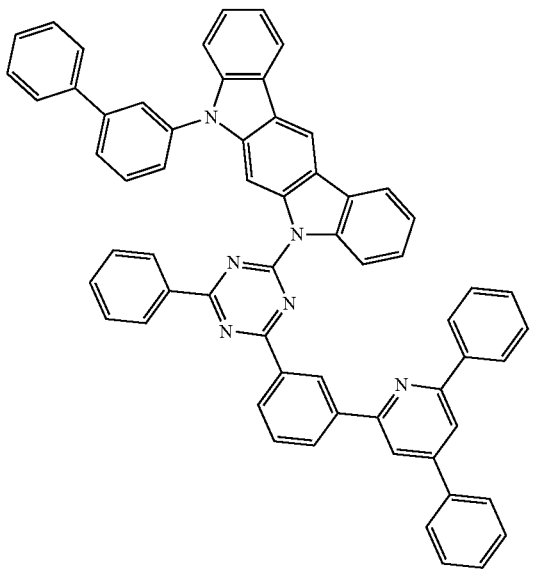

1-79
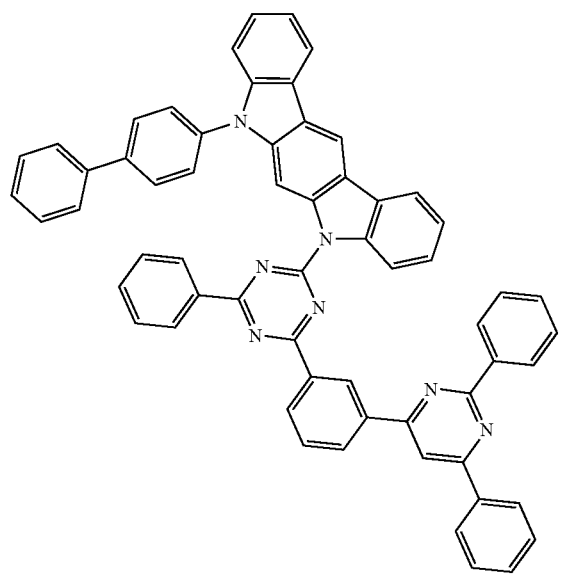
1-81
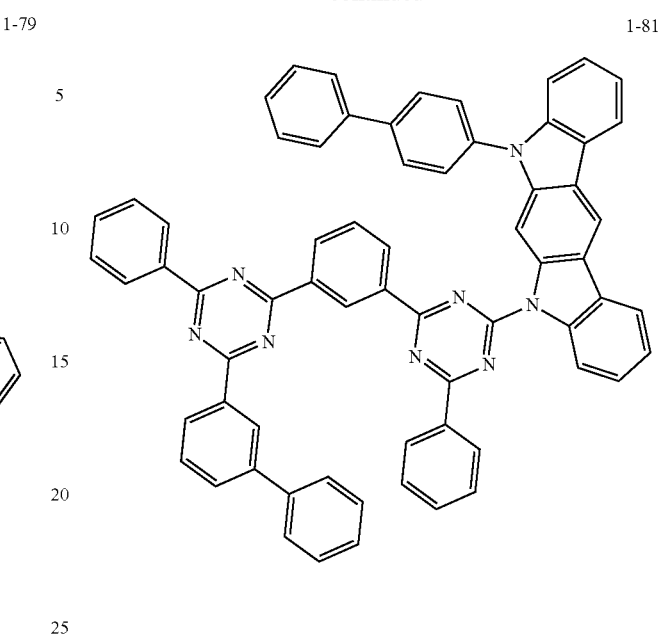
1-80
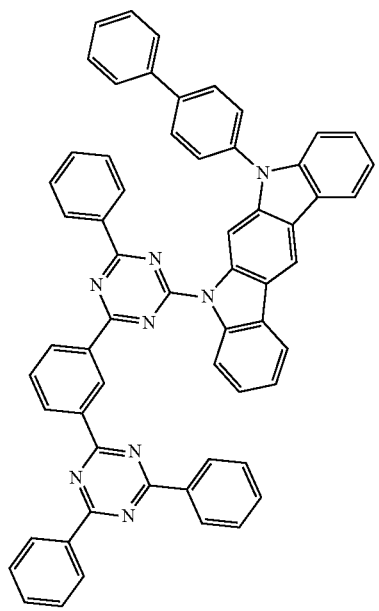
[C10]
1-82
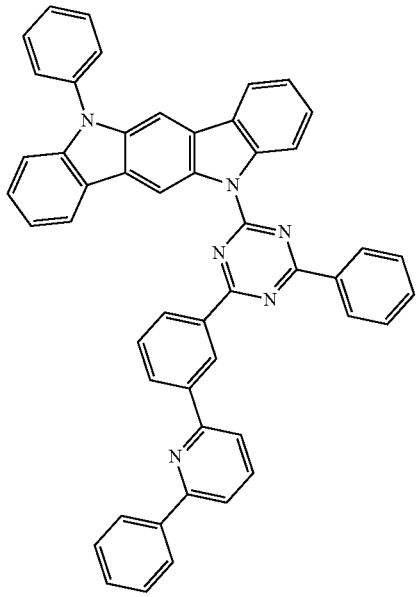

1-83
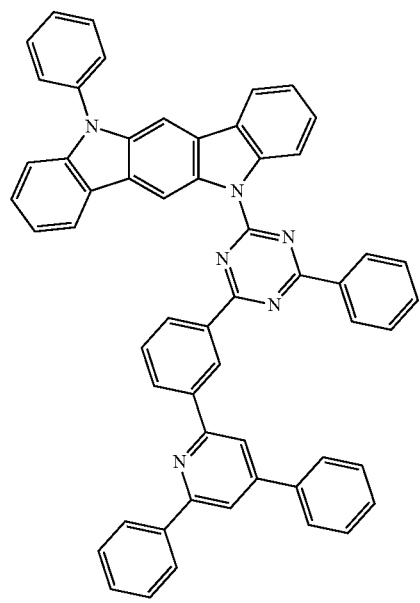
1-84
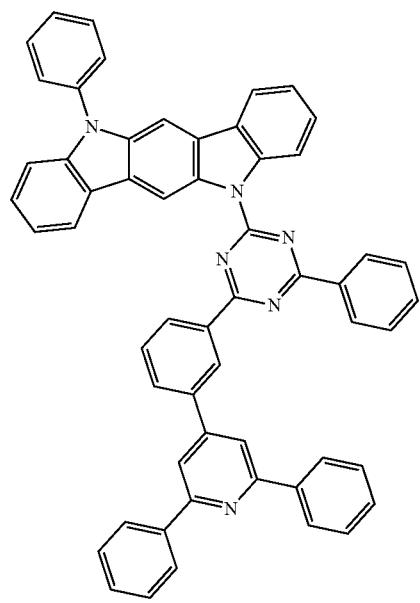
1-85
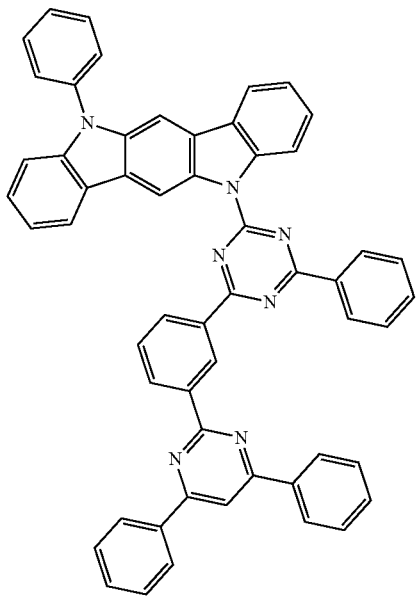
1-86
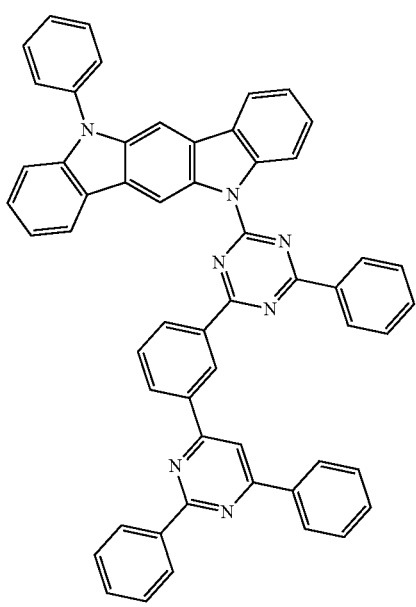

1-87
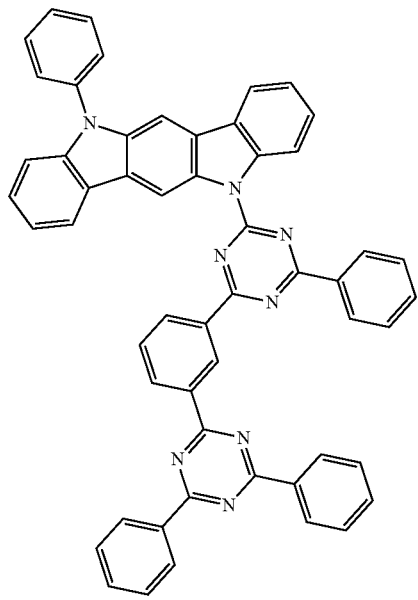
1-89
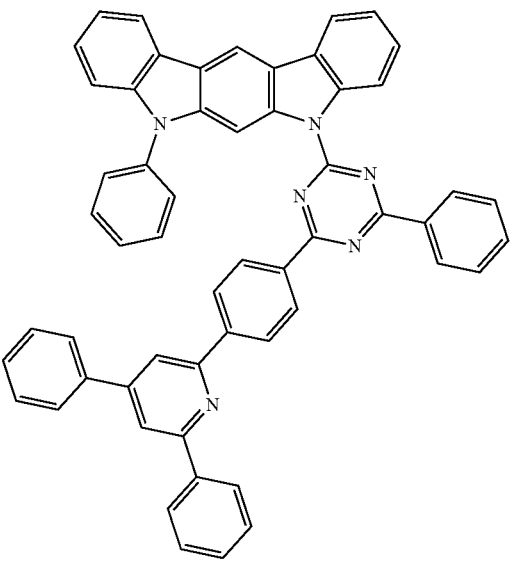
1-88
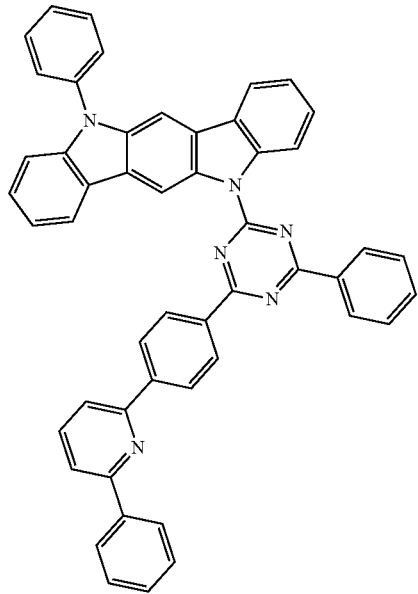
1-90
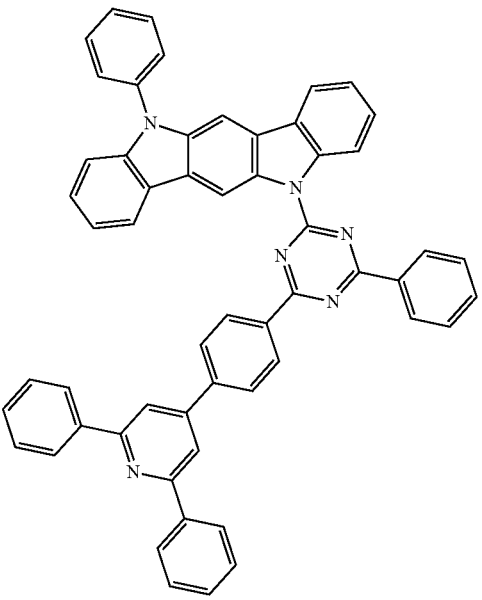

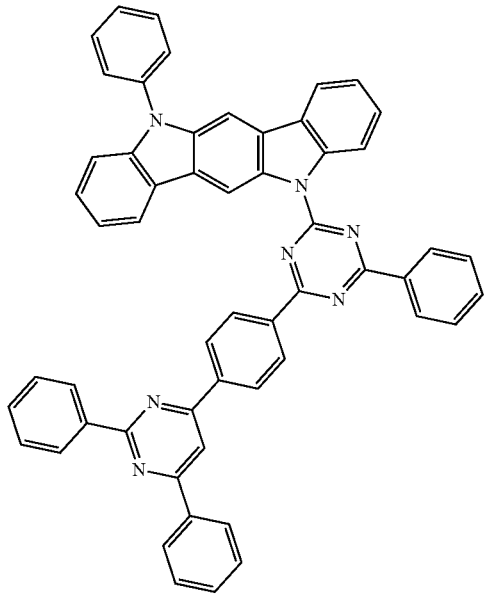
1-91
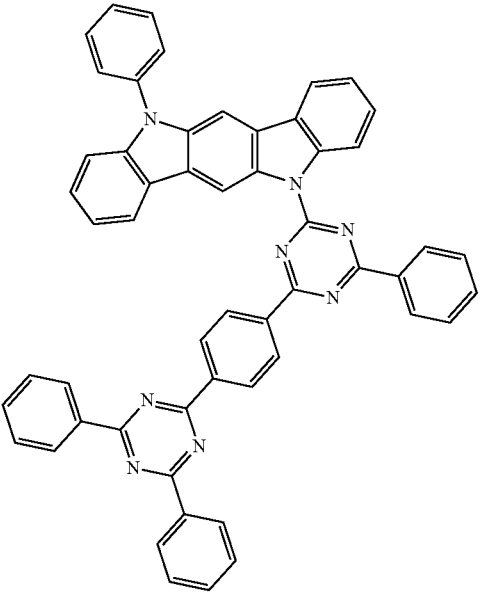
1-93
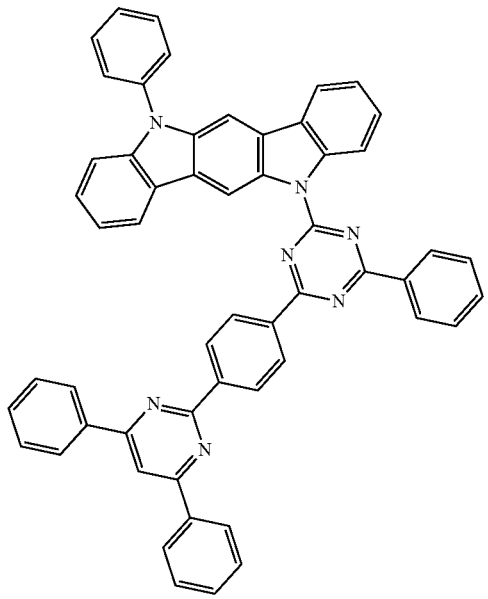
1-92
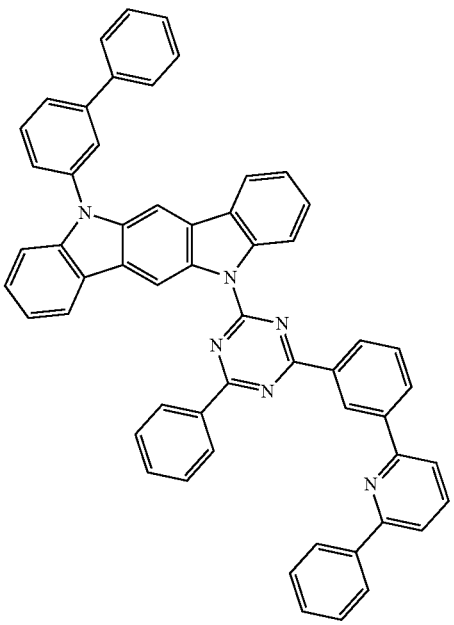
1-94

1-95
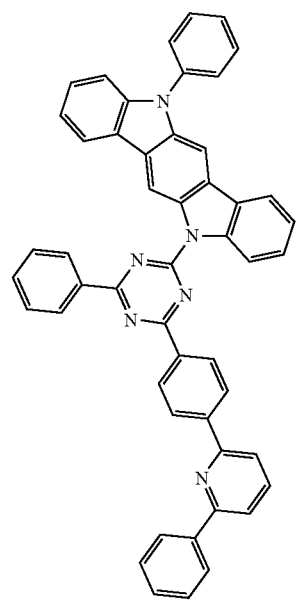
1-96
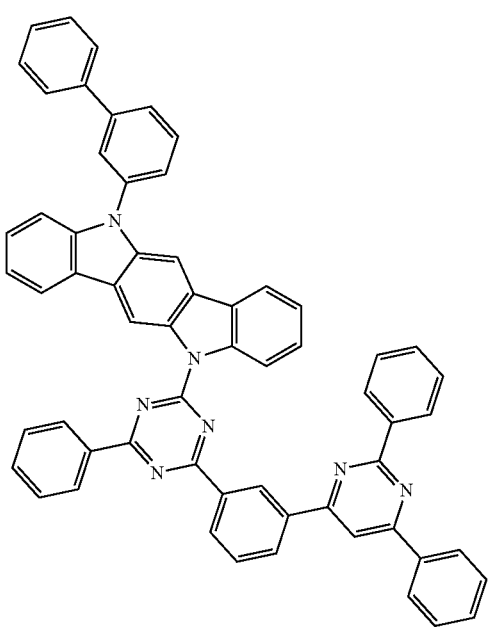
1-97
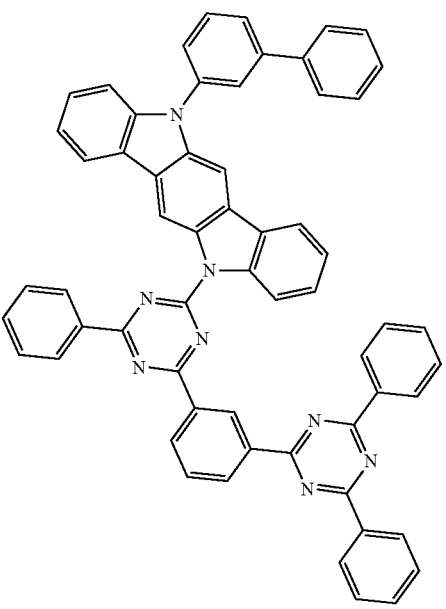
1-98
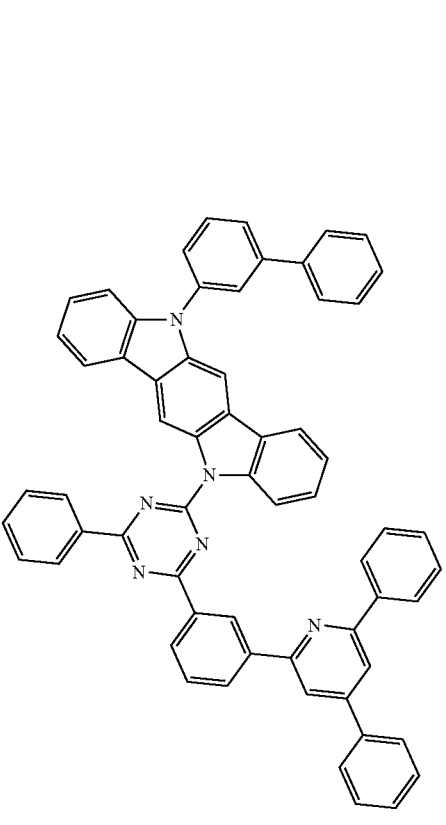

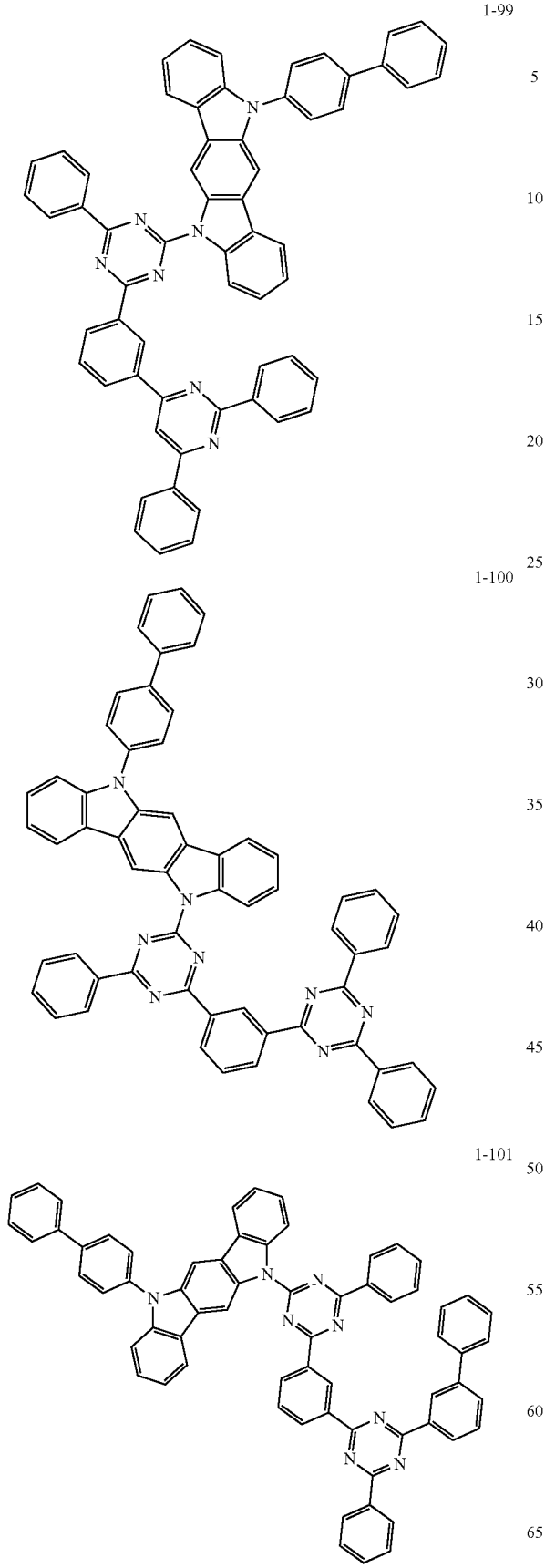
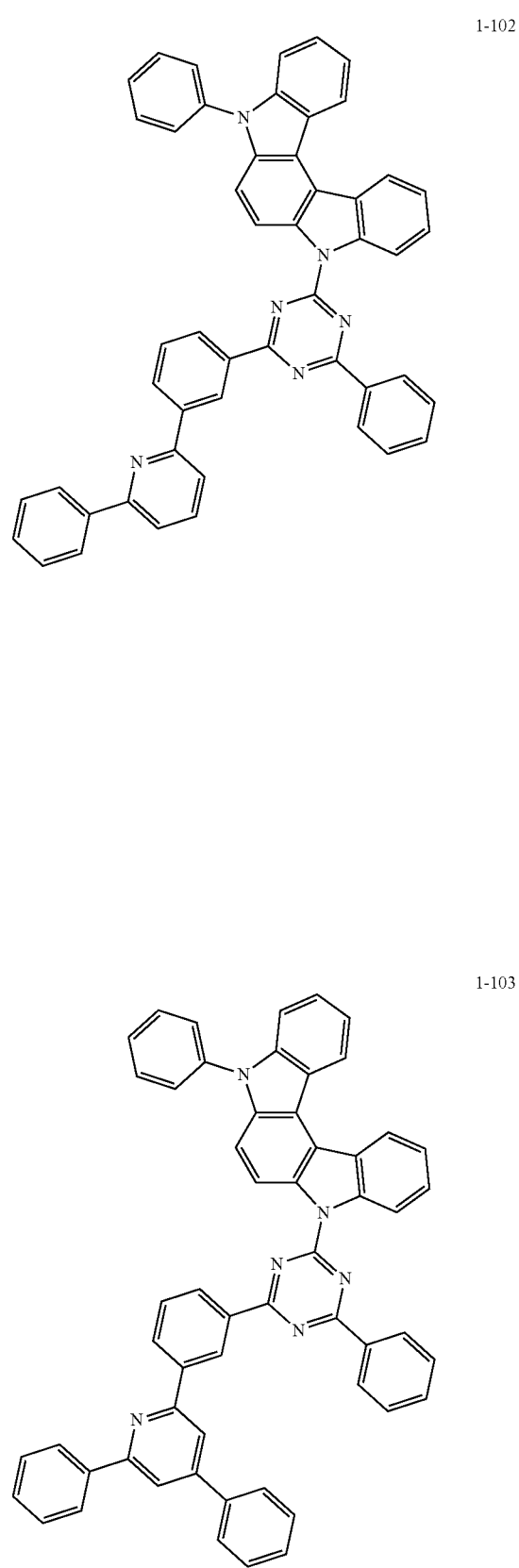

1-104
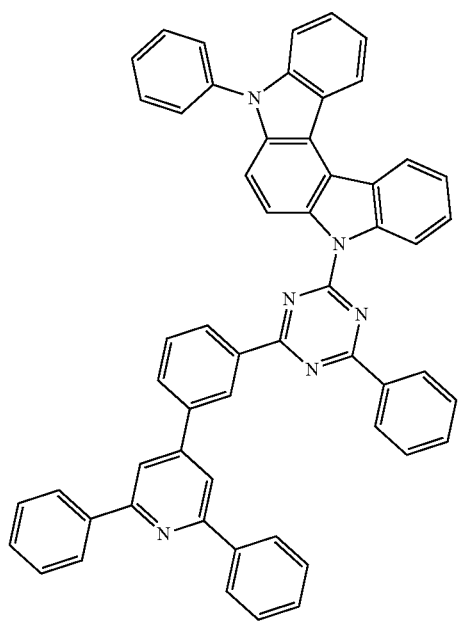
1-106
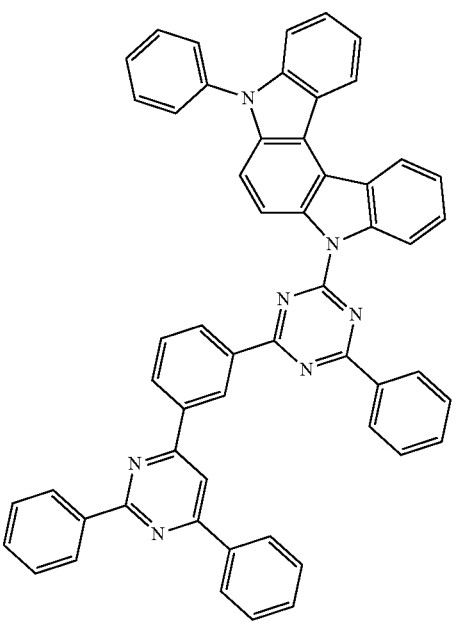
1-105
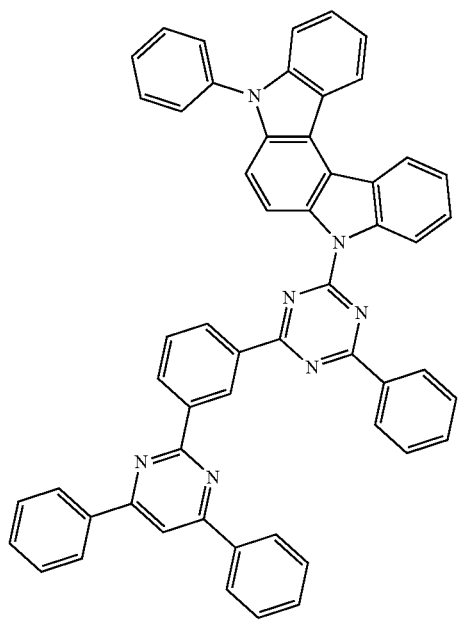
1-107
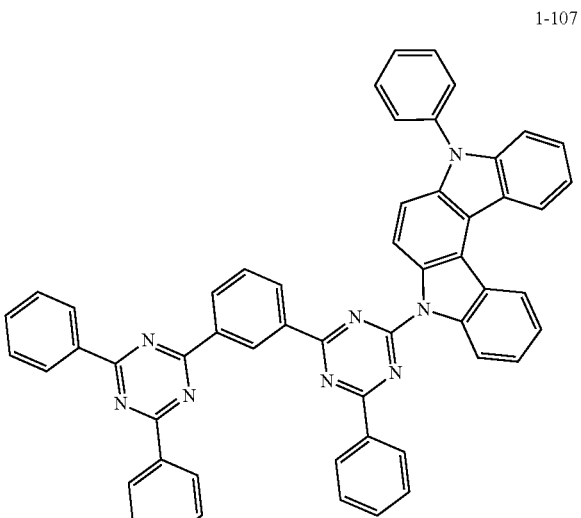

1-108
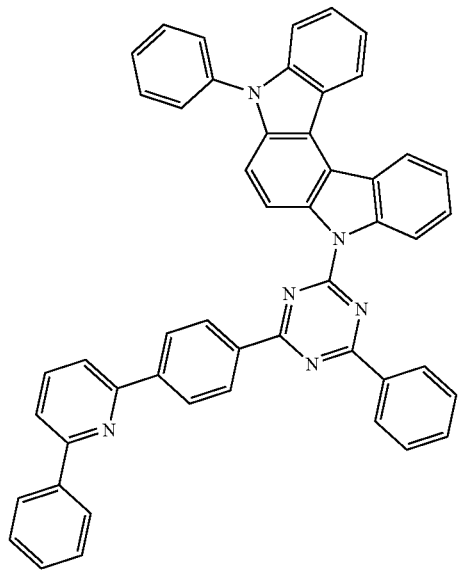
1-110
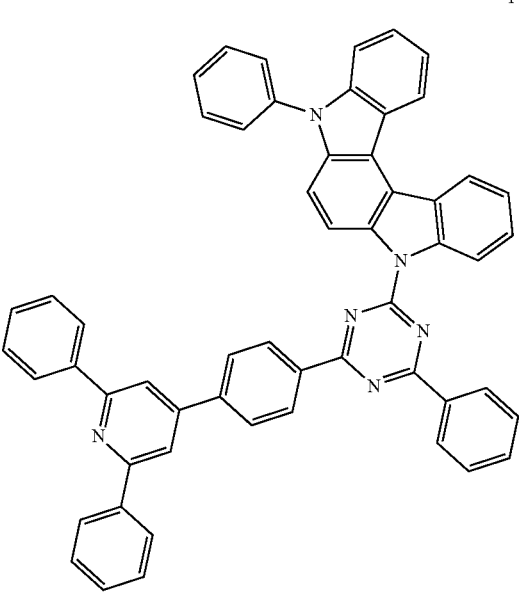
1-109
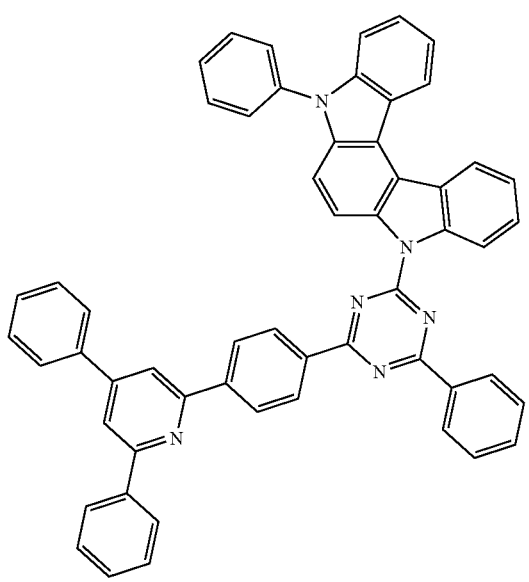
1-111
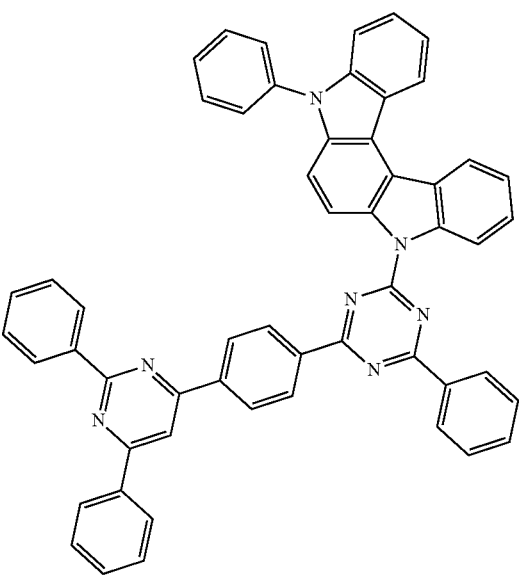

1-112
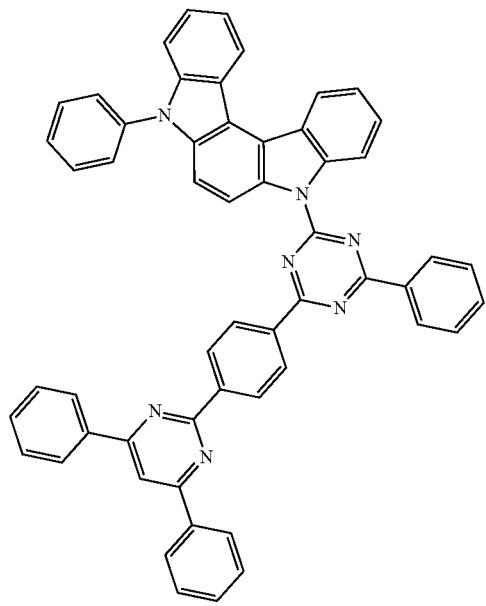
1-113
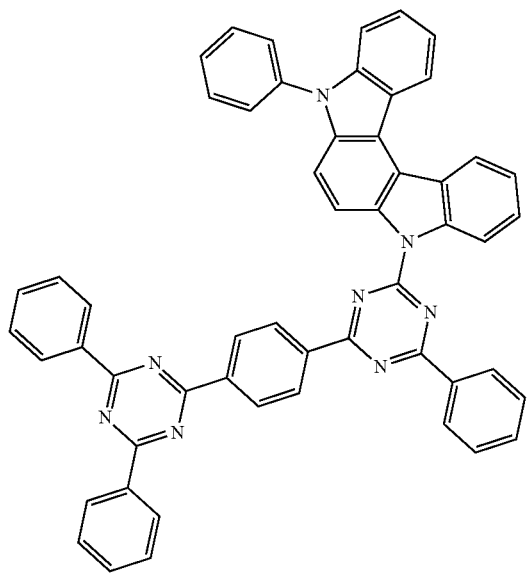
1-114
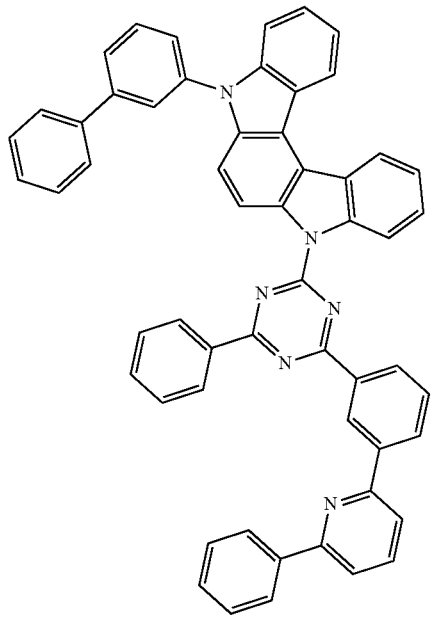
1-115
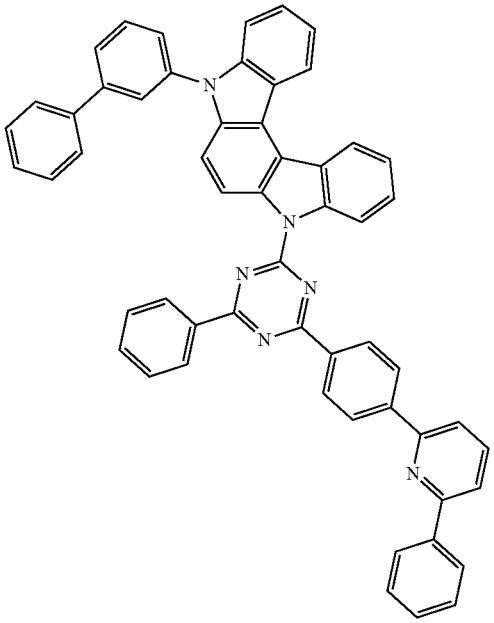

1-116
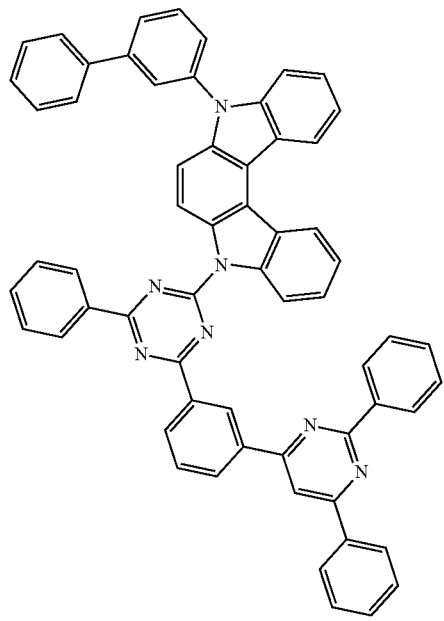
1-117
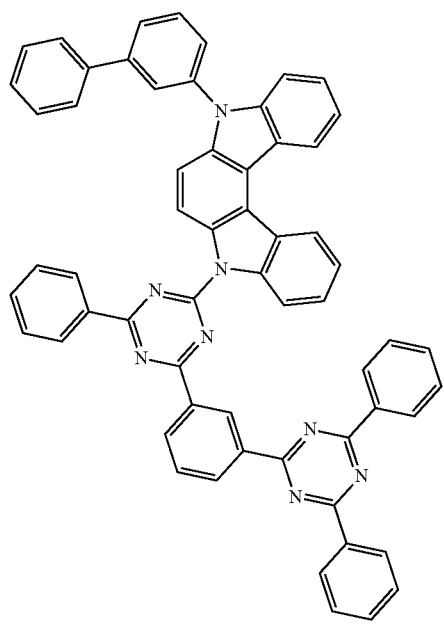
1-118
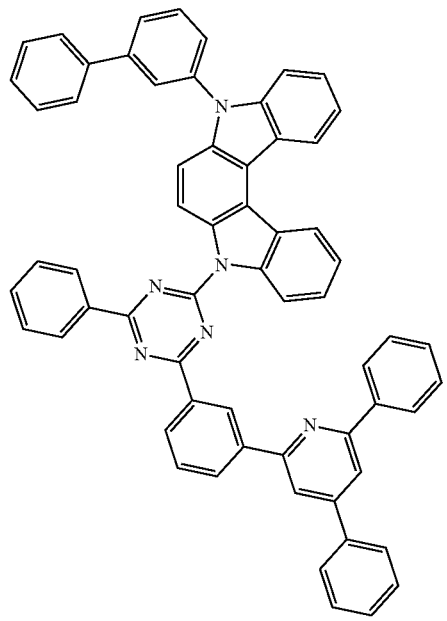
1-119
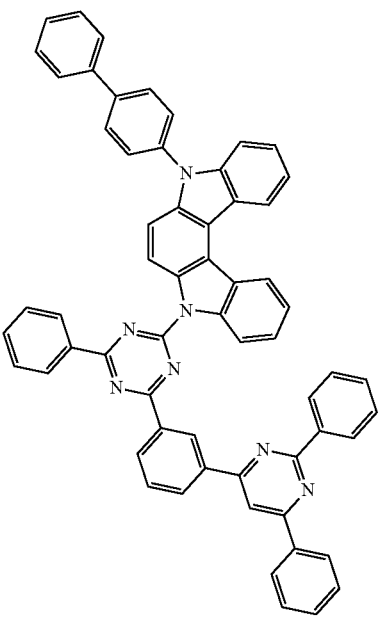

1-120
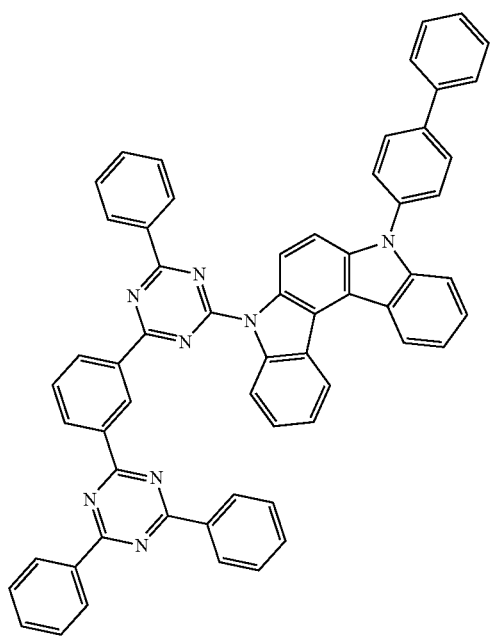
1-121
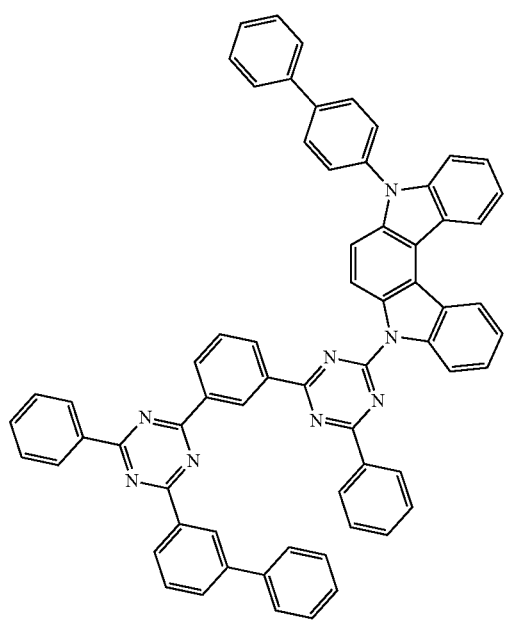
1-122
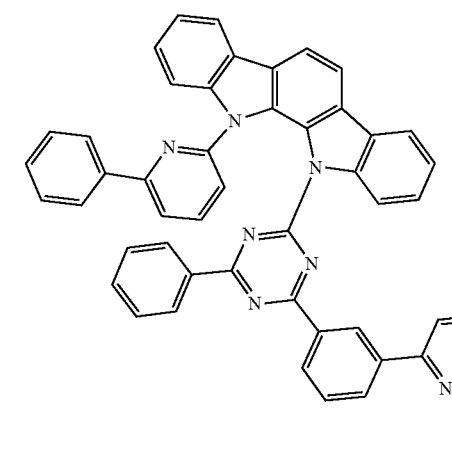
1-123
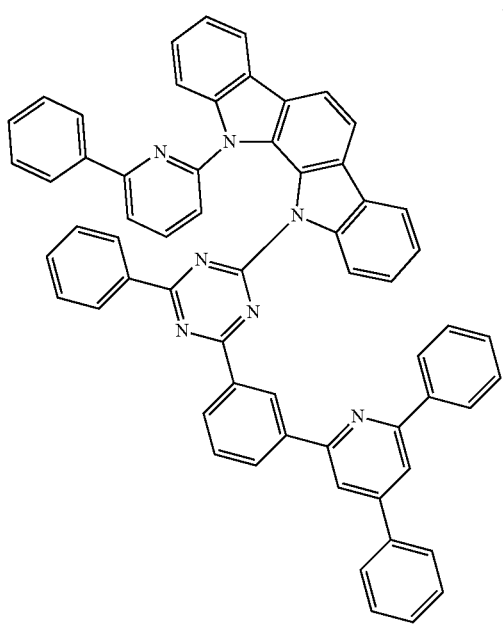

1-124
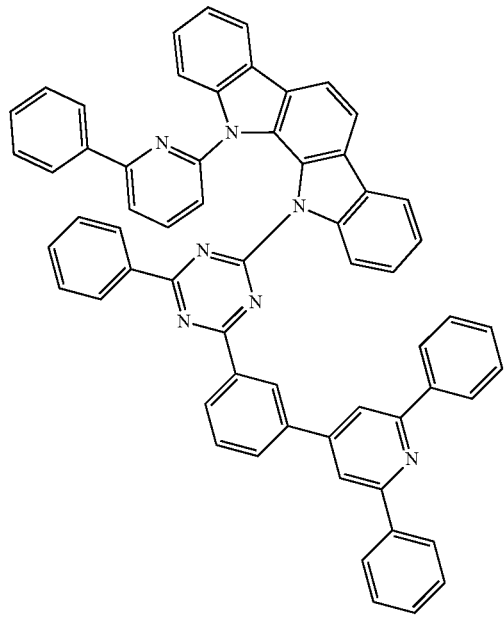
1-126
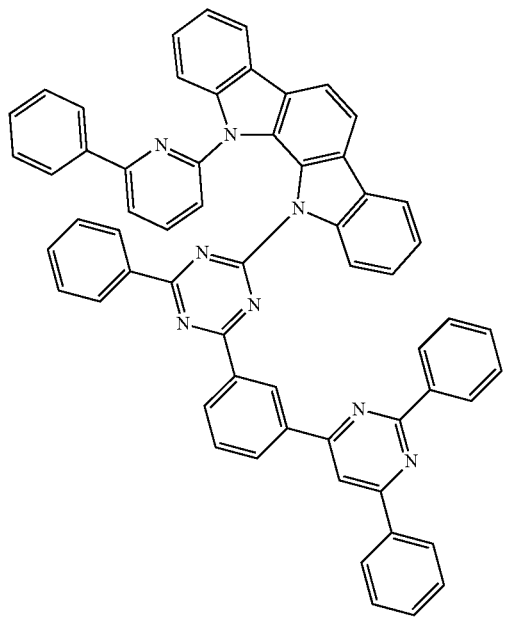
1-125
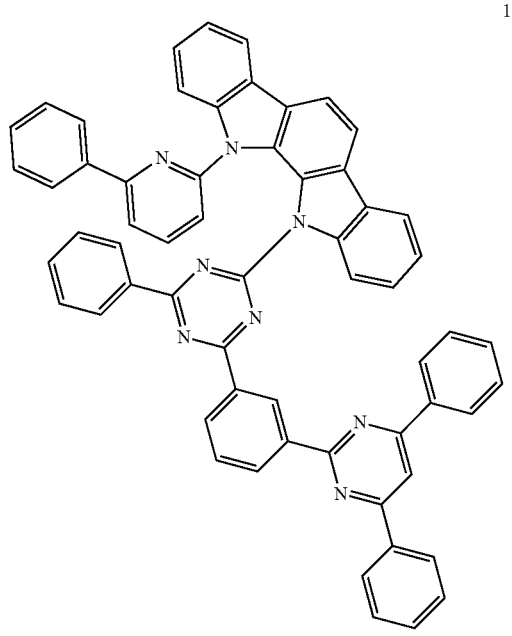
1-127
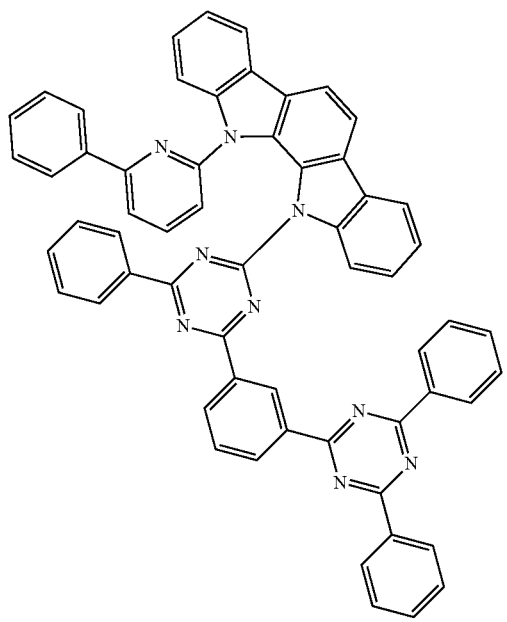

1-128
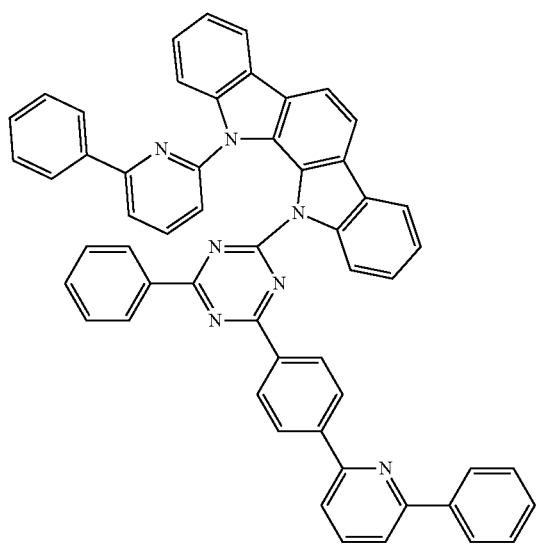
1-130
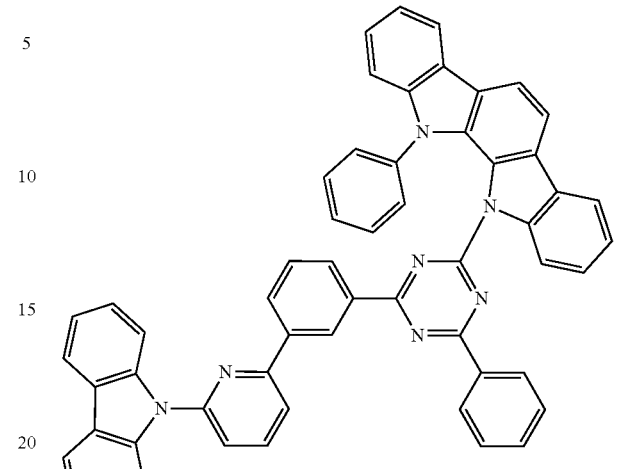
1-129
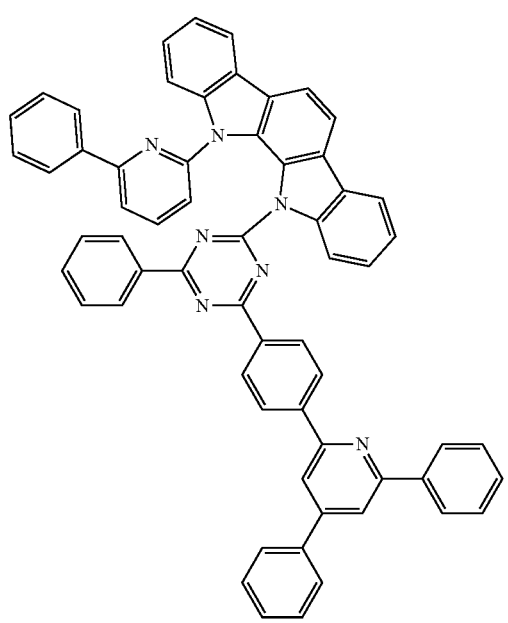
1-131
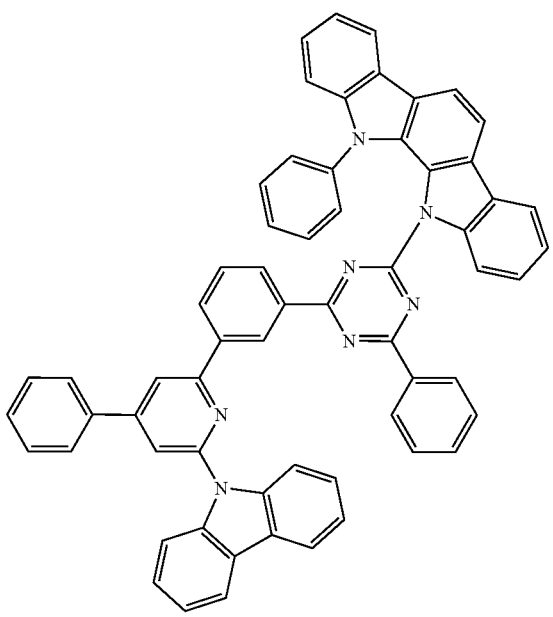

1-132
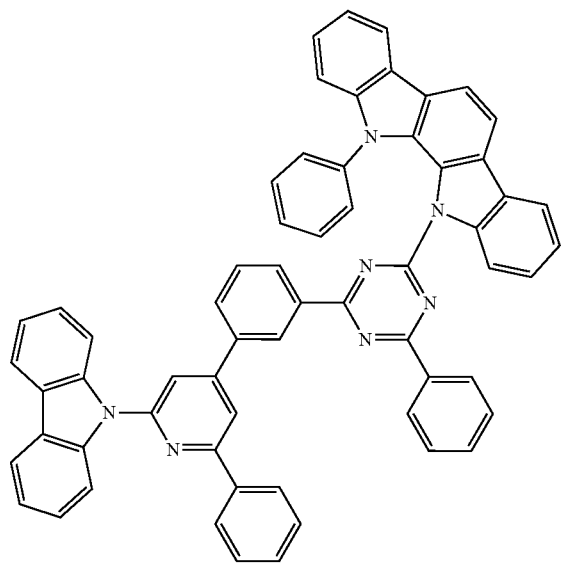
1-134
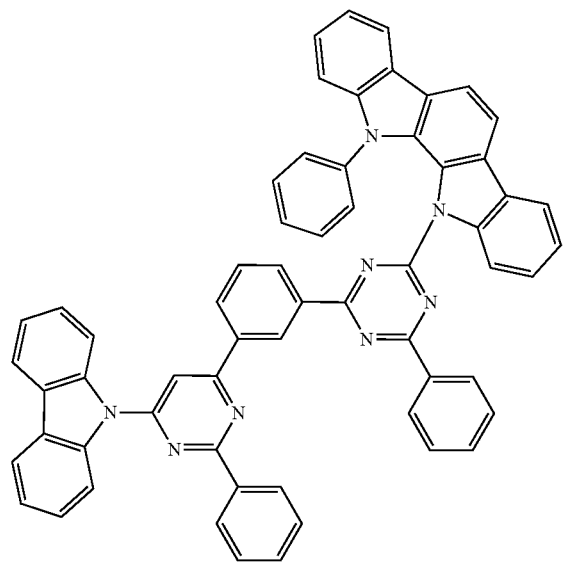
1-133
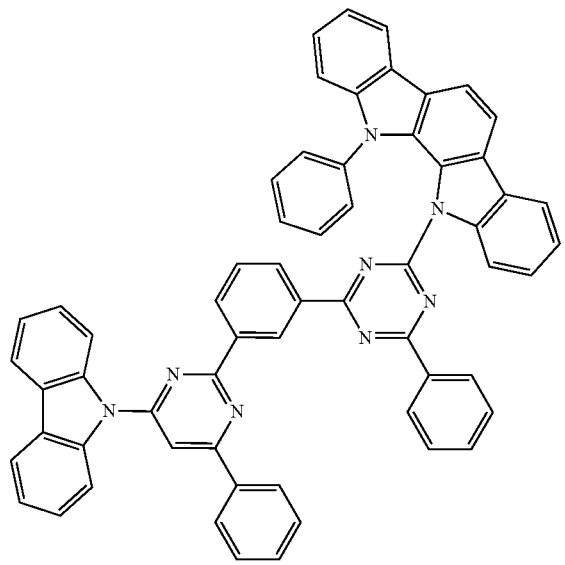
1-135
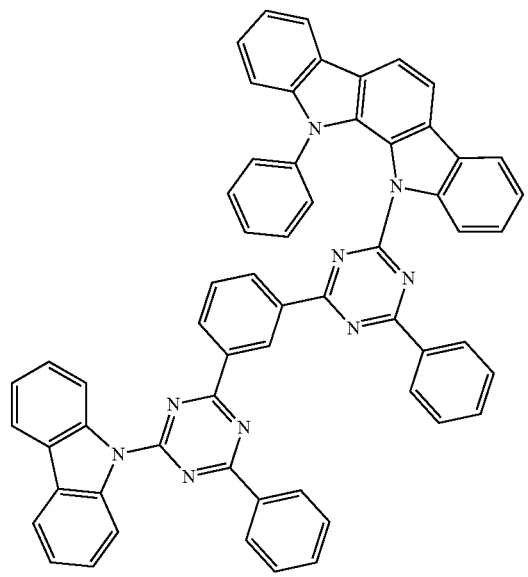

1-137
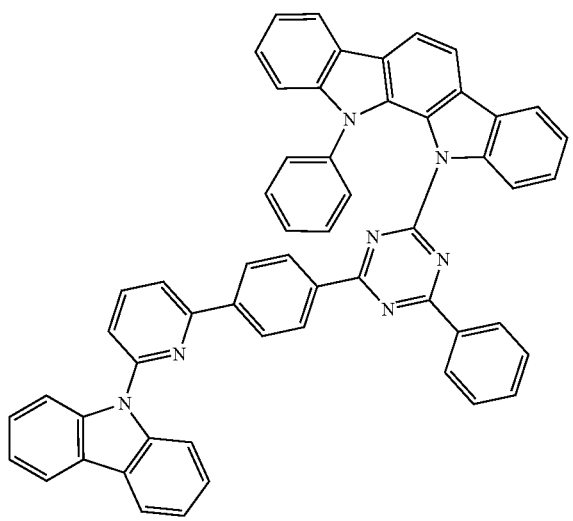
1-138
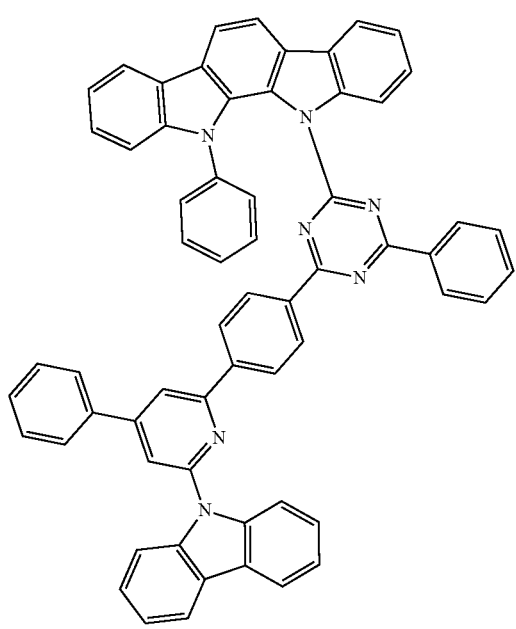
1-139
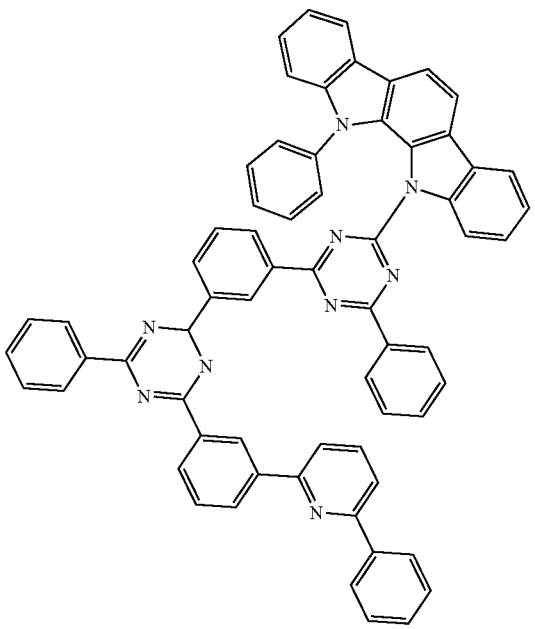
1-140
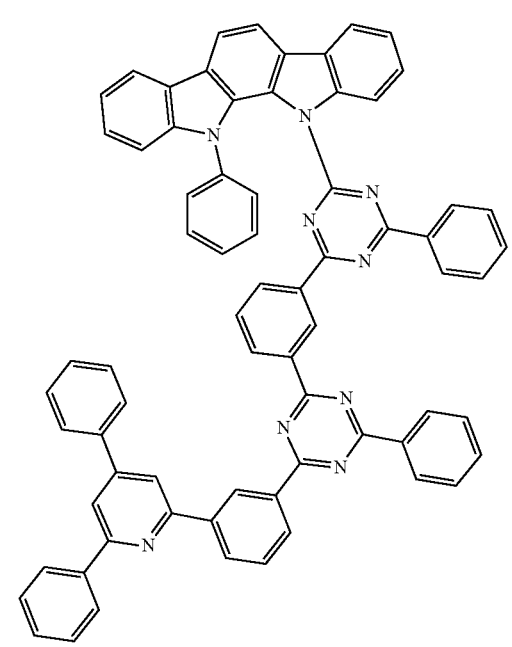

1-141
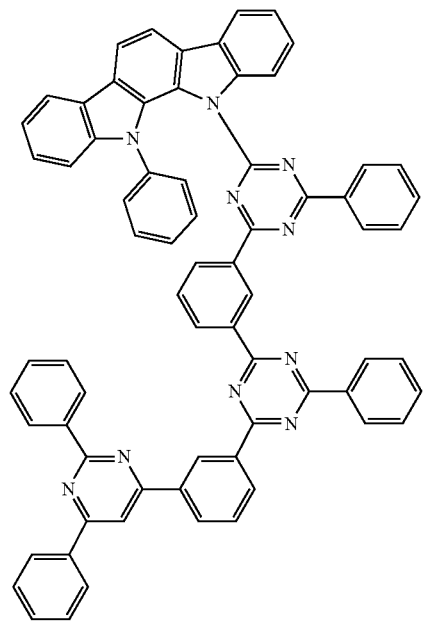
1-142
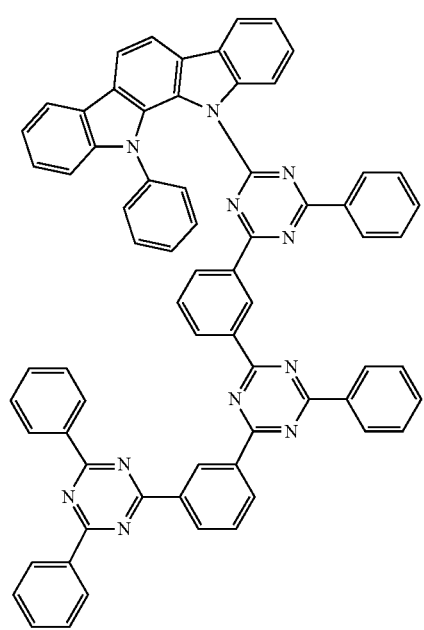
[C13]
1-143
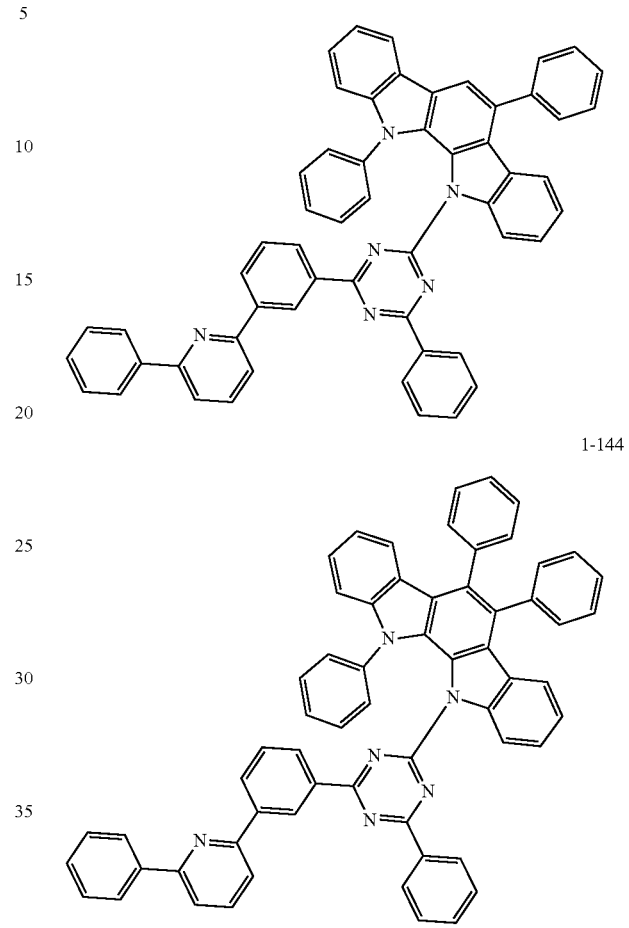
1-144
1-145
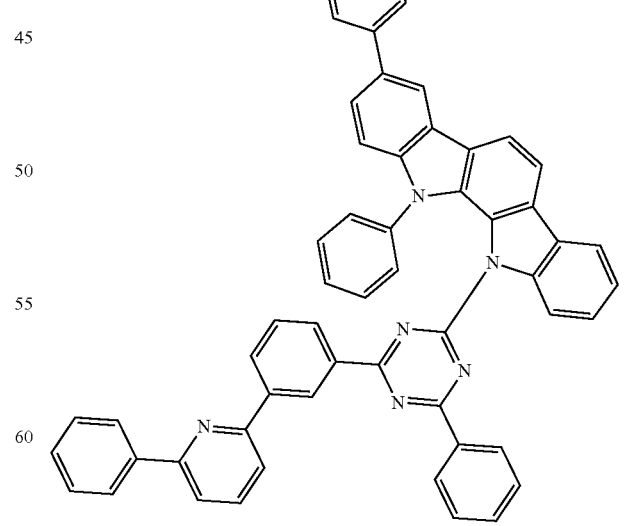

1-146
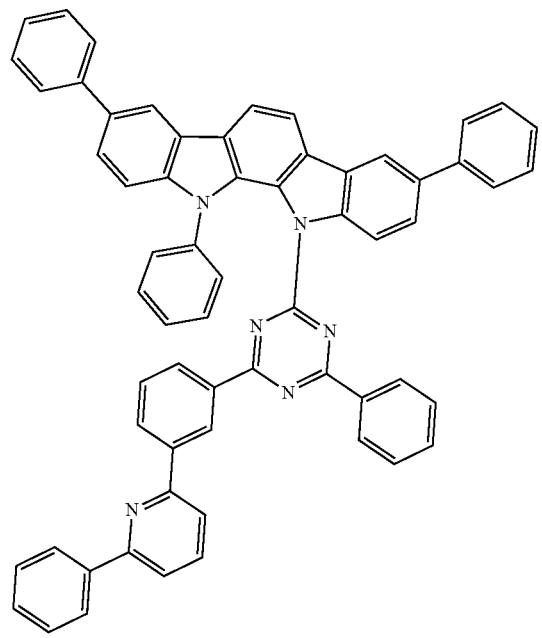
1-147
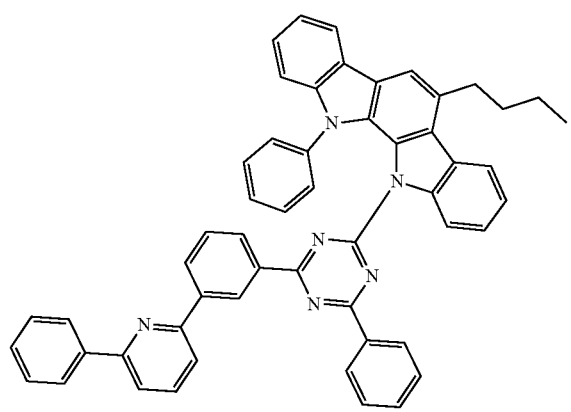
1-148
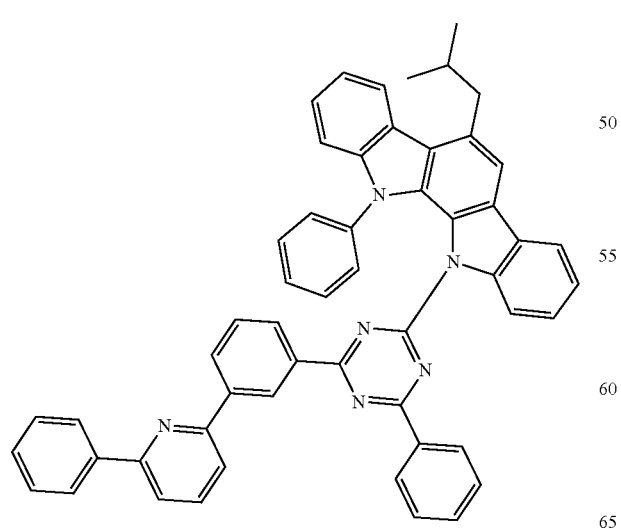
1-149
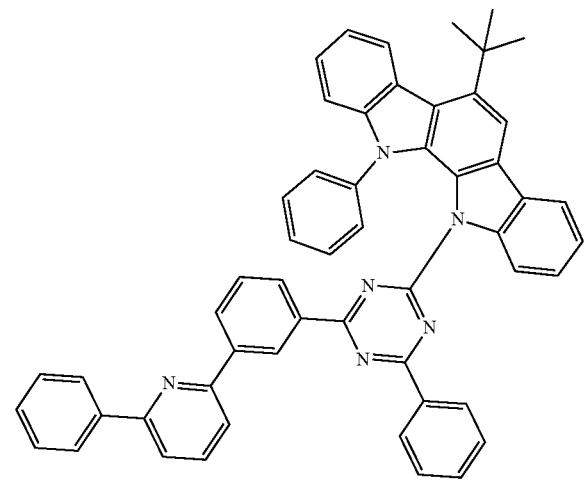
1-150
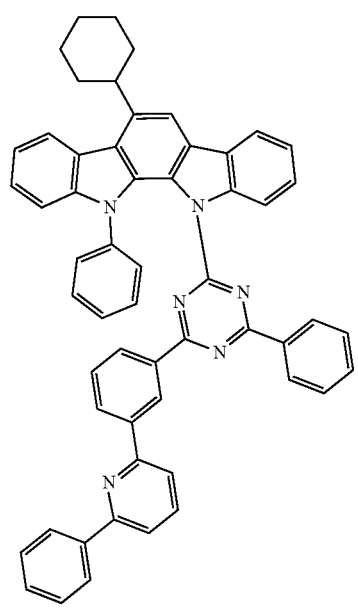
1-151
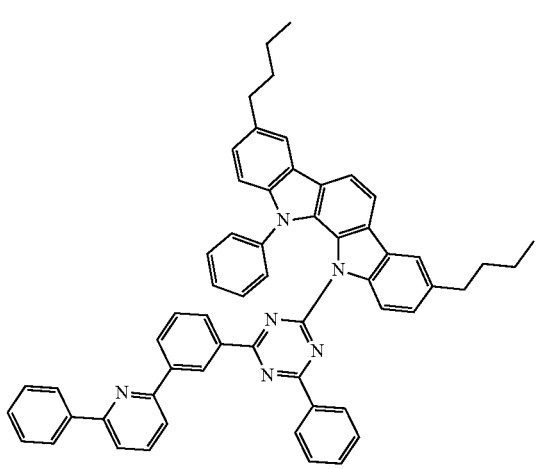

1-152
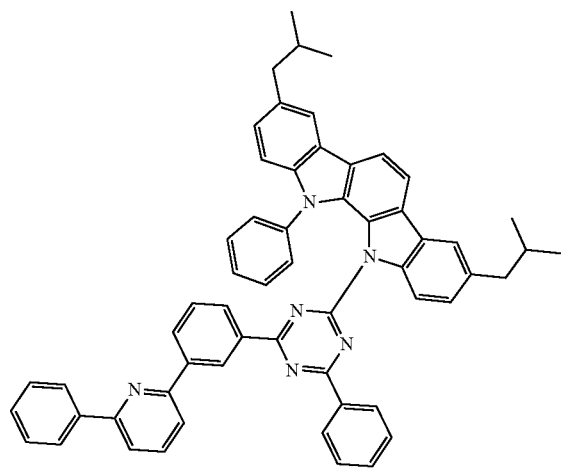
1-153
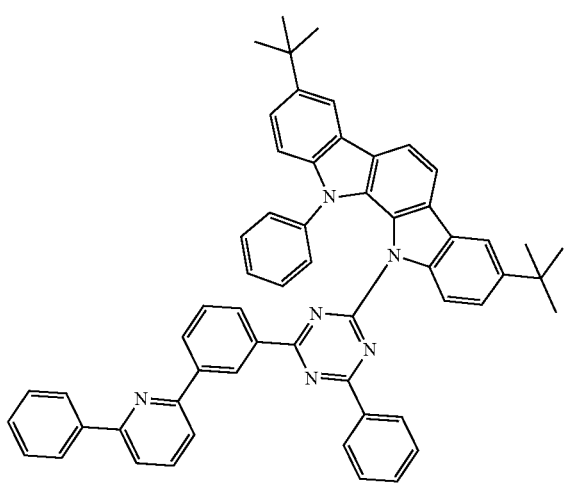
1-154
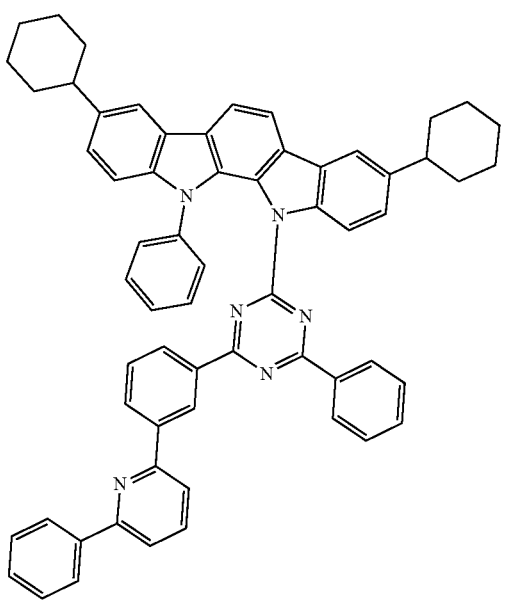
1-155
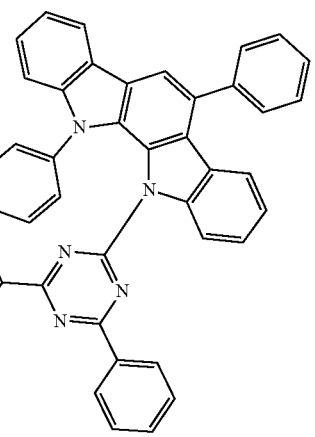
1-156
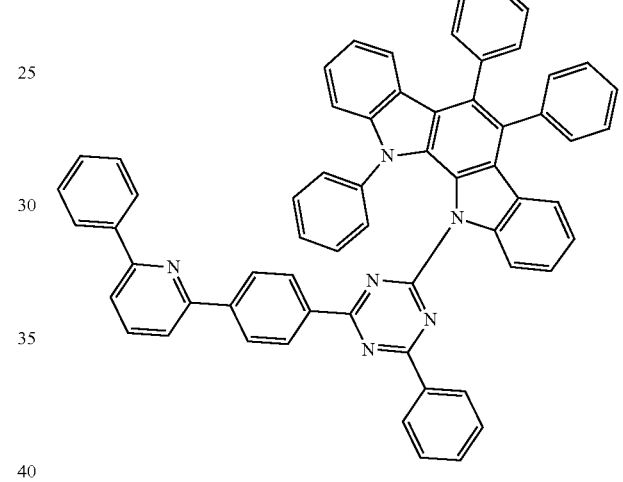
1-157
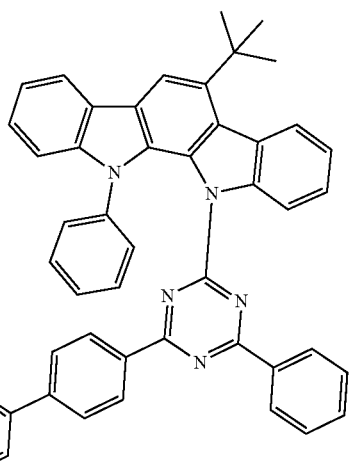

1-158
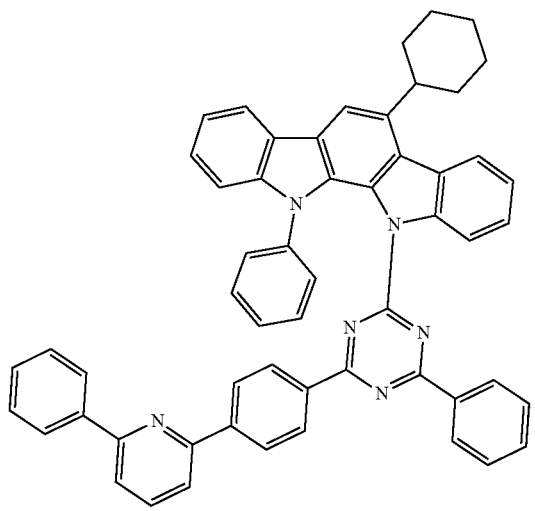
1-159
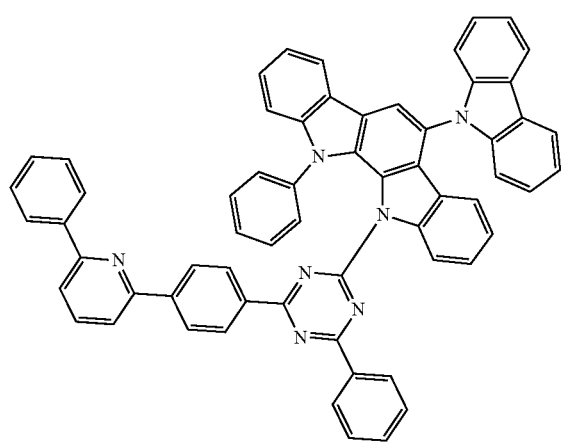
1-160
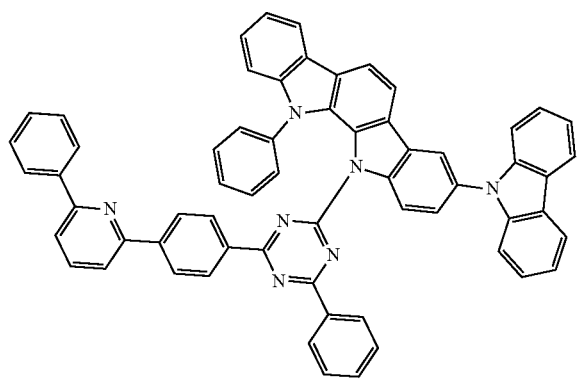
1-161
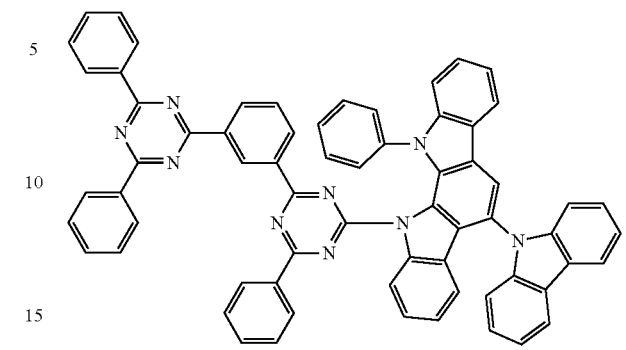
1-162
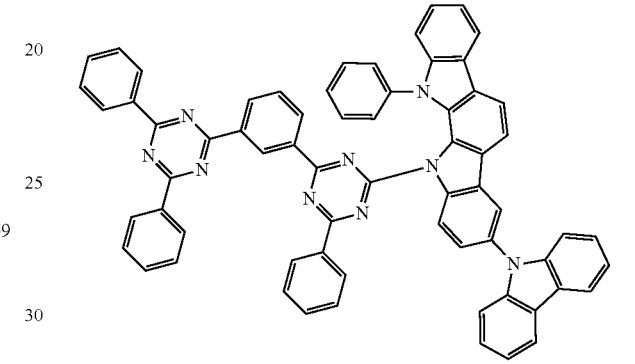
1-163
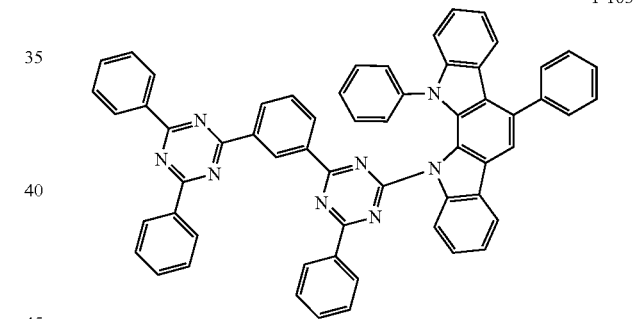
1-164
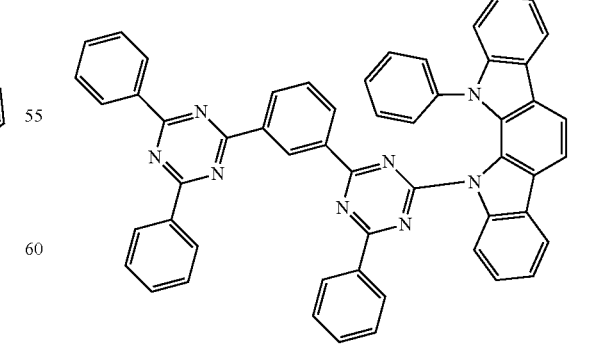

[C14]
1-165
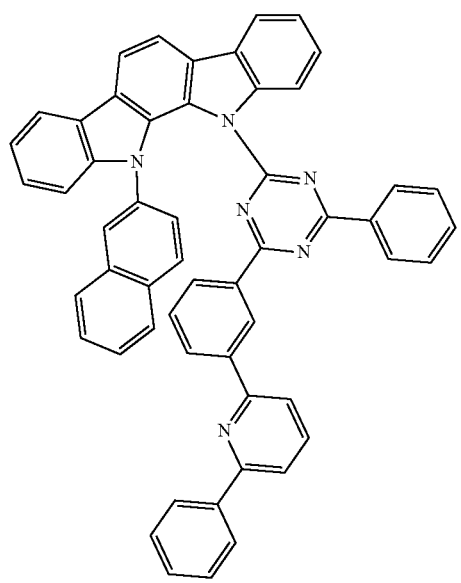
1-166
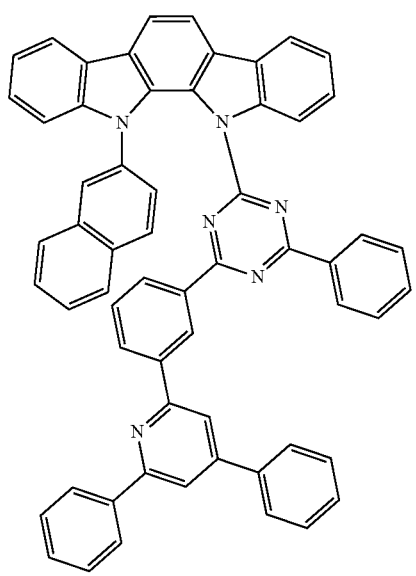
1-167
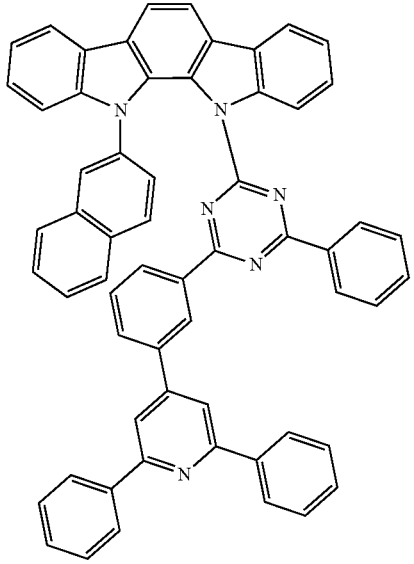
1-168
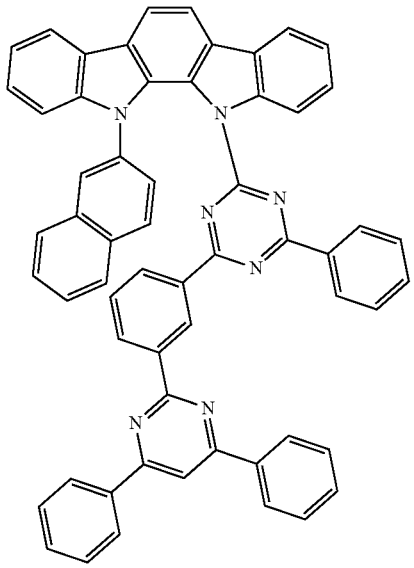
1-169
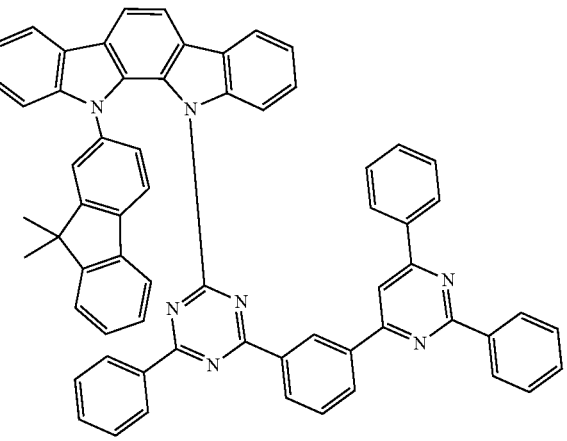

1-170
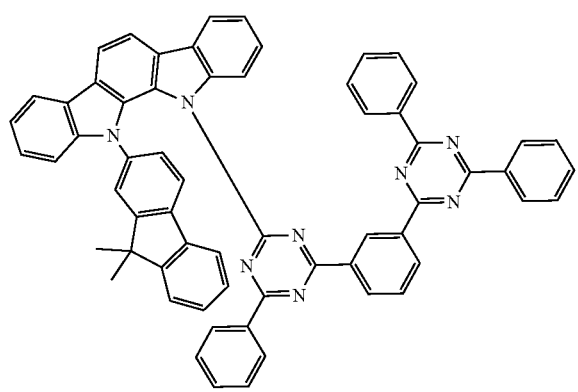
1-173
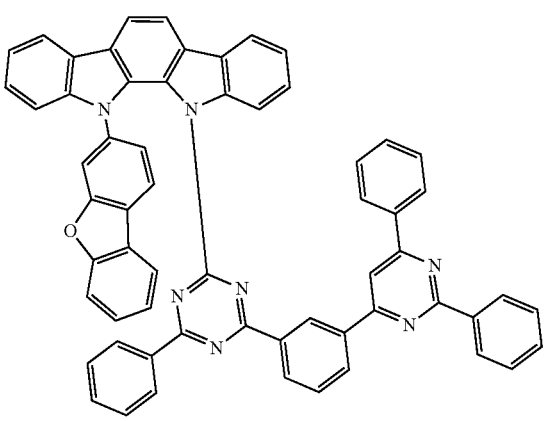
1-171
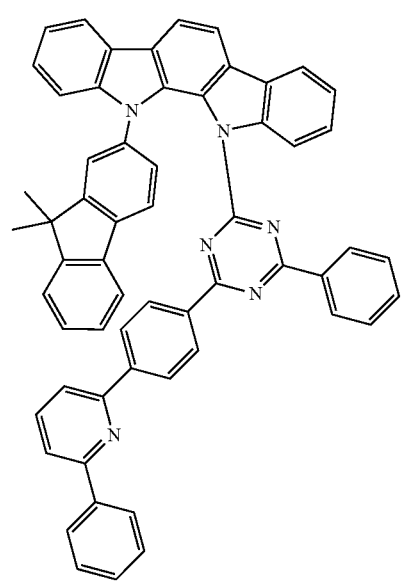
1-174
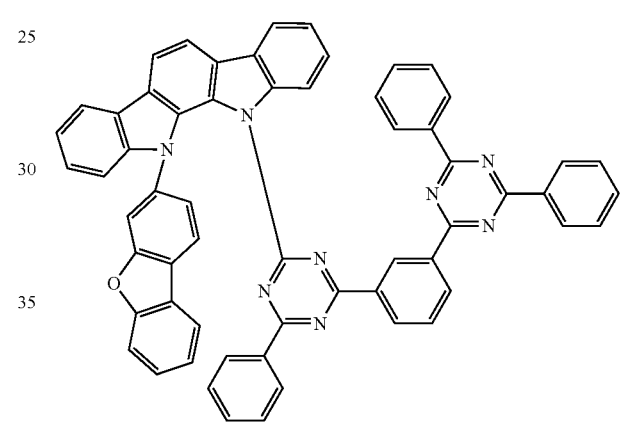
1-172
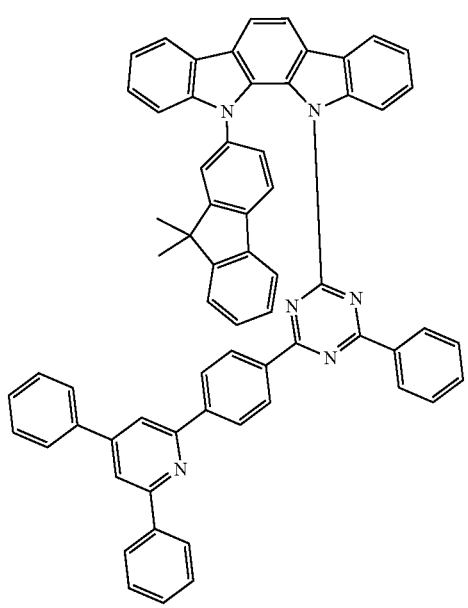
1-175
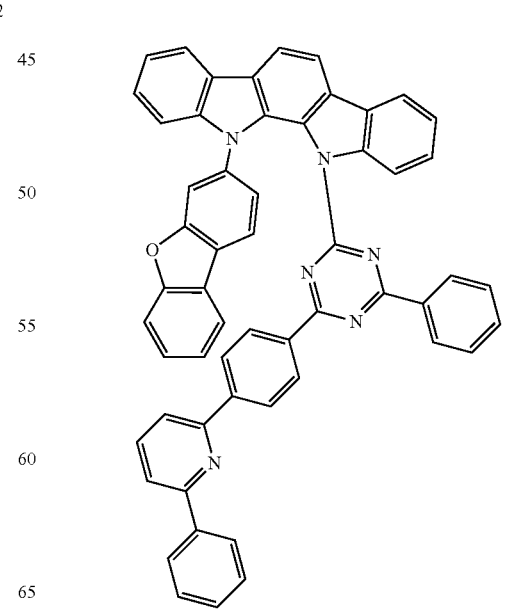

87
-continued
1-176
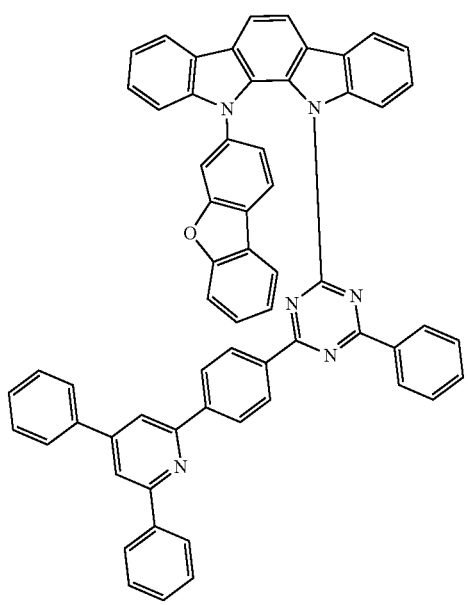
1-173b
88
-continued
1-175b
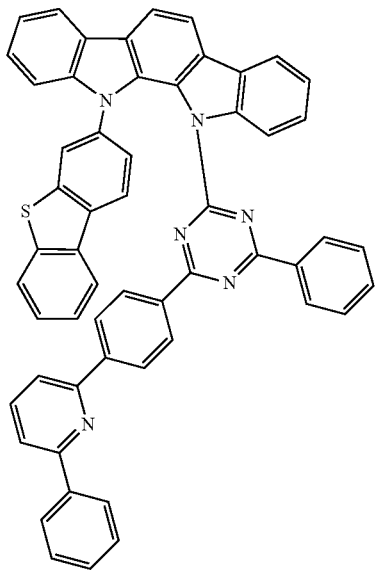
1-176b
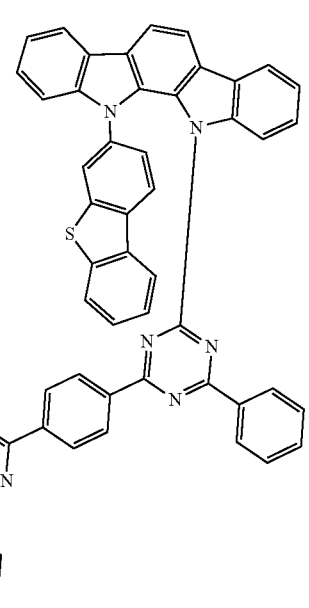
1-174b -continued
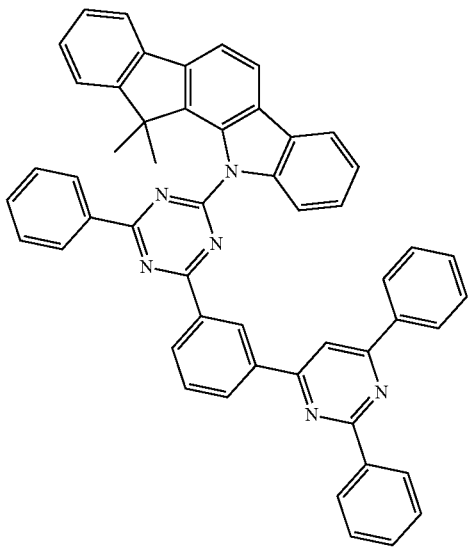
1-177
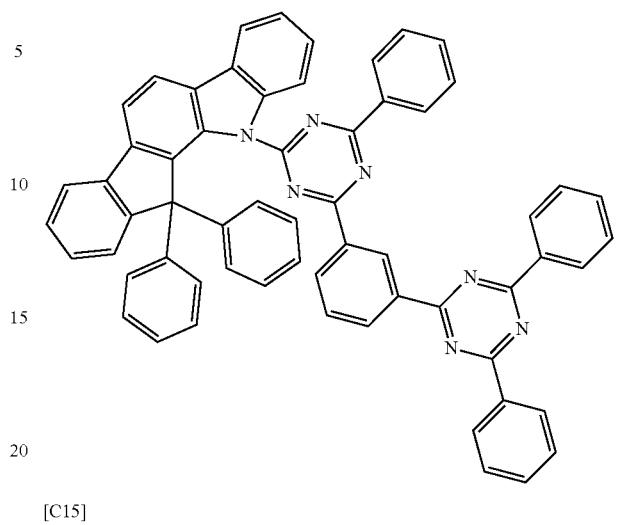
1-180
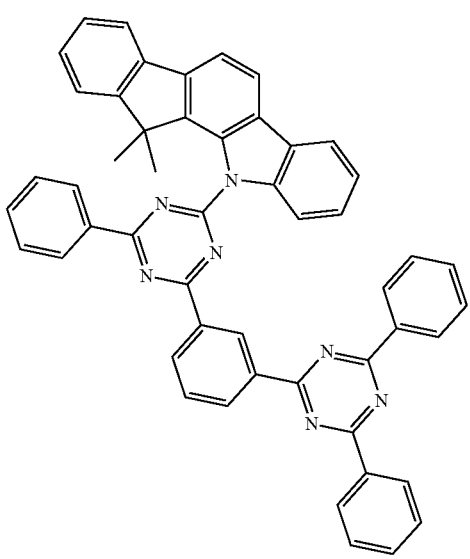
1-178
[C15]
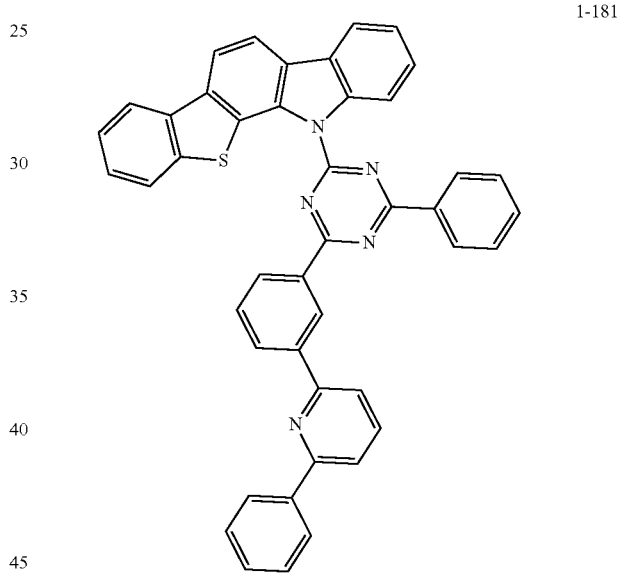
1-181
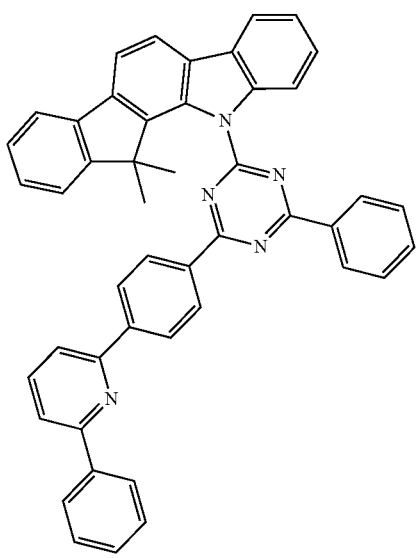
1-179
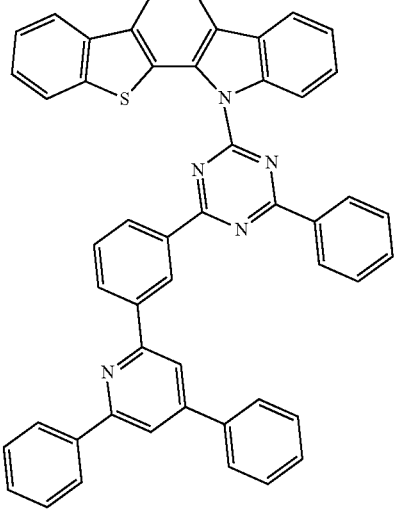
1-182

1-183
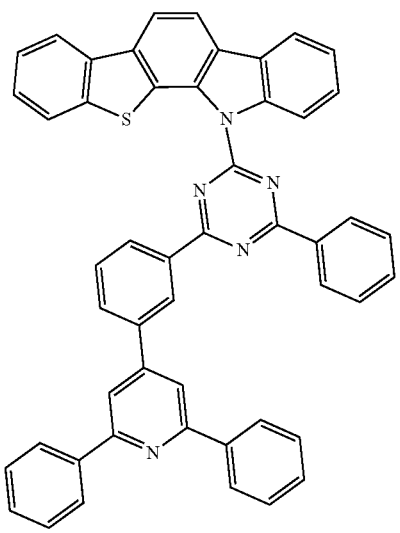
1-184
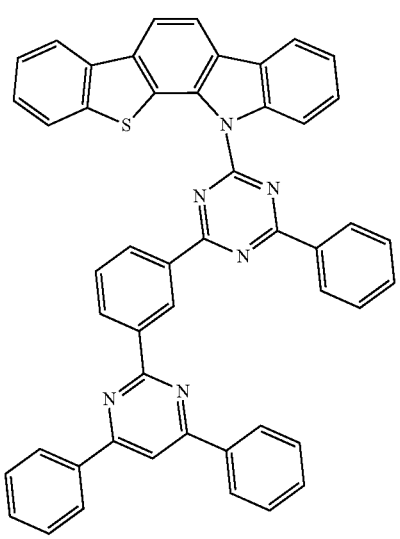
1-185
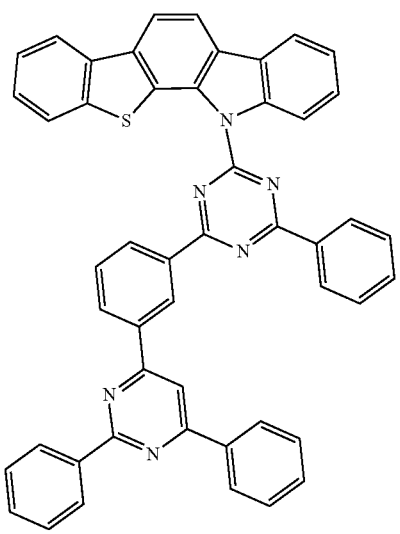
1-186
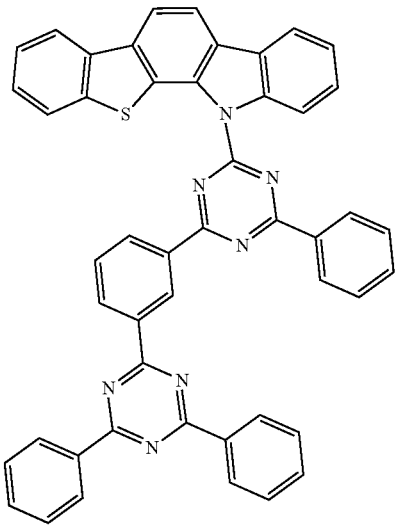
1-187
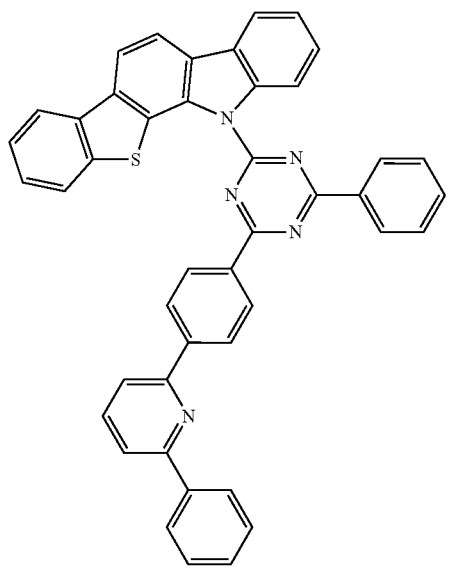
1-188
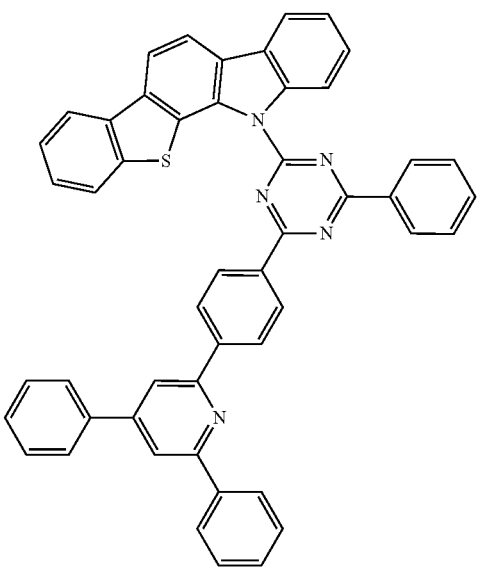

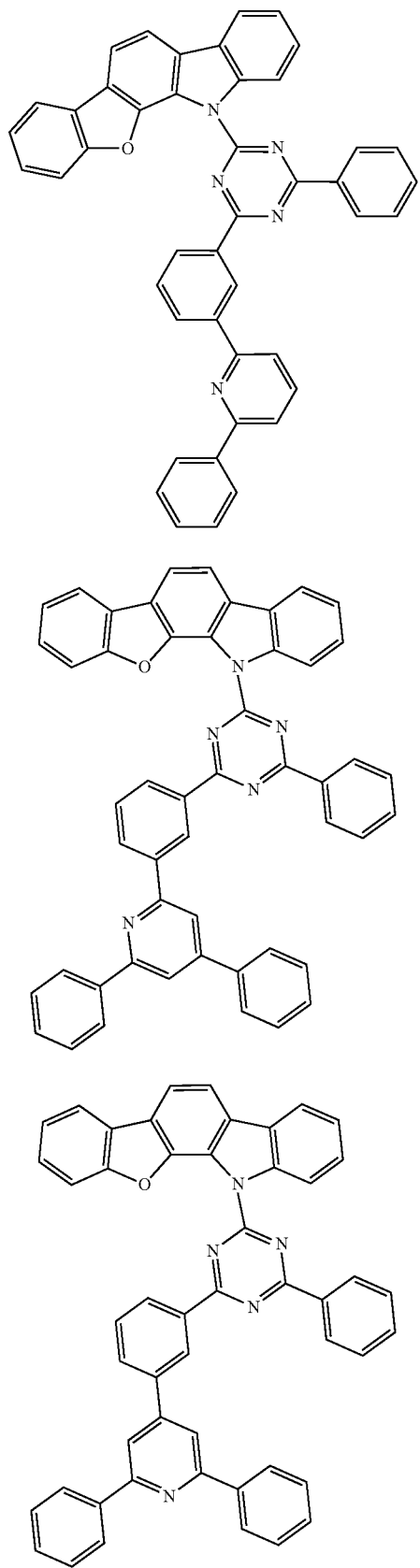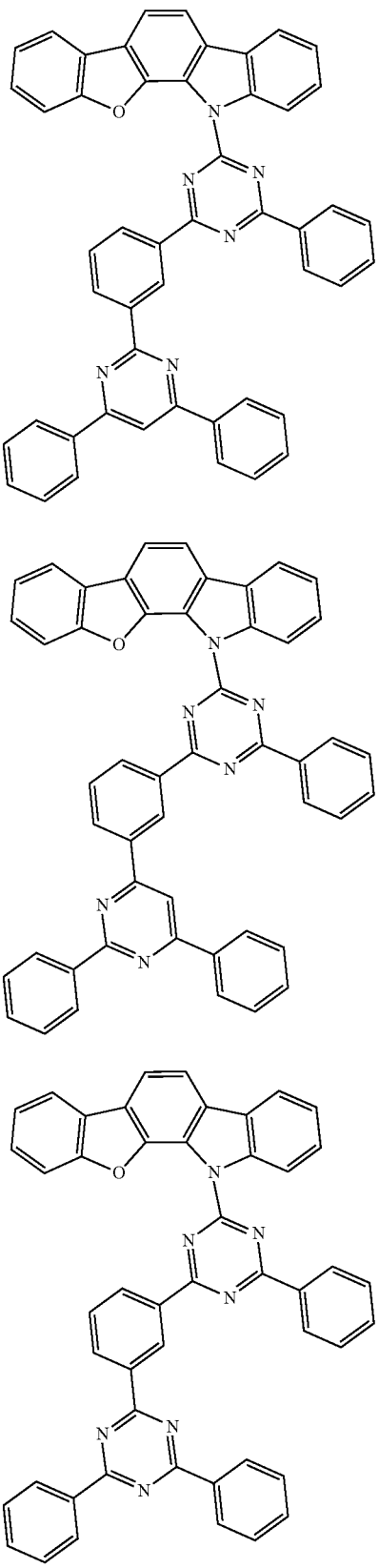

1-196
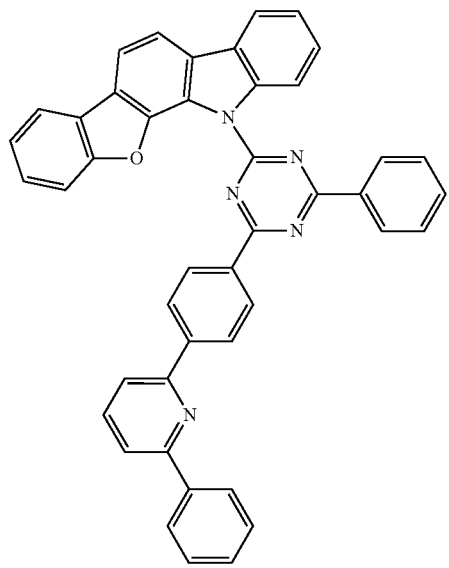
1-198
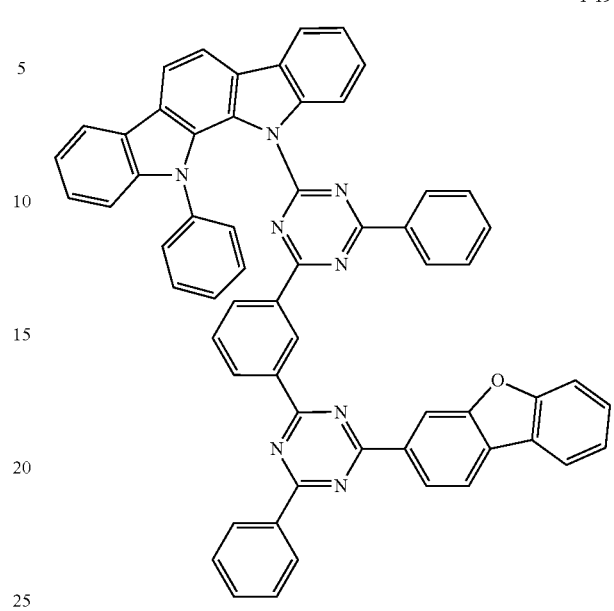
1-197
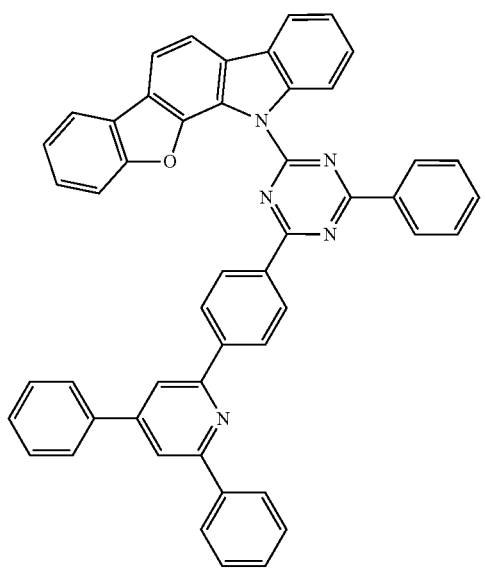
1-199
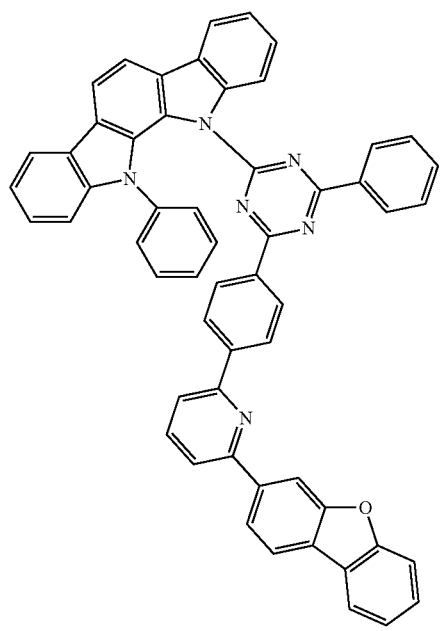

1-200
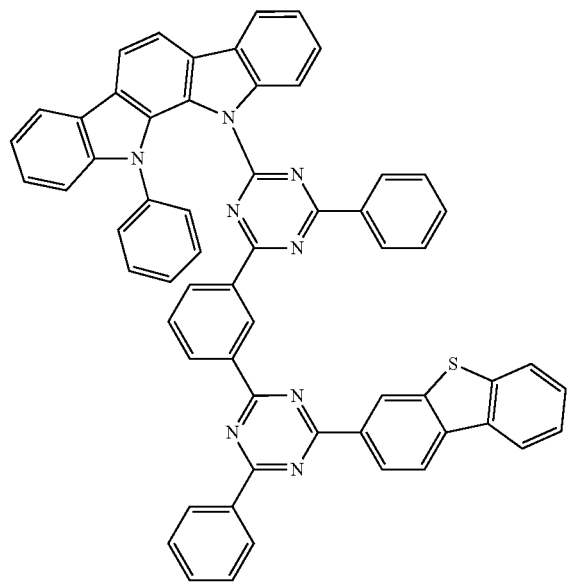
1-201
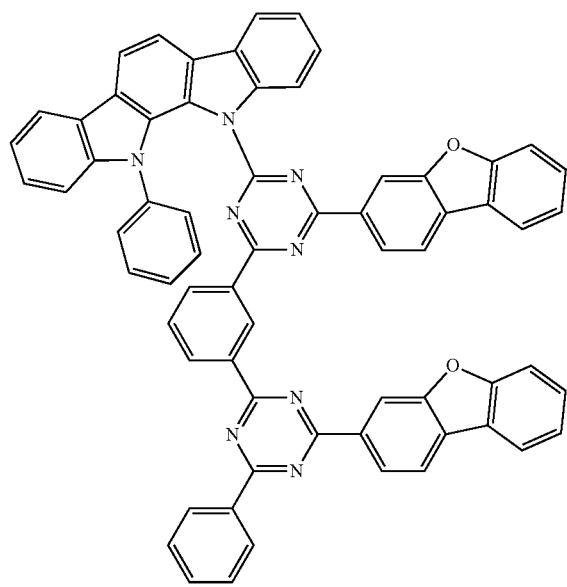
[C16]
1-202
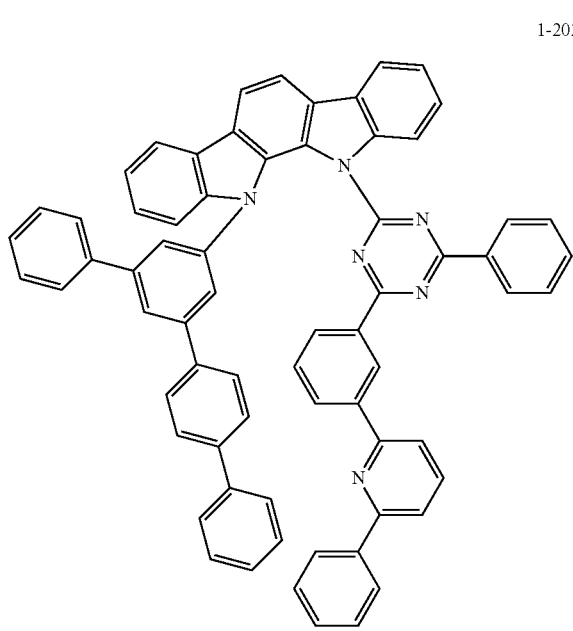
1-203
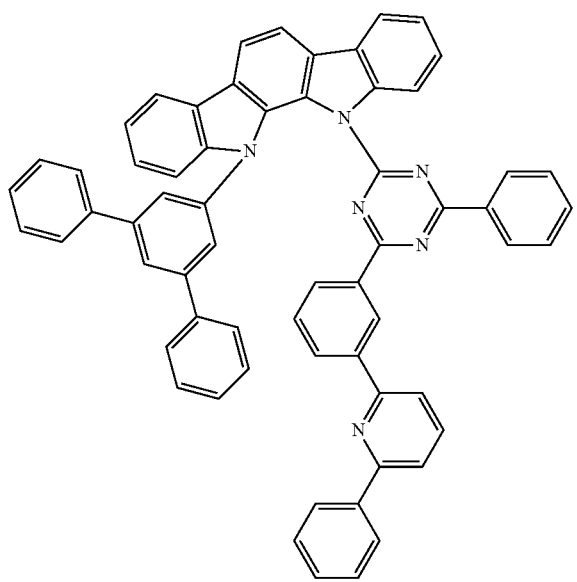

-continued
1-204
1-205
1-206
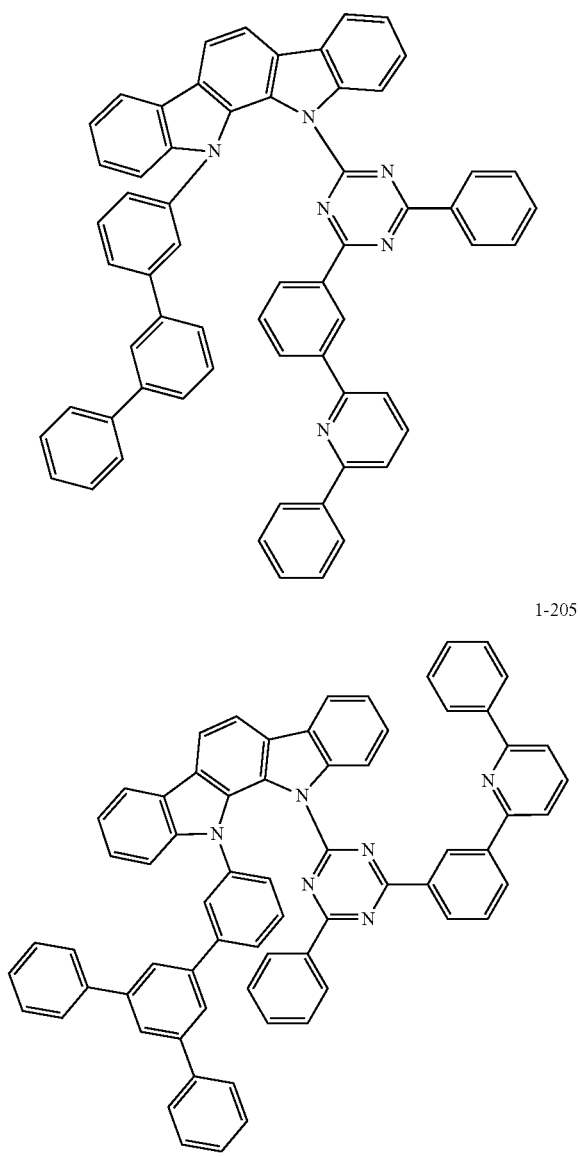
-continued
1-207
1-208
1-209
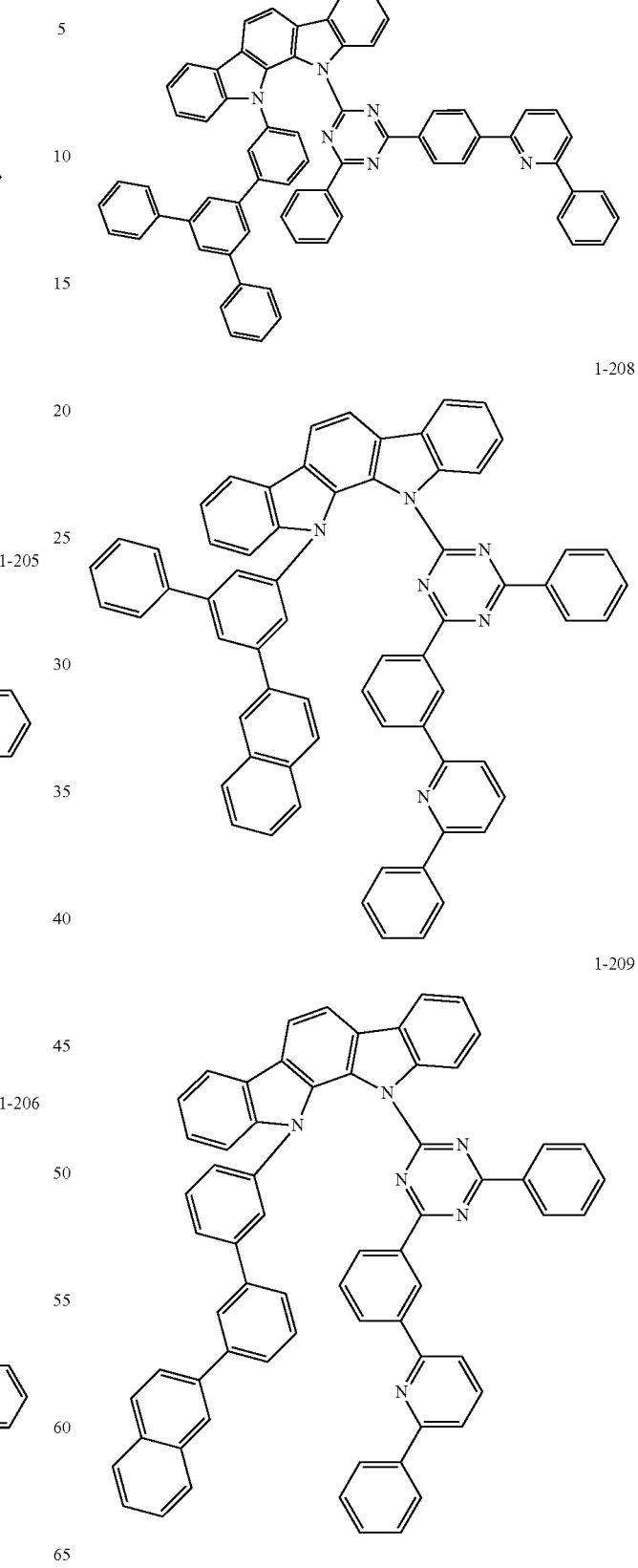

1-210
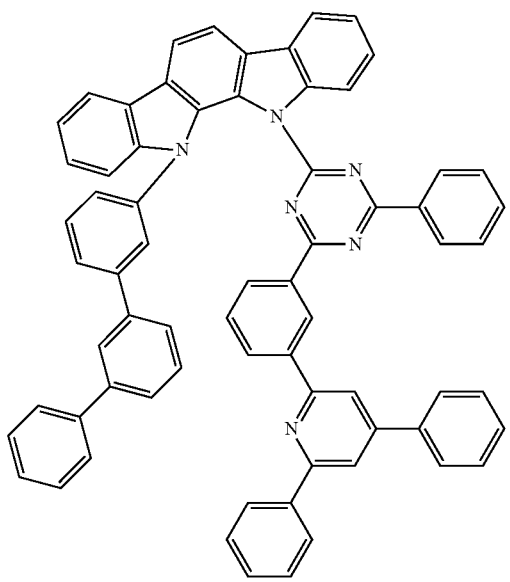
1-211
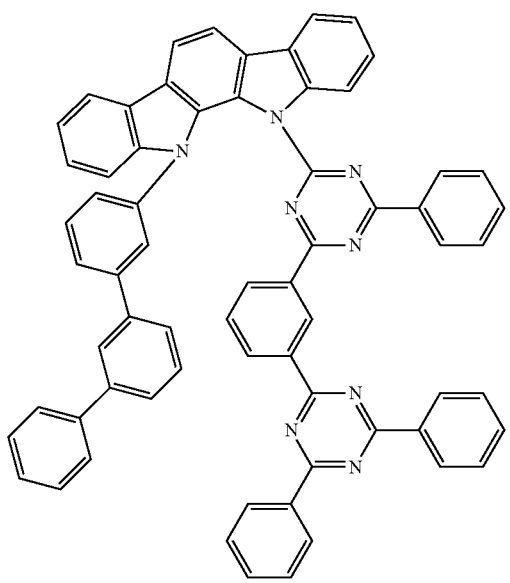
1-212
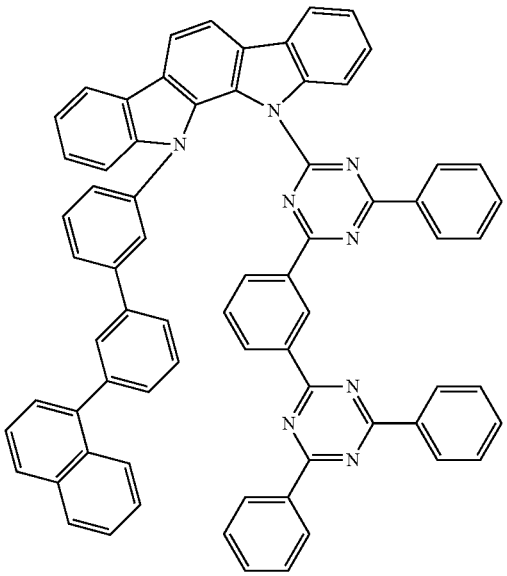
1-213
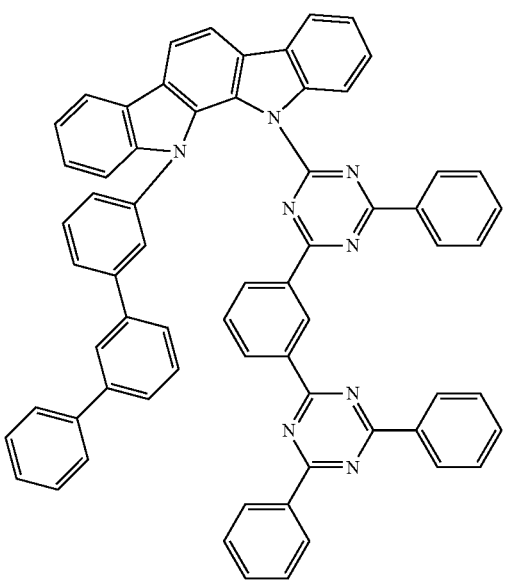
1-214
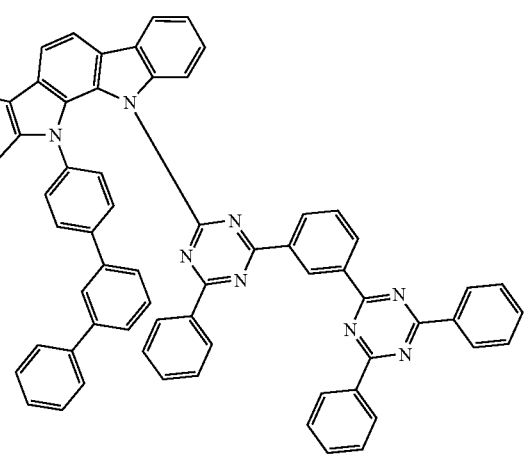

1-215
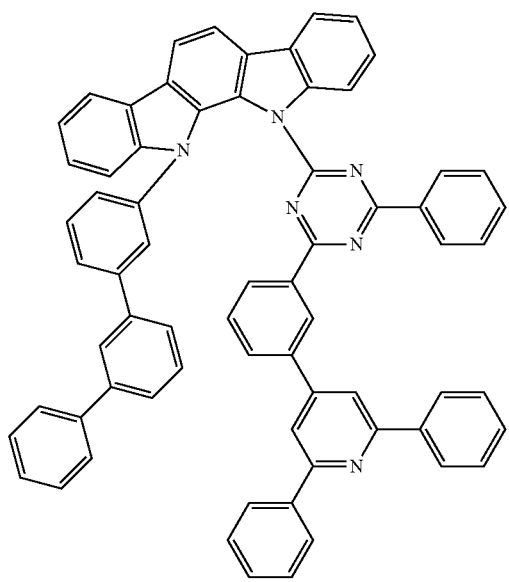
1-216
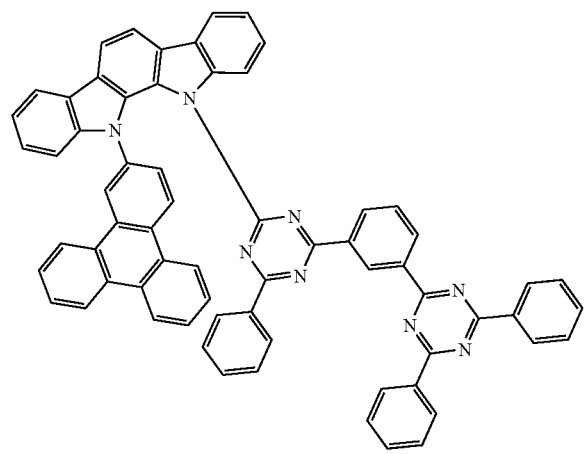
[C17]
1-217
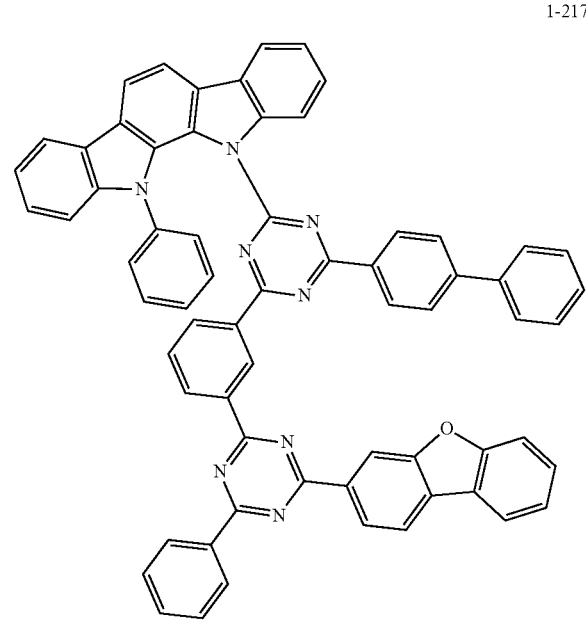
1-218
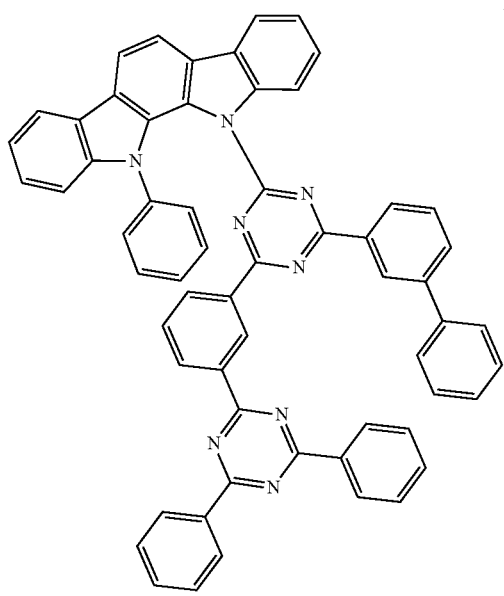

-continued 1-219

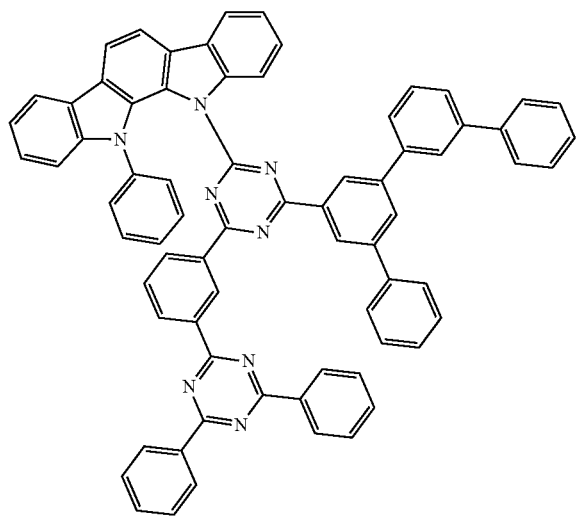

The material for organic electroluminescent devices of the present invention (also referred to as a compound of the present invention, a compound represented by the general formula (1) or an azine compound), is contained in at least one organic layer of an organic electroluminescent device including an anode, a plurality of organic layers and a cathode laminated on a substrate, so that an excellent organic electroluminescent device is provided. As the organic layer in which the material is contained, a light emitting layer, an electron transporting layer or a hole blocking layer is suitable. Here, when used for a light emitting layer, the compound of the present invention can be used as a host material of a light emitting layer containing a fluorescent, delayed fluorescence or phosphorescence emitting dopant, and also as an organic light emitting material that emits fluorescence and delayed fluorescence. It is particularly preferable that the compound of the present invention be contained as a host material of a light emitting layer containing a phosphorescence emitting dopant.

When the compound of the present invention is used as an organic light emitting material that emits fluorescence and delayed fluorescence (also referred to as a thermally activated delayed fluorescence emitting dopant material), it is preferable that another organic compound of which at least one of the excited singlet energy and the excited triple energy is higher than that of the compound of the present invention be used as the host material.

An organic electroluminescent device made from the material for organic electroluminescent devices of the present invention is described as follows.

The organic electroluminescence device of the present invention includes an organic layer having at least one light emitting layer between an anode and a cathode laminated on a substrate, and at least the one organic layer contains the material for organic electroluminescent devices of the present invention. Advantageously, the material for organic electroluminescent devices of the present invention is contained together with a phosphorescence emitting dopant in the light emitting layer.

The structure of the organic electroluminescent device of the present invention is described with reference to drawing, though the structure of the organic electroluminescent device of the present invention is not limited to the one shown in the drawing.

FIG. 1 is a cross-sectional structure view of a general organic electroluminescent device used in the present invention, wherein "1" represents a substrate, "2" represents an anode, "3" represents a hole injecting layer, "4" represents a hole transporting layer, "5" represents a light emitting layer, "6" represents an electron transporting layer, and "7" represents a cathode, respectively. The organic electroluminescent device of the present invention may have an exciton blocking layer adjacent to the light emitting layer, or may have an electron blocking layer between the light emitting layer and the hole injecting layer. The exciton blocking layer can be inserted into any of the anode side or the cathode side of the light emitting layer, or can be inserted into both at the same time. The organic electroluminescent device of the present invention has a substrate, an anode, a light emitting layer, and a cathode as essential layers, and preferably has a hole injecting and transporting layer and an electron injecting and transporting layer as layers other than the essential layers, further having a hole blocking layer between the light emitting layer and the electron injecting and transporting layer. The hole injecting and transporting layer means any one or both of a hole injecting layer and a hole transporting layer, and the electron injecting and transporting layer means any one or both of an electron injecting layer and an electron transporting layer.

An inverted structure of the structure shown in FIG. 1 is possible, in which a cathode 7, an electron transporting layer 6, a light emitting layer 5, a hole transporting layer 4, and an anode 2 are laminated in this order on the substrate 1. In this case also, layers may be added or omitted on an as needed basis.

—Substrate—

The organic electroluminescent device of the present invention is preferably supported by a substrate. The substrate is not particularly limited as long as it is conventionally used for organic electroluminescent devices, and for example, a substrate made of glass, transparent plastic, quartz, or the like may be used.

—Anode—

As the anode in an organic electroluminescent device, a metal having a large work function (4 eV or more), an alloy, an electrically conductive compound or a mixture thereof is preferably used for an electrode material. Specific examples of the electrode material include metals such as Au, conductive transparent materials such as CuI, indium tin oxide (ITO), $SnO_2$, and ZnO. Alternatively, a material such as IDIXO($In_2O_3$—ZnO), which is amorphous and from which a transparent conductive film can be made, may be used. An anode may be produced by forming a thin film through vapor deposition or sputtering of these electrode materials, and then forming a pattern having a desired shape through photolithography. Alternatively, when a precise pattern accuracy is not required (about 100 μm or more), the pattern may be formed through a mask having a desired shape during vapor deposition or sputtering of the electrode material. Alternatively, when an applicable substance such as organic conductive compound is used, a wet film forming method such as printing and coating may also be used. When light emission is taken out from the anode, it is desirable to increase the transmittance to more than 10%, and the sheet resistance as anode is preferably several hundreds Ω/sq or less. Further, the film thickness depends on the material, and is usually selected in the range of 10 to 1000 nm, preferably 10 to 200 nm.

—Cathode—

On the other hand, as the cathode, an electrode material made of metal having a small work function (4 eV or less)

(referred to as an electron injectable metal), an alloy, an electrically conductive compound, or a mixture thereof is used. Specific examples of the electrode material include sodium, sodium-potassium alloy, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, and a rare earth metal. Among these, from the viewpoint of electron injection properties and durability against oxidation or the like, mixtures of an electron injecting metal and a second metal as a stable metal having a larger work function value than the electron injecting metal, for example, a magnesium/silver mixture, a magnesium/aluminum mixture, a magnesium/indium mixture, an aluminum/aluminum oxide ($Al_2O_3$) mixture, and a lithium/aluminum mixture, and aluminum are suitable. The cathode can be produced by forming a thin film of such electrode material by a method such as vapor deposition and sputtering. The sheet resistance of the cathode is preferably several hundreds Ω/sq or less, and the film thickness is usually selected in the range of 10 nm to 5 μm, preferably 50 to 200 nm. In order to transmit the emitted light, it is favorable that any one of the anode and the cathode of the organic electroluminescent device is transparent or translucent for improvement in the emission luminance.

Further, a transparent or translucent cathode can be produced by producing the metal having a film thickness of 1 to 20 nm on the cathode, and then producing the conductive transparent material in the description of the anode thereon. By applying this, a device with both of the anode and the cathode having transparency can be produced.

—Light Emitting Layer—

The light emitting layer is a layer that emits light after excitons are generated by recombination of holes and electrons injected from each of the anode and the cathode, including an organic light emitting material and a host material.

When the light emitting layer is a fluorescence emitting layer, at least one fluorescence emitting material may be used alone as the fluorescence emitting material. However, it is preferable that the light emitting layer include a host material, with use of the fluorescence emitting material as a fluorescence emitting dopant.

As the fluorescence emitting material in the light emitting layer, an azine compound represented by the general formula (1) can be used, or compounds known from many patent literatures and the like also may be selected for use. Examples thereof include benzoxazole derivatives, benzothiazole derivatives, benzoimidazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perinone derivatives, oxadiazole derivatives, oxazine derivatives, aldazine derivatives, cyclopentadiene derivatives, bisstyrylanthracene derivatives, quinacridone derivatives, pyrrolopyridine derivatives, thiadiazolopyridine derivatives, styrylamine derivatives, diketopyrrolopyrrole derivatives, aromatic dimethyridine compounds, metal complexes of 8-quinolinol derivatives, metal complexes of pyrromethene derivatives, rare earth complexes, various metal complexes typified by transition metal complexes, polymer compounds such as polythiophene, polyphenylene and polyphenylene vinylene, and organic silane derivatives. Preferred examples include condensed aromatic compounds, styryl compounds, diketopyrrolopyrrole compounds, oxazine compounds, pyrromethene metal complexes, transition metal complexes and lanthanoid complexes, and more preferred examples include naphthacene, pyrene, chrysene, triphenylene, benzo[c]phenanthrene, benzo[a]anthracene, pentacene, perylene, fluoranthene, acenaphthofluoranthene, dibenzo[a,j]anthracene, dibenzo[a,h]anthracene, benzo[a]naphthacene, hexacene, anthanthrene, naphtho[2,1-f]isoquinoline, α-naphthaphenanthridine, phenanthrooxazole, quinolino[6,5-f]quinoline, and benzothiophanthrene. These may have an alkyl group, an aryl group, an aromatic heterocyclic group, or a diarylamino group as a substituent.

As the fluorescent host material in the light emitting layer, an azine compound represented by the general formula (1) can be used, or compounds known from many patent literatures and the like also may be selected for use. Examples for use include compounds having a condensed aryl ring such as naphthalene, anthracene, phenanthrene, pyrene, chrysene, naphthacene, triphenylene, perylene, fluoranthene, fluorene, and indene and their derivatives, aromatic amine derivatives such as N,N'-dinaphthyl-N,N'-diphenyl-4,4'-diphenyl-1,1'-diamine, tris(8-quinolinate)aluminum(III) and other metal chelated oxynoid compounds, bisstyryl derivatives such as distyrylbenzene derivatives, tetraphenyl butadiene derivatives, indene derivatives, coumarin derivatives, oxadiazole derivatives, pyrrolopyridine derivatives, perinone derivatives, cyclopentadiene derivatives, pyrrolopyrrole derivatives, thiadiazolopyridine derivatives, dibenzofuran derivatives, carbazole derivatives, indolocarbazole derivatives, triazine derivatives, and polymers such as a polyphenylene vinylene derivatives, polyparaphenylene derivatives, polyfluorene derivatives, polyvinylcarbazole derivatives, and polythiophene derivatives, though not particularly limited thereto.

When the fluorescence emitting material used as the fluorescence emitting dopant contains a host material, the amount of the fluorescence emitting dopant contained in the light emitting layer is in the range of 0.01 to 20 wt %, preferably in the range of 0.1 to 10 wt %.

Usually, an organic electroluminescent device injects electric charges into a light emitting substance from both the anode and cathode electrodes to generate a light emitting substance in excited state, so that light emission is caused. In the case of a charge injection type organic electroluminescent device, it is said that 25% of the generated excitons are excited to a singlet excited state, and the remaining 75% are excited to the triplet excited state. As shown in Advanced Materials 2009, 21, 4802-4806, it is known that a specific fluorescence emitting material allows energy transition to a triplet excited state by intersystem crossing or the like, and then undergoes inverse intersystem crossing to a singlet excited state due to triplet-triplet annihilation or heat energy absorption so as to emit fluorescence, exhibiting thermally activated delayed fluorescence. The organic electroluminescent device of the present invention also can exhibit delayed fluorescence. In this case, both fluorescence emission and delayed fluorescence emission can be included. However, a part of the light may be emitted from the host material, or emission may be partially from the host material.

When the light emitting layer is a delayed fluorescence emitting layer, at least one delayed light emitting material may be used alone, though it is preferable to use the delayed light emitting material as delayed fluorescence emitting dopant and include a host material.

As the delayed fluorescence emitting material in the light emitting layer, the azine compound represented by the general formula (1) may be used in the case of having a small energy difference between the singlet level and the triplet level, or alternatively, one selected from known delayed fluorescence emitting materials may be used.

Examples thereof include tin complexes, indolocarbazole derivatives, copper complexes, and carbazole derivatives. Specific examples thereof include compounds described in the following non patent literature and patent literature, though the present invention is not limited to these compounds.

1) Adv. Mater. 2009, 21, 4802-4806, 2) Appl. Phys. Lett. 98, 083302 (2011), 3) Japanese Patent Laid-Open No. 2011-213643, 4) J. Am. Chem. Soc. 2012, 134, 14706-14709.

Specific examples of the delayed light emitting material are shown below, though not limited to the following compounds.

[Chemical Formula 18]

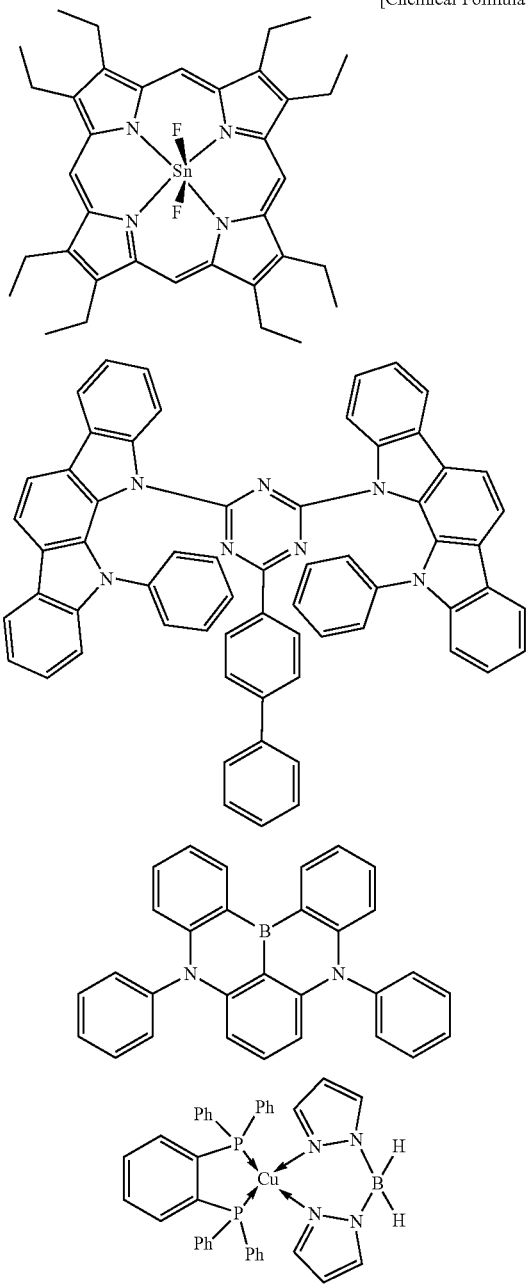

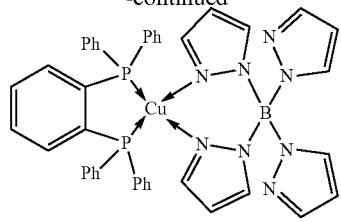

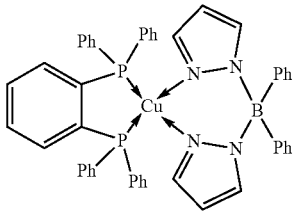

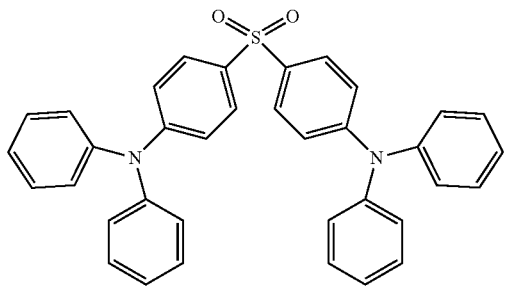

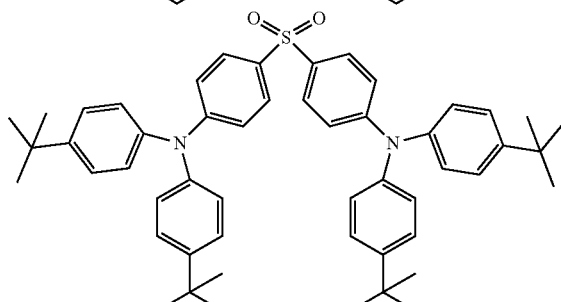

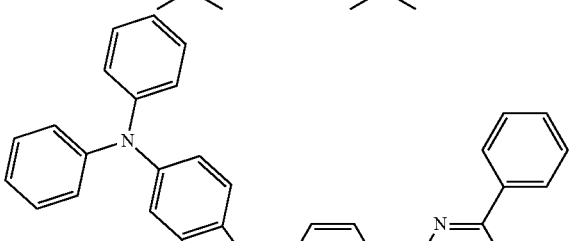

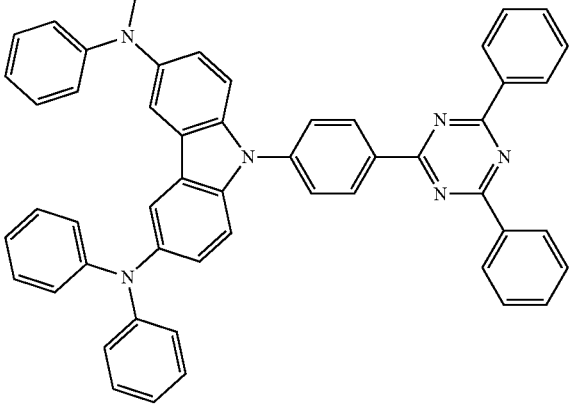

In the case of using the delayed fluorescence emitting material as the delayed fluorescence emitting dopant with a host material included, the amount of the delayed fluorescence emitting dopant contained in the light emitting layer may be in the range of 0.01 to 50 wt %, preferably in the range of 0.1 to 20 wt %, and more preferably in the range of 0.01 to 10%.

As the delayed fluorescence host material in the light emitting layer, an azine compound represented by the general formula (1) may be used, or alternatively another compound also may be selected for use. Examples for use include compounds having a condensed aryl ring such as naphthalene, anthracene, phenanthrene, pyrene, chrysene, naphthacene, triphenylene, perylene, fluoranthene, fluorene, and indene and their derivatives, aromatic amine derivatives such as N,N'-dinaphthyl-N,N'-diphenyl-4,4'-diphenyl-1,1'-diamine, tris(8-quinolinate)aluminum(III) and other metal chelated oxynoid compounds, bisstyryl derivatives such as distyrylbenzene derivatives, tetraphenyl butadiene derivatives, indene derivatives, coumarin derivatives, oxadiazole derivatives, pyrrolopyridine derivatives, perinone derivative, cyclopentadiene derivative, pyrrolopyrrole derivatives, thiadiazolopyridine derivatives, dibenzofuran derivatives, carbazole derivatives, indolocarbazole derivatives, triazine derivatives, and polymers such as a polyphenylene vinylene derivatives, polyparaphenylene derivatives, polyfluorene derivatives, polyvinylcarbazole derivatives, polythiophene derivatives, and arylsilane derivatives, though not limited thereto.

When the light emitting layer is a phosphorescence emitting layer, the light emitting layer contains a phosphorescence emitting dopant and a host material. The phosphorescence emitting dopant material preferably contains an organic metal complex containing at least one metal selected from ruthenium, rhodium, palladium, silver, rhenium, osmium, iridium, platinum and gold.

Preferred examples of the phosphorescence emitting dopant include complexes having a noble metal element such as Ir as central metal such as Ir(ppy)$_3$, complexes such as Ir(bt)$_2$·acac$_3$, and complexes such as PtOEt$_3$. Specific examples of these complexes are shown below, though not limited to the following compounds.

[C19]

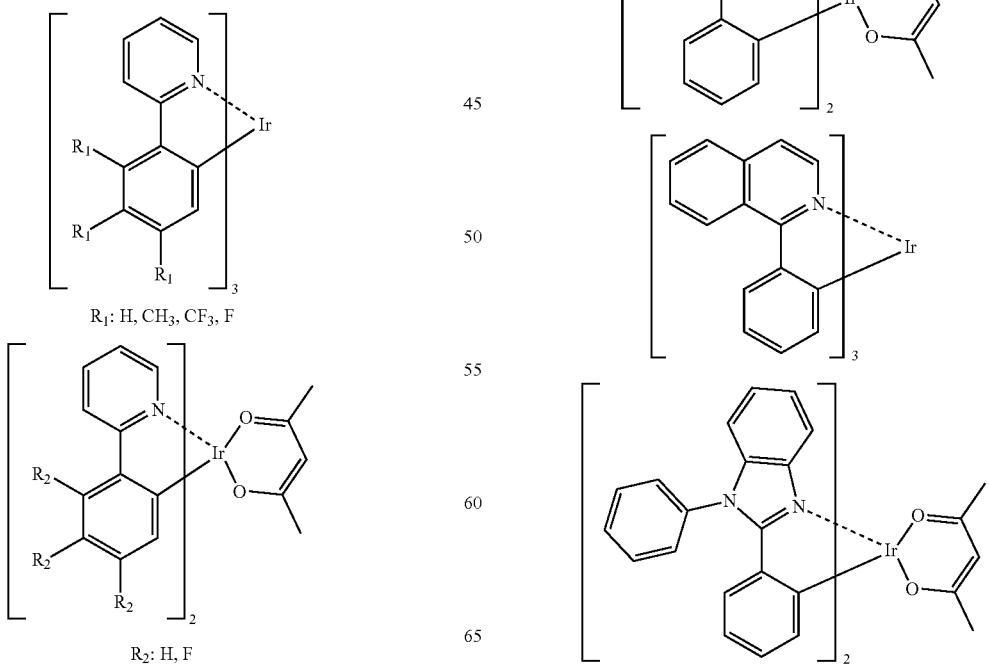

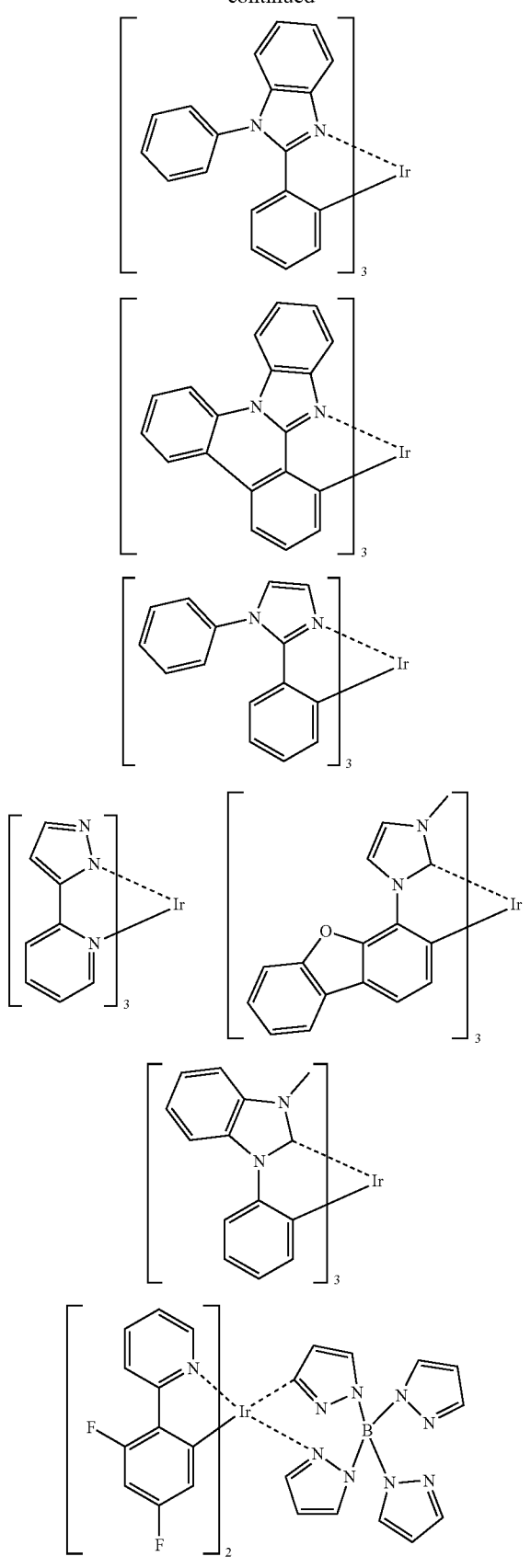
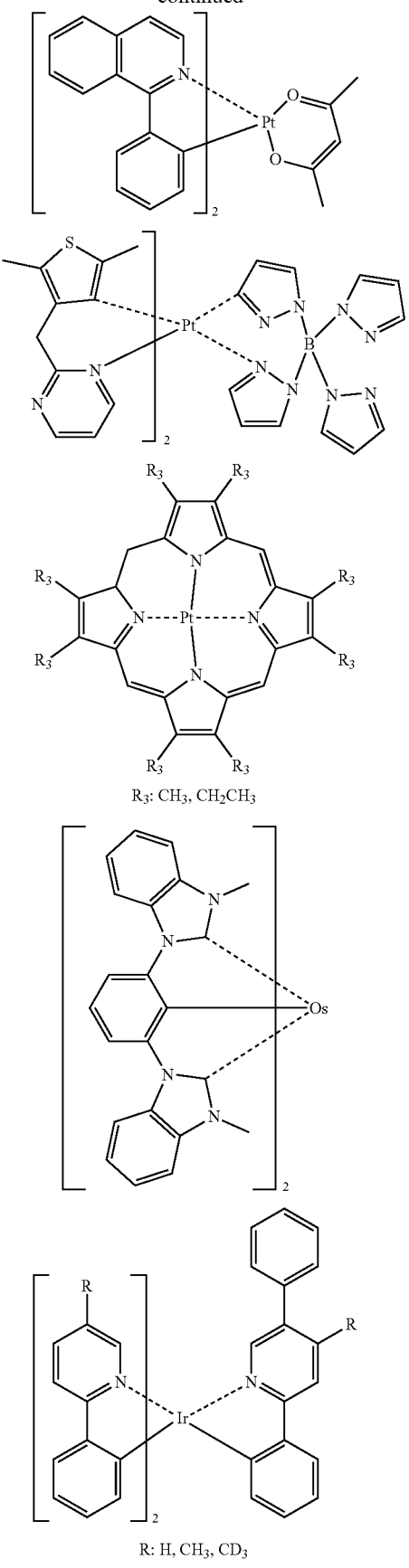

-continued

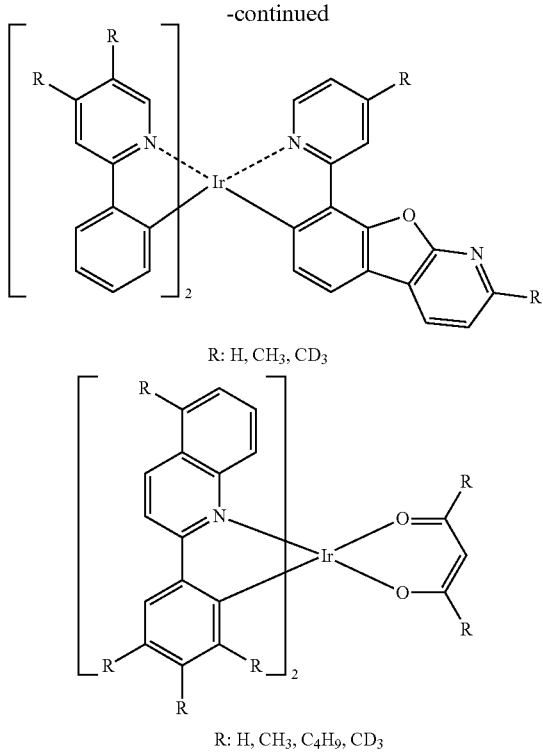

R: H, CH₃, CD₃

R: H, CH₃, C₄H₉, CD₃

The amount of the phosphorescence emitting dopant contained in the light emitting layer is preferably in the range of 2 to 40 wt %, preferably in the range of 5 to 30 wt %.

When the light emitting layer is a phosphorescence emitting layer, it is preferable to use the azine compound of the present invention as the host material in the light emitting layer. However, when the azine compound is used for any organic layer other than the light emitting layer, the material may be another host material. Alternatively, the compound of the present invention may be used in combination with another host material. Further, a plurality of known host materials may be used in combination.

The known host compound is preferably a compound that has hole transporting ability and electron transporting ability, prevents the wavelength of light emission from being lengthened, and has a high glass transition temperature.

The other host material may be selected from those known from a large number of patent literatures and the like. Specific examples of the host material are not particularly limited, and examples thereof include indole derivatives, carbazole derivatives, indolocarbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin-based compounds, anthraquinodimethane derivatives, anthrone derivatives, diphenylquinone derivatives, thiopyrandioxide derivatives, heterocyclic tetracarboxylic acid anhydrides such as naphthalene perylene, phthalocyanine derivatives, metal complexes of 8-quinolinol derivatives and metal phthalocyanine, various metal complexes typified by metal complexes of benzoxazole and benzothiazole derivatives, polymer compounds such as polysilane-based compounds, poly(N-vinylcarbazole) derivatives, aniline-based copolymers, thiophene oligomers, polythiophene derivatives, polyphenylene derivatives, polyphenylene vinylene derivatives, and polyfluorene derivatives.

The light emitting layer may be any of a fluorescence emitting layer, a delayed fluorescence emitting layer, and a phosphorescence emitting layer, and a phosphorescence emitting layer is preferred.

—Injection Layer—

The injection layer is a layer provided between an electrode and an organic layer in order to reduce the drive voltage and improve the emission luminance, including a hole injecting layer and an electron injecting layer, which may be present between the anode and the light emitting layer or the hole transporting layer, and between the cathode and the light emitting layer or the electron transporting layer. The injection layer may be provided on an as needed basis.

—Hole Blocking Layer—

The hole blocking layer has the function of the electron transporting layer in a broad sense, being made of hole blocking material having a function of transporting electrons with significantly small hole transporting ability. The hole blocking layer blocks holes while transporting electrons, so that the recombination probability of electrons and holes can be improved.

It is preferable to use the azine compound of the present invention for the hole blocking layer. However, when it is used for any other organic layer, a known hole blocking layer material may be used. Further, as the hole blocking layer material, an electron transporting layer material described later may be used on an as needed basis.

—Electron Blocking Layer—

The electron blocking layer is made of a material having a function of transporting holes with a significantly small electron transporting ability. The electron blocking layer blocks electrons while transporting holes, so that the recombination probability of electrons and holes can be improved.

As the material of the electron blocking layer, the material of the hole transporting layer described later may be used on an as needed basis. The film thickness of the electron blocking layer is preferably 3 to 100 nm, more preferably 5 to 30 nm.

—Exciton Blocking Layer—

The exciton blocking layer is a layer for preventing excitons generated by the recombination of holes and electrons in the light emitting layer from diffusing into the charge transporting layer. Insertion of the layer enables the excitons to be efficiently confined in the light emitting layer, so that the luminous efficiency of the device can be improved. The exciton blocking layer may be inserted into any one of the anode side and the cathode side adjacent to the light emitting layer, or may be inserted into both at the same time.

As the material of the exciton blocking layer, the material of the hole transporting layer and the material of the electron transporting layer which are described below may be used on an as needed basis. Although an azine compound represented by the general formula (1) also may be used, examples of other materials for use include 1,3-dicarbazolylbenzene(mCP) and bis(2-methyl-8-quinolinolato)-4-phenylphenylatoaluminum (III) (BAlq).

—Hole Transporting Layer—

The hole transporting layer is made of a hole transporting material having a function of transporting holes, being provided as a single layer or a plurality of layers.

The hole transporting material has any of hole injecting or transporting properties and electron barrier properties, and may be any of an organic substance or an inorganic substance. As a known hole transporting material that can be used, any of them may be selected for use. The known hole transporting materials that can be used include triazole derivatives, oxadiazole derivatives, imidazole derivatives, polyarylalkane derivatives, pyrazoline derivatives and pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, and conductive polymer oligomers, especially thiophene oligomers. Use of porphyrin compounds, aromatic tertiary amine compounds or styrylamine compounds is preferred, and use of aromatic tertiary amine compounds is more preferred. Further, an azine compound represented by the general formula (1) may be used as hole transporting material.

—Electron Transporting Layer—

The electron transporting layer is made of a material having a function of transporting electrons, which may be provided with a single layer or a plurality of layers.

The electron transporting material (which may also serve as a hole blocking material) has only to have a function of transmitting electrons injected from the cathode to the light emitting layer. Although the azine compound of the present invention may be used for the electron transporting layer, any of conventionally known compounds may be selected for use. Examples thereof include nitro-substituted fluorene derivatives, diphenylquinone derivatives, thiopyrandioxide derivatives, carbodiimides, fluorenylidenemethane derivatives, anthraquinodimethane and anthrone derivatives, and oxadiazole derivatives. Further, among the oxadiazole derivatives, thiadiazole derivatives with an oxygen atom of the oxadiazole ring replaced with a sulfur atom, and quinoxaline derivatives having a quinoxaline ring known as electron-withdrawing group also may be used as electron transporting material. Further, polymer materials with these materials introduced into a polymer chain, or with these materials as polymer main chain, also may be used. Incidentally, it is preferable that the difference in the electron affinity (EA) between an electron transporting material (including the case of doubling as hole blocking material) and an organic light-emitting dopant material or a host be 0.3 eV.

EXAMPLES

Hereinafter, the present invention will be described in more detail with reference to Examples, though the present invention is not limited to these Examples, and can be performed in various forms within the scope of the invention.

An azine compound for use as material for organic electroluminescent devices was synthesized by the route shown below. The compound number corresponds to the number assigned to the chemical formula described above.

Example 1

A compound 1-6 was synthesized according to the following reaction formula.

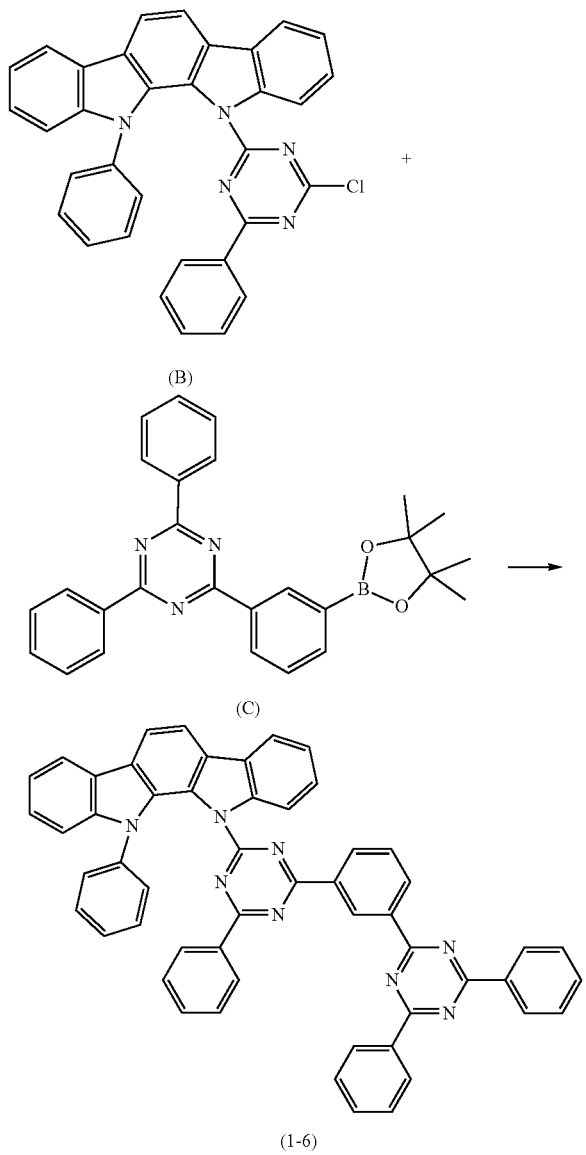

Under a nitrogen atmosphere, 12.0 g (23.0 mmol) of the intermediate (B), 10.0 g (23.0 mmol) of the intermediate (C), 1.33 g (1.15 mmol) of a catalyst A, 15.0 g of cesium carbonate, and 200 mL of DMA were added, and the mixture was stirred for 30 minutes while heating at 130° C. After cooling to room temperature, the reaction solution was added to a mixture solution of methanol (400 ml) and distilled water (400 ml) while stirring, and the resulting precipitated solid was collected by filtration. The resulting solid was purified by silica gel column chromatography and crystallization to obtain 8.1 g (10.2 mmol, yield: 44.1%) of a compound 1-6 (APCI-TOFMS, m/z 796[M+H]$^+$) as a yellow solid.

The catalyst A is tetrakis (triphenylphosphine)palladium (0), and DMA is N,N'-dimethylacetamide.

Example 2

The compound 1-7 was synthesized according to the following reaction formula.

[C21]

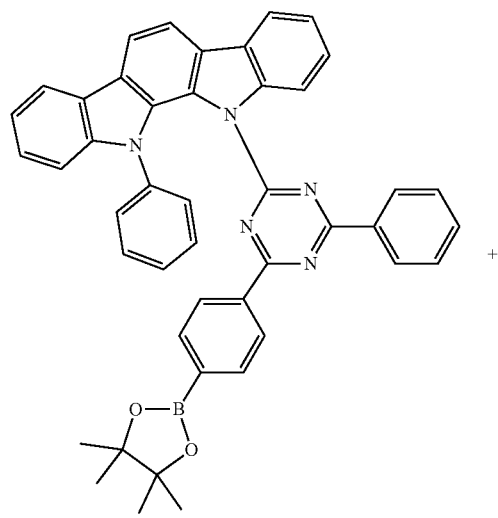

(D)

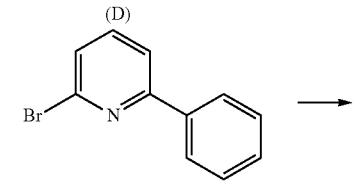

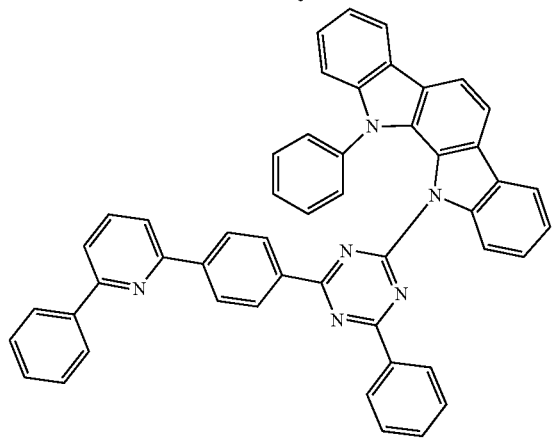

(1-7)

[C22]

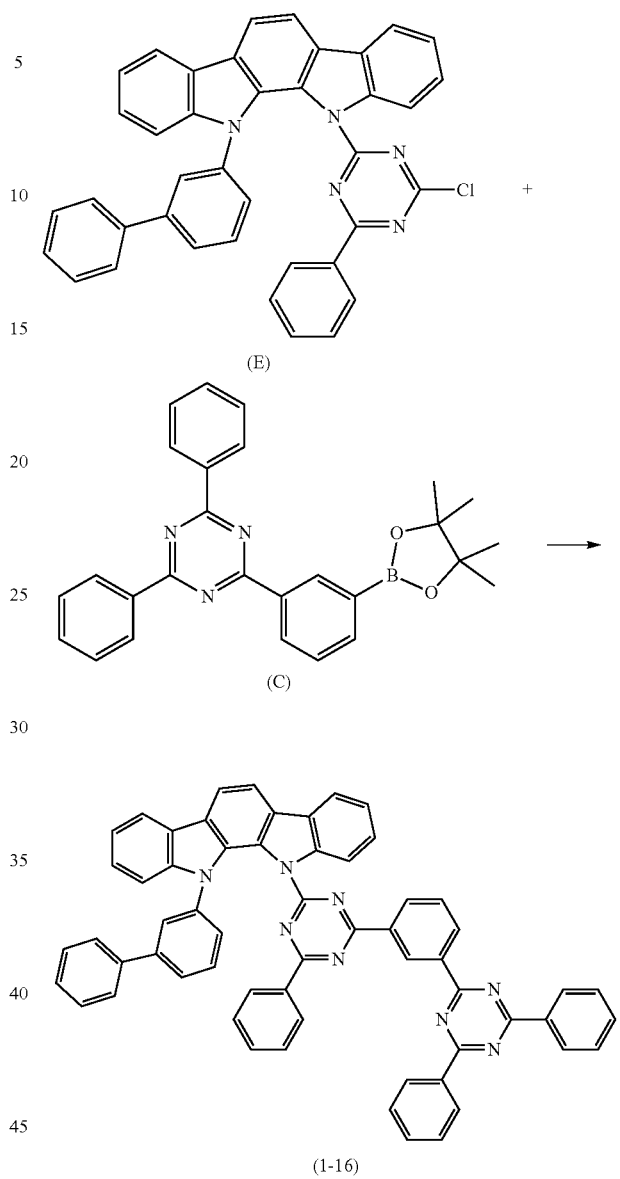

Under a nitrogen atmosphere, 3.1 g (4.5 mmol) of the intermediate (D), 1.15 g (4.95 mmol) of 2-bromo-6-phenylpyridine, 0.26 g (0.22 mmol) of a catalyst A, 2.93 g of cesium carbonate, and 50 ml of 1,4-dioxane were added, and the mixture was stirred for 2 hours while heating at 120° C. After cooling to room temperature, the reaction solution was added to a mixture solution of methanol (150 ml) and distilled water (100 ml) while stirring. The resulting precipitated solid was collected by filtration. The resulting solid was purified in the same manner as in Example 1 to obtain 2.3 g (3.2 mmol, yield: 71.1%) of a compound 1-7 (APCI-TOFMS, m/z 717[M+H]$^+$) as a pale yellow solid.

Example 3

The compound 1-16 was synthesized according to the following reaction formula.

Under a nitrogen atmosphere, 7.0 g (16.1 mmol) of the intermediate (C), 9.6 g (16.1 mmol) of the intermediate (E), 0.47 g (0.40 mmol) of a catalyst A, 10.5 g of cesium carbonate, and 200 ml of DMA were added, and the mixture was stirred over night while heating at 120° C. After cooling to room temperature, the reaction solution was added to a mixture solution of methanol (400 ml) and distilled water (240 ml) while stirring. The resulting precipitated solid was collected by filtration. The resulting solid was purified in the same manner as in Example 1 to obtain 5.7 g (6.55 mmol, yield: 40.7%) of a compound 1-16 (APCI-TOFMS, m/z 871[M+H]$^+$) as a yellow solid.

Example 4

The compound 1-137 was synthesized according to the following reaction formula.

[C23]

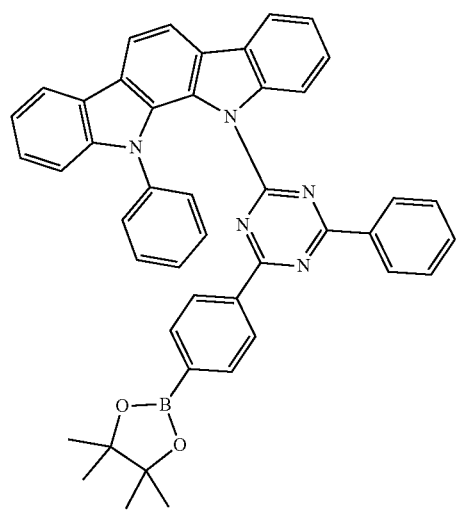

(D)

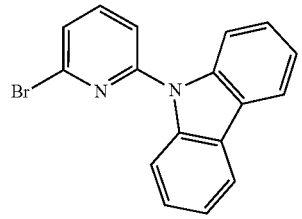

(F)

↓

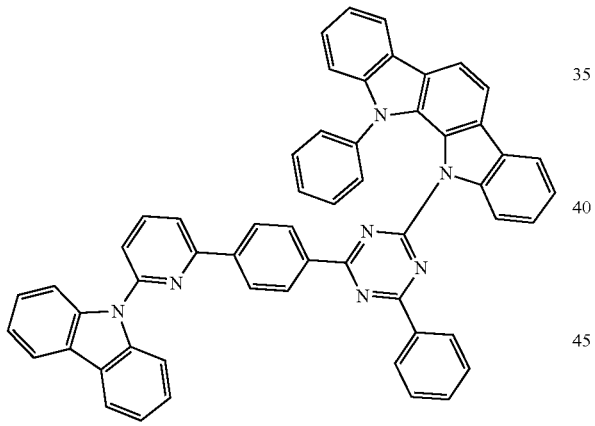

(1-137)

Under a nitrogen atmosphere, 9.0 g (13.0 mmol) of the intermediate (D), 4.0 g (14.3 mmol) of the intermediate (F), 0.75 g (0.65 mmol) of a catalyst A, 8.5 g of cesium carbonate, and 50 ml of DMA were added, and the mixture was stirred for 4 hours while heating at 120° C. After cooling to room temperature, the reaction solution was added to a mixture solution of methanol (400 ml) and distilled water (240 ml) while stirring. The resulting precipitated solid was collected by filtration. The resulting solid was purified in the same manner as in Example 1 to obtain 7.2 g (8.9 mmol, yield: 68.5%) of a compound 1-137 (APCI-TOFMS, m/z 806[M+H]$^+$) as a pale yellow solid.

According to the synthesis examples, compounds 1-1, 1-5, 1-12, 1-27, 1-28 and 1-198 were synthesized in addition to the compounds 1-6, 1-7, 1-16 and 1-137. Further, compounds H-1, H-2, H-3 and H-4 were synthesized for comparison.

[C24]

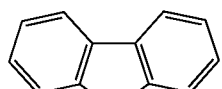

H-1

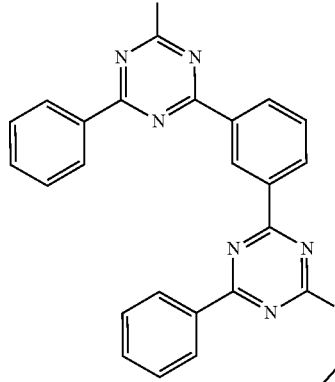

H-2

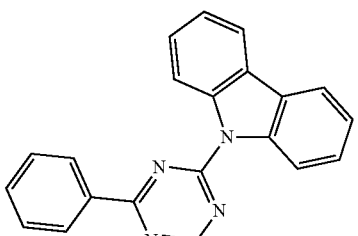

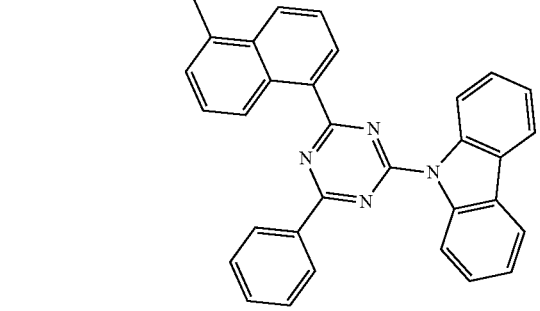

H-3

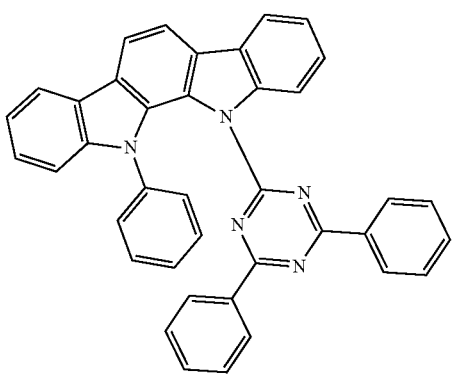

-continued

H-4

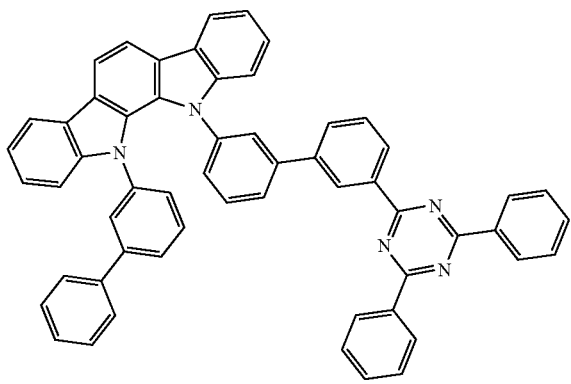

The measured value of the ionization potential (IP) in the present specification is obtained by photoelectron spectroscopy of the thin film of a host material. The measured value of the electron affinity (EA) may be calculated based on the ionization potential value and the energy gap value obtained from the absorption edge of a measured absorption spectrum.

In Table 1, the absolute values of the electron affinity (EA) and ionization potential (IP) of the compounds 1-6, 1-7, 1-16, 1-137, H-1, H-2, H-3 and H-4.

TABLE 1

| Compound | EA (eV) | IP (eV) |
|---|---|---|
| 1-6 | 2.9 | 6.0 |
| 1-7 | 2.9 | 6.0 |
| 1-12 | 3.0 | 6.0 |
| 1-16 | 2.8 | 5.9 |
| 1-137 | 3.0 | 6.0 |
| H-1 | 2.9 | 6.3 |
| H-2 | 3.0 | 6.3 |
| H-3 | 2.7 | 5.9 |
| H-4 | 2.6 | 5.9 |

Example 5

On a glass substrate having an anode made of ITO with a film thickness of 110 nm thereon, each thin film was laminated with a vacuum degree of $4.0 \times 10^{-5}$ Pa by a vacuum vapor deposition method. First, CuPc was formed to a thickness of 25 nm as a hole injecting layer on the ITO, and then NPD was formed to a thickness of 30 nm as a hole transporting layer. Next, HT-1 was formed to a thickness of 10 nm as an electron blocking layer. Next, the compound 1-1 as host material and Ir(ppy)$_3$ as light emitting dopant were co-deposited from different vapor deposition sources to form a light emitting layer to a thickness of 40 nm. At this time, the concentration of Ir(ppy)$_3$ was 10 wt %. Furthermore, H-3 was formed to a thickness of 10 nm as a hole blocking layer. Next, ET-1 was formed to a thickness of 10 nm as an electron transporting layer. Further, LiF was formed to a thickness of 1 nm on the electron transport layer as an electron injecting layer. Finally, Al was formed to a thickness of 70 nm as a cathode on the electron injecting layer to make an organic electroluminescence device.

When an external power source was connected to the obtained organic electroluminescence device to apply a DC voltage, an emission spectrum with a maximum wavelength of 517 nm was observed, so that it has been found that emission from Ir(PPy)$_3$ was obtained.

Examples 6 to 14

An organic electroluminescence device was produced in the same manner as in Example 5, except that compound 1-5, 1-6, 1-7, 1-12, 1-16, 1-27, 1-28, 1-137, or 1-198 was used instead of the compound 1-1 as the host material for the light emitting layer in Example 5. When an external power source was connected to the obtained organic electroluminescence device to apply a DC voltage, an emission spectrum with a maximum wavelength of 517 nm was observed.

Comparative Examples 1 to 2

An organic electroluminescence device was produced in the same manner as in Example 5, except that H-1, or H-3 was used as the host material for the light emitting layer in Example 5. When an external power source was connected to the obtained organic electroluminescence device to apply a DC voltage, an emission spectrum with a maximum wavelength of 517 nm was observed.

The evaluation results of the produced organic electroluminescence devices are shown in Table 2. In the table, the luminance, driving voltage, and luminous efficiency are the values when the drive current is 20 mA/cm$^2$, representing the initial characteristics. LT70 is the time required for the initial luminance to decay to 70%, representing the life characteristics.

TABLE 2

| | Host material compound | Luminance (cd/m$^2$) | Voltage (V) | Power efficiency (lm/W) | LT70 (h) |
|---|---|---|---|---|---|
| Ex. 5 | 1-1 | 11000 | 4.3 | 40.2 | 400 |
| Ex. 6 | 1-5 | 11000 | 4.3 | 40.2 | 300 |
| Ex. 7 | 1-6 | 11000 | 4.0 | 43.2 | 400 |
| Ex. 8 | 1-7 | 9500 | 3.7 | 40.3 | 400 |
| Ex. 9 | 1-12 | 9000 | 3.5 | 40.4 | 300 |
| Ex. 10 | 1-16 | 10000 | 3.9 | 40.3 | 450 |
| Ex. 11 | 1-27 | 10000 | 3.5 | 44.9 | 300 |
| Ex. 12 | 1-28 | 10000 | 3.6 | 43.6 | 300 |
| Ex. 13 | 1-137 | 9500 | 3.7 | 40.3 | 400 |
| Ex. 14 | 1-198 | 11000 | 4.2 | 41.1 | 400 |
| Comparative Ex. 1 | H-1 | 11000 | 5.1 | 33.9 | 200 |
| Comparative Ex. 2 | H-3 | 10000 | 4.6 | 34.1 | 250 |

Example 15

On a glass substrate having an anode made of ITO with a film thickness of 110 nm thereon, each thin film was laminated with a vacuum degree of $4.0 \times 10^{-5}$ Pa by a vacuum vapor deposition method. First, CuPc was formed to a thickness of 25 nm as a hole injecting layer on the ITO, and then NPD was formed to a thickness of 45 nm as a hole transporting layer. Next, HT-1 was formed to a thickness of 10 nm as an electron blocking layer. Then, the compound 1-1 as host material and Ir(piq)$_2$acac as light emitting dopant were co-deposited from different vapor deposition sources to form a light emitting layer to a thickness of 40 nm. At this time, the concentration of Ir(piq)$_2$acac was 6.0 wt %. Furthermore, H-3 was formed to a thickness of 10 nm as a hole blocking layer. Next, ET-1 was formed to a thickness of 27.5 nm as an electron transporting layer. Then, LiF was formed to a thickness of 1 nm on the electron transporting layer as an electron injecting layer. Finally, Al was formed to a thickness of 70 nm as a cathode on the electron injecting layer to make an organic electroluminescence device. When an external power source was connected to the obtained organic electroluminescence device to apply a DC voltage, an emission spectrum with a maximum wavelength of 620 nm was observed, so that it has been found that emission from Ir(piq)$_2$acac was obtained.

Examples 16 to 24

An organic electroluminescence device was produced in the same manner as in Example 5, except that compound 1-5, 1-6, 1-7, 1-12, 1-16, 1-27, 1-28, 1-137, or 1-198 was used instead of the compound 1-1 as the host material for the light emitting layer in Example 15. When a direct voltage was applied to the resulting organic EL device, a light emitting spectrum having a maximum wavelength of 620 nm was observed.

Comparative Examples 3 to 5

An organic EL device was produced in the same manner as in Example 5, except that H-1, H-2 or H-3 was used as the host material of the light emitting layer in Example 15. When a direct voltage was applied to the resulting organic EL device, a light emitting spectrum having a maximum wavelength of 620 nm was observed.

The evaluation results of the produced organic EL device are shown in Table 3. The evaluation conditions are the same as in Examples 5 to 14, and LT90 refers to the time required for the initial luminance decays to 90%.

TABLE 3

| | Host material compound | Luminance (cd/m$^2$) | Voltage (V) | Power efficiency (lm/W) | LT90 (h) |
|---|---|---|---|---|---|
| Ex. 15 | 1-1 | 3300 | 4.6 | 11.3 | 200 |
| Ex. 16 | 1-5 | 3200 | 4.4 | 11.4 | 250 |
| Ex. 17 | 1-6 | 3000 | 4.3 | 11.0 | 250 |
| Ex. 18 | 1-7 | 3100 | 4.4 | 11.1 | 250 |
| Ex. 19 | 1-12 | 3000 | 4.0 | 11.8 | 250 |
| Ex. 20 | 1-16 | 3100 | 4.4 | 11.1 | 250 |
| Ex. 21 | 1-27 | 3100 | 4.3 | 11.3 | 200 |
| Ex. 22 | 1-28 | 3100 | 4.3 | 11.3 | 200 |
| Ex. 23 | 1-137 | 3000 | 4.3 | 11.0 | 250 |
| Ex. 24 | 1-198 | 3100 | 4.4 | 11.1 | 250 |
| Comparative Ex. 3 | H-1 | 3000 | 4.0 | 11.8 | 60 |
| Comparative Ex. 4 | H-2 | 2000 | 4.0 | 7.9 | 80 |
| Comparative Ex. 5 | H-3 | 2000 | 4.6 | 6.8 | 70 |

From Tables 2 and 3, it can be seen that in Examples 5 to 24, good characteristics are exhibited with improved power efficiency and life characteristics.

Example 25

On a glass substrate having an anode made of ITO with a film thickness of 110 nm thereon, each thin film was laminated with a vacuum degree of $4.0\times10^{-5}$ Pa by a vacuum vapor deposition method. First, CuPc was formed to a thickness of 25 nm as a hole injection layer on the ITO, and then NPD was formed to a thickness of 30 nm as a hole transporting layer. Next, HT-1 was formed to a thickness of 10 nm as an electron blocking layer. Next, the compound H-1 as host material and Ir(ppy)$_3$ as light emitting dopant were co-deposited from different vapor deposition sources to form a light emitting layer to a thickness of 40 nm. At this time, the concentration of Ir(ppy)$_3$ was 10 wt %. Furthermore, the compound 1-1 was formed to a thickness of 5 nm as a hole blocking layer. Next, ET-1 was formed to a thickness of 15 nm as an electron transporting layer. Further, LiF was formed to a thickness of 1 nm on the electron transport layer as an electron injecting layer. Finally, Al was formed to a thickness of 70 nm as a cathode on the electron injection layer to make an organic electroluminescence device.

Examples 26 to 34

An organic electroluminescence device was produced in the same manner as in Example 25, except that compound 1-5, 1-6, 1-7, 1-12, 1-16, 1-27, 1-28, 1-137, or 1-198 was used instead of the compound 1-1 as the hole blocking layer in Example 25.

Example 35

An organic EL device was produced in the same manner as in Example 25, except that the host material H-1 of the light emitting layer in Example 25 was replaced with a compound 1-1.

Comparative Examples 6 and 7

An organic electroluminescence device was produced in the same manner as in Example 25, except that H-1, or H-3 was used as the hole blocking layer for the light emitting layer in Example 25.

The evaluation results of the produced organic electroluminescence devices are shown in Table 4.

TABLE 4

| | Hole blocking layer compound | Luminance (cd/m$^2$) | Voltage (V) | Power efficiency (lm/W) | LT70 (h) |
|---|---|---|---|---|---|
| Ex. 25 | 1-1 | 12000 | 4.6 | 40.7 | 440 |
| Ex. 26 | 1-5 | 12000 | 4.6 | 40.7 | 330 |
| Ex. 27 | 1-6 | 12000 | 4.4 | 42.8 | 440 |
| Ex. 28 | 1-7 | 11000 | 4.1 | 42.5 | 440 |
| Ex. 29 | 1-12 | 10000 | 3.9 | 40.8 | 330 |
| Ex. 30 | 1-16 | 11000 | 4.3 | 40.3 | 500 |
| Ex. 31 | 1-27 | 11000 | 3.9 | 44.9 | 330 |
| Ex. 32 | 1-28 | 11000 | 4.0 | 43.6 | 330 |
| Ex. 33 | 1-137 | 11000 | 4.1 | 42.5 | 440 |
| Ex. 34 | 1-198 | 12000 | 4.6 | 40.8 | 440 |
| Ex. 35 | 1-1 | 12000 | 4.5 | 41.9 | 500 |
| Comparative Ex. 6 | H-1 | 12000 | 5.6 | 33.6 | 220 |
| Comparative Ex. 7 | H-3 | 11000 | 5.1 | 33.9 | 200 |

The compounds used in Examples are shown below.

[C25]

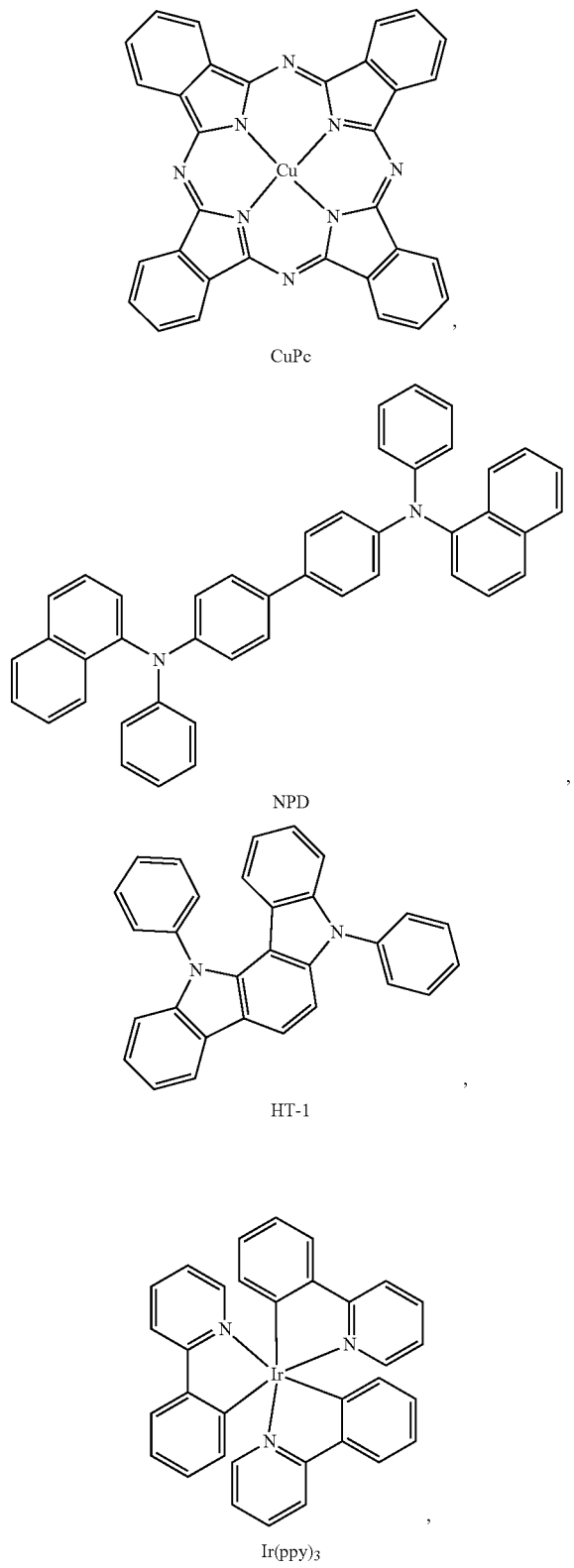

CuPc

NPD

HT-1

Ir(ppy)₃

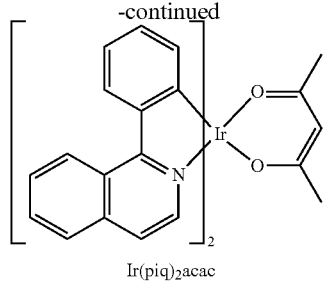

Ir(piq)₂acac

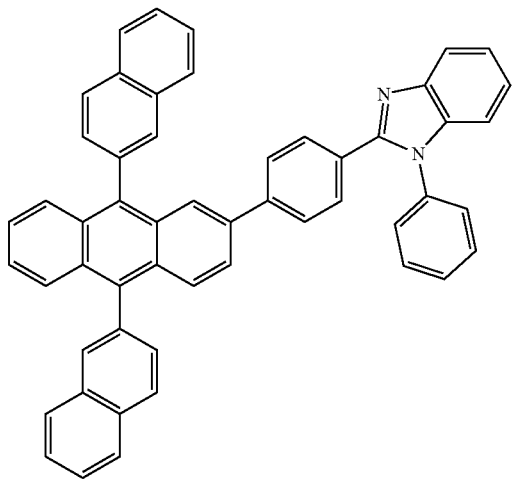

ET-1

The invention claimed is:

1. A material for organic electroluminescent devices comprising a compound represented by the following general formula (1):

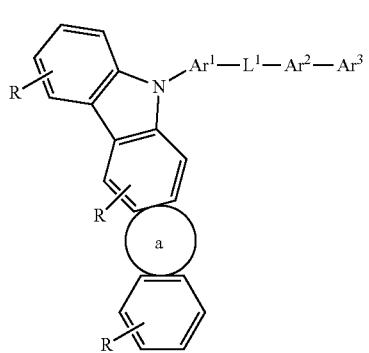

(1)

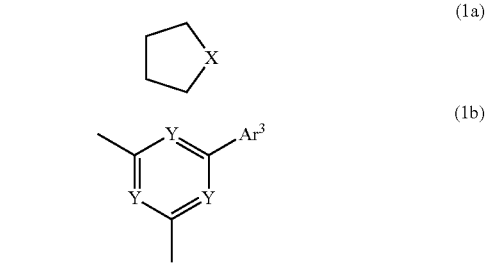

(1a)

(1b)

wherein the ring a represented by a formula (1a) is fused at arbitrary positions of adjacent rings, X is NR¹¹, S, O or CR¹²R¹³, and R¹¹, R¹² and R¹³ each independently represent an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group having 2 to 5 of these aromatic rings that are linked;

R independently represents hydrogen, deuterium, an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms;

$Ar^1$ and $Ar^2$ are each independently an aromatic heterocyclic group represented by a formula (1b), and $Ar^3$ is independently hydrogen, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group having 2 to 5 of these aromatic rings that are linked;

Y independently represents N or $CR^{14}$, and at least one is N;

$R^{14}$ is independently hydrogen, deuterium, an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group having 2 to 5 of these aromatic rings that are linked; and $L^1$ represents a substituted or unsubstituted aromatic hydrocarbon group having 6 to 30 carbon atoms.

2. The material for organic electroluminescent devices according to claim 1, wherein $L^1$ is a phenylene group represented by the following formula (1c) or formula (1d):

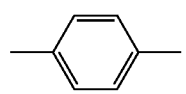

(1c)

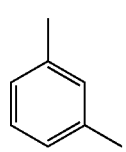

(1d)

3. The material for organic electroluminescent devices according to claim 1, wherein the compound represented by the general formula (1) is a compound represented by a general formula (2):

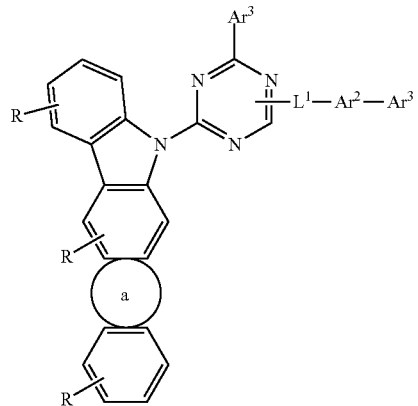

(2)

wherein the ring a, R, $L^1$, $Ar^2$ and $Ar^3$ are the same as in the general formula (1).

4. The material for organic electroluminescent devices according to claim 1, wherein X is $NR^{11}$, and $R^{11}$ is the same as in the general formula (1).

5. The material for organic electroluminescent devices according to claim 1, wherein the compound represented by the general formula (1) is a compound represented by any one of the general formulas (3) to (8):

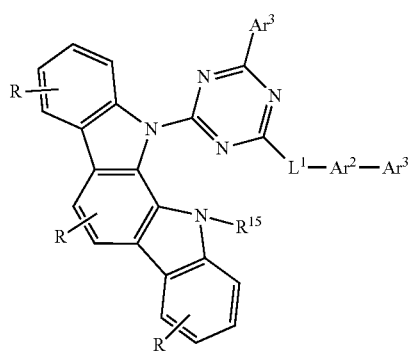

(3)

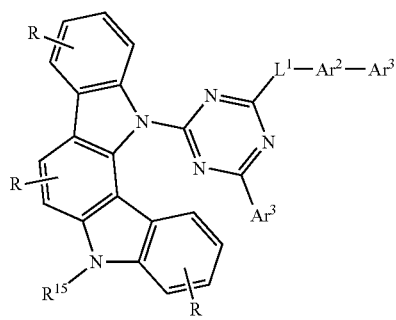

(4)

-continued

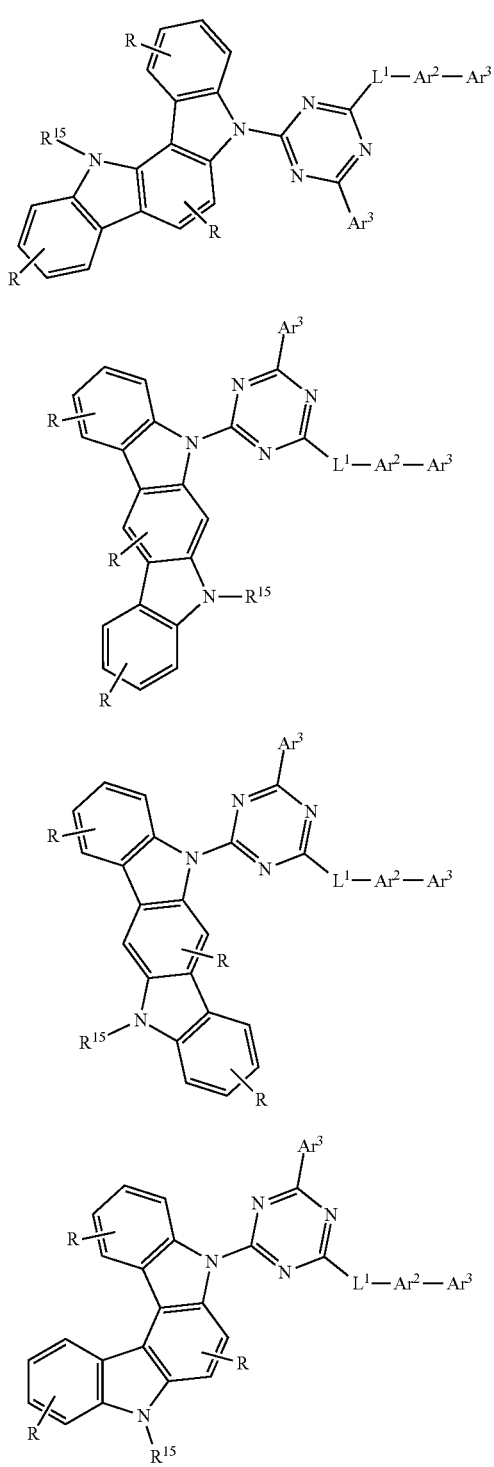

wherein R, $L^1$, $Ar^2$ and $Ar^3$ are the same as in the general formula (1) and $R^{15}$ is the same as $R^{11}$ in the general formula (1).

6. The material for organic electroluminescent devices according to claim 5, wherein the compound represented by the general formula (1) is a compound represented by any one of the general formulas (3) to (5).

7. The material for organic electroluminescent devices according to claim 1, wherein the compound represented by the general formula (1) has an absolute value of electron affinity (EA) of more than 2.6 eV and an absolute value of ionization potential (IP) of less than 6.1 eV.

8. An organic electroluminescent device comprising an anode, organic layers and a cathode laminated on a substrate, wherein at least one layer of the organic layers is an organic layer containing the material for organic electroluminescent devices according to claim 1.

9. The organic electroluminescent device according to claim 8, wherein the organic layer containing the material for organic electroluminescent devices is at least one layer selected from the group consisting of a light emitting layer, an electron transporting layer, and a hole blocking layer.

10. The organic electroluminescent device according to claim 8, wherein the organic layer containing the material for organic electroluminescent devices is a light emitting layer.

11. The organic electroluminescent device according to claim 10, wherein the light-emitting layer contains a host and a light-emitting dopant material, and the light-emitting dopant material is an organic metal complex containing at least one metal selected from the group consisting of ruthenium, rhodium, palladium, silver, rhenium, osmium, iridium, platinum and gold.

12. The organic electroluminescent device according to claim 10, wherein the light-emitting layer contains a host and a light-emitting dopant material, and the light-emitting dopant material is a thermally activated delayed fluorescence emitting dopant material.

13. The organic electroluminescent device according to claim 8, wherein the material for organic electroluminescent devices is contained in a hole blocking layer provided adjacent to the light emitting layer.

14. An organic electroluminescent device comprising an anode, organic layers and a cathode laminated on a substrate, wherein at least one layer of the organic layers is an organic layer containing the material for organic electroluminescent devices according to claim 5.

15. The organic electroluminescent device according to claim 14, wherein the organic layer containing the material for organic electroluminescent devices is a light emitting layer.

* * * * *